(12) United States Patent
Tu et al.

(10) Patent No.: US 12,094,930 B2
(45) Date of Patent: Sep. 17, 2024

(54) INTEGRATED CIRCUIT STRUCTURE AND METHOD FOR FORMING THE SAME

(71) Applicant: TAIWAN SEMICONDUCTOR MANUFACTURING COMPANY, LTD., Hsinchu (TW)

(72) Inventors: Guan-Yao Tu, Hsinchu (TW); Su-Jen Sung, Hsinchu County (TW); Tze-Liang Lee, Hsinchu (TW); Hong-Wei Chan, Hsinchu (TW)

(73) Assignee: TAIWAN SEMICONDUCTOR MANUFACTURING COMPANY, LTD., Hsinchu (TW)

(*) Notice: Subject to any disclaimer, the term of this patent is extended or adjusted under 35 U.S.C. 154(b) by 298 days.

(21) Appl. No.: 17/479,454

(22) Filed: Sep. 20, 2021

(65) Prior Publication Data
US 2022/0336583 A1 Oct. 20, 2022

Related U.S. Application Data

(60) Provisional application No. 63/175,214, filed on Apr. 15, 2021.

(51) Int. Cl.
| | |
|---|---|
| *H01L 21/00* | (2006.01) |
| *H01L 21/477* | (2006.01) |
| *H01L 23/528* | (2006.01) |
| *H01L 29/06* | (2006.01) |
| *H01L 29/423* | (2006.01) |
| *H01L 29/66* | (2006.01) |
| *H01L 29/786* | (2006.01) |

(52) U.S. Cl.
CPC ........ *H01L 29/0665* (2013.01); *H01L 21/477* (2013.01); *H01L 23/5283* (2013.01); *H01L 29/42392* (2013.01); *H01L 29/66742* (2013.01); *H01L 29/78618* (2013.01)

(58) Field of Classification Search
CPC ........ H01L 21/823475; H01L 21/7806; H01L 29/0665; H01L 29/0669; H01L 29/0673; H01L 29/42392; H01L 29/66742; H01L 29/78696
See application file for complete search history.

(56) References Cited

U.S. PATENT DOCUMENTS

| | | | |
|---|---|---|---|
| 2008/0194078 A1* | 8/2008 | Akiyama | H01L 21/76254 257/E21.103 |
| 2016/0141198 A1* | 5/2016 | Broekaart | H01L 21/185 438/458 |
| 2016/0204088 A1* | 7/2016 | Fong | H01L 21/76254 438/107 |
| 2018/0277530 A1* | 9/2018 | Or-Bach | H01L 21/304 |

* cited by examiner

*Primary Examiner* — Reema Patel
(74) *Attorney, Agent, or Firm* — Birch, Stewart, Kolasch & Birch, LLP

(57) ABSTRACT

A method includes forming a transistor over a front side of a substrate; forming a front-side interconnect structure over the transistor, the front-side interconnect structure comprising layers of conductive lines, and conductive vias interconnecting the layers of conductive lines; forming a first bonding layer over the front-side interconnect structure; forming a second bonding layer over a carrier substrate; bonding the front-side interconnect structure to the carrier substrate by pressing the first bonding layer against the second bonding layer; and forming a backside interconnect structure over a backside of the substrate after bonding the front-side interconnect structure to the carrier substrate.

20 Claims, 88 Drawing Sheets

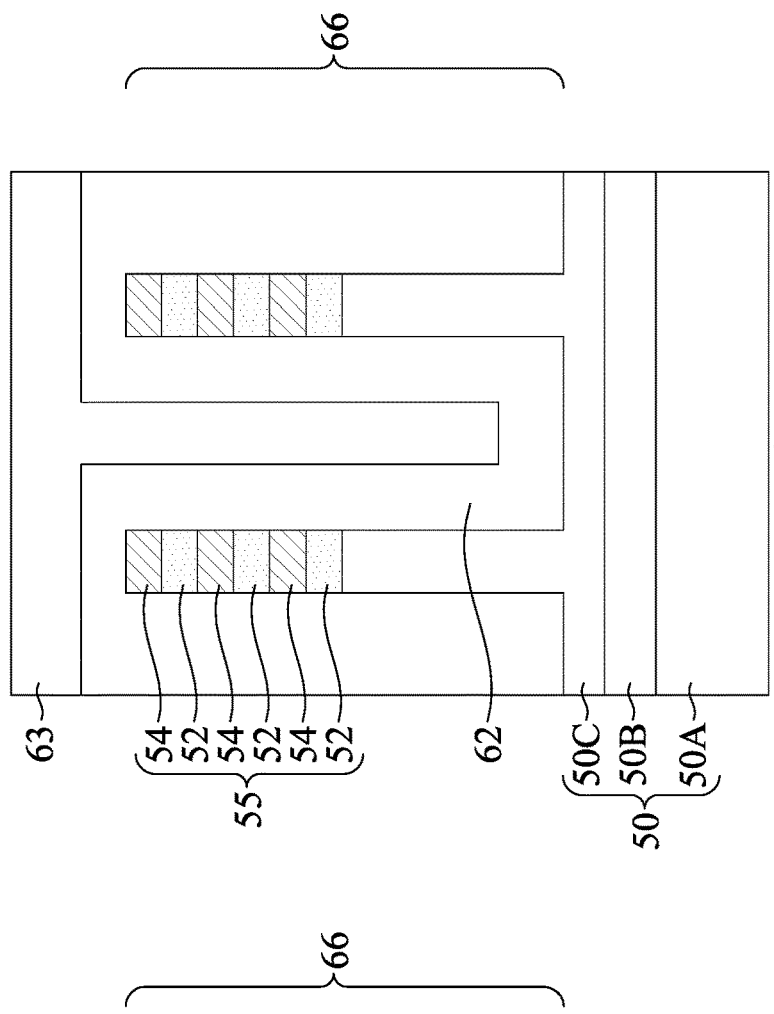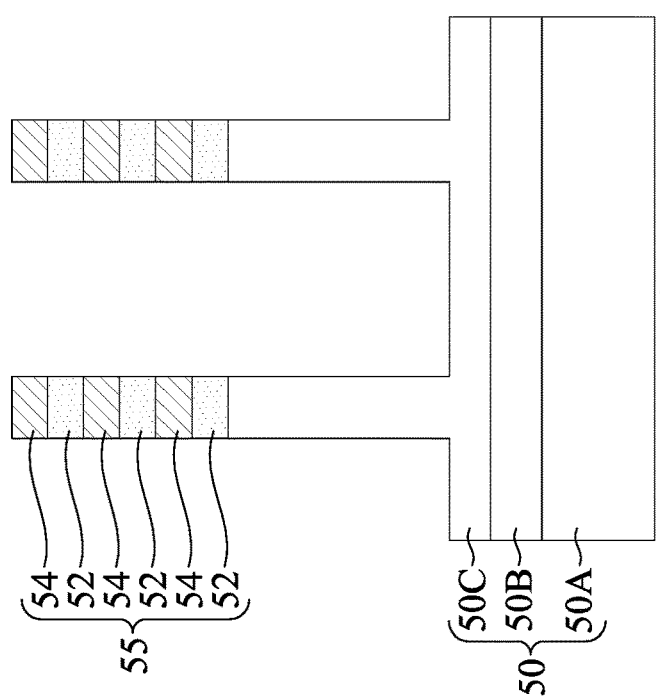

US 12,094,930 B2

INTEGRATED CIRCUIT STRUCTURE AND METHOD FOR FORMING THE SAME

PRIORITY CLAIM AND CROSS-REFERENCE

This application claims priority to U.S. Provisional Application Ser. No. 63/175,214, filed Apr. 15, 2021, which is herein incorporated by reference.

BACKGROUND

Semiconductor devices are used in a variety of electronic applications, such as, for example, personal computers, cell phones, digital cameras, and other electronic equipment. Semiconductor devices are typically fabricated by sequentially depositing insulating or dielectric layers, conductive layers, and semiconductor layers of material over a semiconductor substrate, and patterning the various material layers using lithography to form circuit components and elements thereon.

The semiconductor industry continues to improve the integration density of various electronic components (e.g., transistors, diodes, resistors, capacitors, etc.) by continual reductions in minimum feature size, which allow more components to be integrated into a given area. However, as the minimum features sizes are reduced, additional problems arise that should be addressed.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 2 to 31C are cross-sectional views of intermediate stages in the manufacturing of an integrated circuit structure, in accordance with some embodiments.

DETAILED DESCRIPTION

Figure 1:
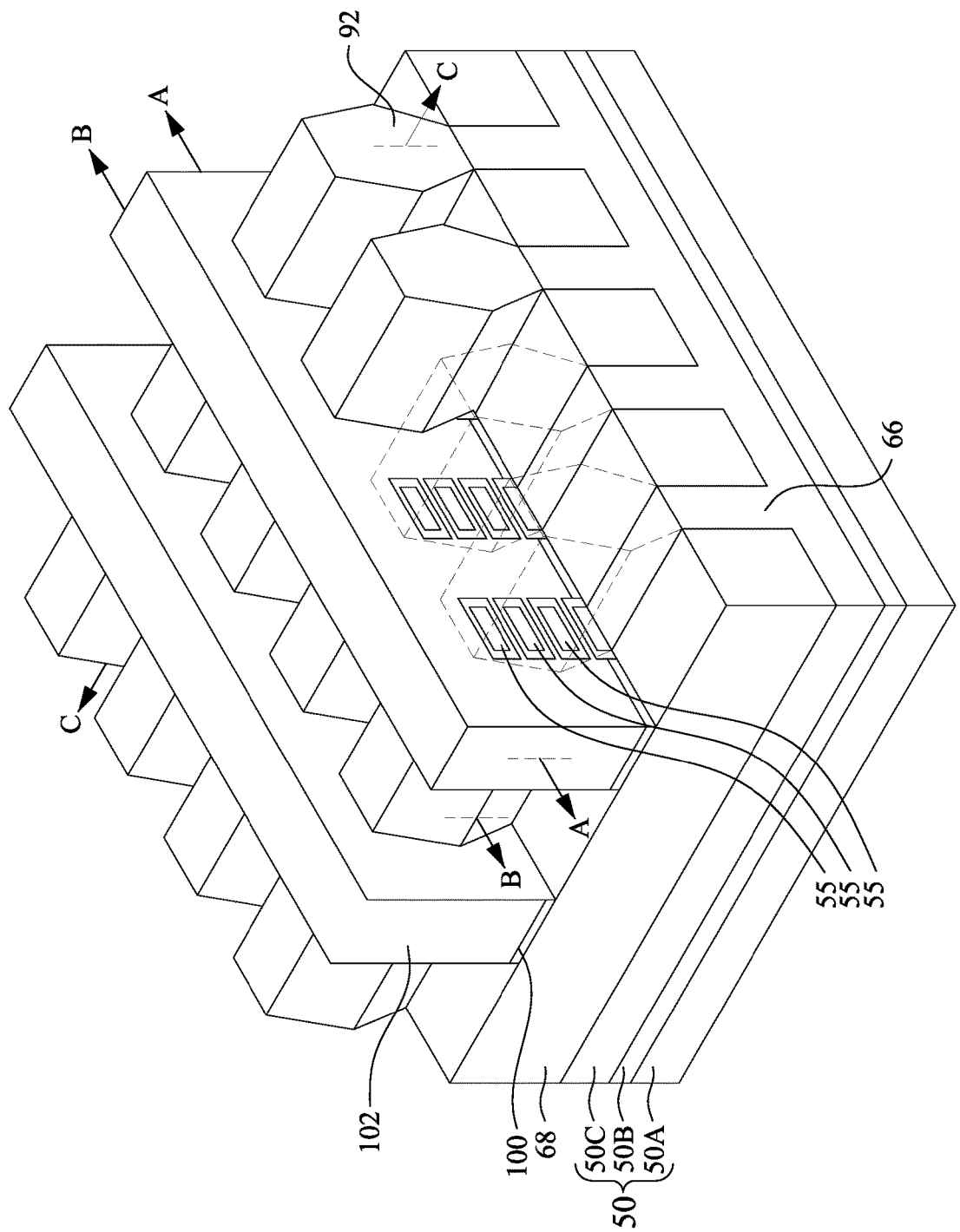
FIG. 1 illustrates an example of a nanostructure field-effect transistor (nano-FET) in a three-dimensional view, in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

As technology nodes shrink in advanced nodes of semiconductor devices, a temperature of the devices during operation may also increase due to reduced chip area for thermal dissipation and increased transistor density. Various embodiments provide thermal conductive paths from a device that generates heat (e.g., a transistor, resistor, or the like) to an exterior of the chip, thereby allowing for improved heat dissipation and compensating for operating temperature increases. In some embodiments, the thermal conductive paths include dummy features formed in an interconnect structure on a backside and/or front-side of a semiconductor chip.

Embodiments are described below in a particular context, a die comprising nano-FETs. Various embodiments may be applied, however, to dies comprising other types of transistors (e.g., fin field effect transistors (FinFETs), planar transistors, thin film transistors (TFTs), or the like) in lieu of or in combination with the nano-FETs.

FIG. 1 illustrates an example of nano-FETs (e.g., nanowire FETs, nanosheet FETs, or the like) in a three-dimensional view, in accordance with some embodiments. The nano-FETs include nanostructures 55 (e.g., nanosheets, nanowire, or the like) over fins 66 on a substrate 50 (e.g., a semiconductor substrate), wherein the nanostructures 55 act as channel regions for the nano-FETs. The nanostructure 55 may include p-type nanostructures, n-type nanostructures, or a combination thereof. Isolation regions 68 are disposed between adjacent fins 66, which may protrude above and from between neighboring isolation regions 68. Although the isolation regions 68 are described/illustrated as being separate from the substrate 50, as used herein, the term "substrate" may refer to the semiconductor substrate alone or a combination of the semiconductor substrate and the isolation regions. Additionally, although a bottom portion of the fins 66 are illustrated as being single, continuous materials with the substrate 50, the bottom portion of the fins 66 and/or the substrate 50 may include a single material or a plurality of materials. In this context, the fins 66 refer to the portion extending between the neighboring isolation regions 68.

Gate dielectric layers 100 are over top surfaces of the fins 66 and along top surfaces, sidewalls, and bottom surfaces of the nanostructures 55. Gate electrodes 102 are over the gate dielectric layers 100. Epitaxial source/drain structures 92 are disposed on the fins 66 on opposing sides of the gate dielectric layers 100 and the gate electrodes 102. The gate dielectric layers 100 and the gate electrodes 102 contribute a gate region of the transistor, the epitaxial source/drain structures 92 contribute source/drain regions of the transistor, and the nanostructures 55 contribute a channel region of the transistor.

FIG. 1 further illustrates reference cross-sections that are used in later figures. Cross-section A-A is along a longitudinal axis of a gate electrode 102 and in a direction, for example, perpendicular to the direction of current flow between the epitaxial source/drain structures 92 of a nano- FET. Cross-section B-B is parallel to cross-section A-A and extends through epitaxial source/drain regions of the nano-FETs. Cross-section C-C is perpendicular to cross-section A-A and is parallel to a longitudinal axis of a fin 66 of the nano-FET and in a direction of, for example, a current flow between the epitaxial source/drain structures 92 of the nano-FET. Subsequent figures refer to these reference cross-sections for clarity.

Some embodiments discussed herein are discussed in the context of nano-FETs formed using a gate-last process. In other embodiments, a gate-first process may be used. Also, some embodiments contemplate aspects used in planar devices, such as planar FETs or in fin field-effect transistors (FinFETs).

FIGS. 2 through 31C are cross-sectional views of intermediate stages in the manufacturing of an integrated circuit structure, in accordance with some embodiments. FIGS. 2-6 and 7A-31A illustrate reference cross-section A-A illustrated in FIG. 1. FIGS. 7B-31B illustrate reference cross-section B-B illustrated in FIG. 1. FIGS. 7C-31C illustrate reference cross-section C-C illustrated in FIG. 1.

Figure 2:
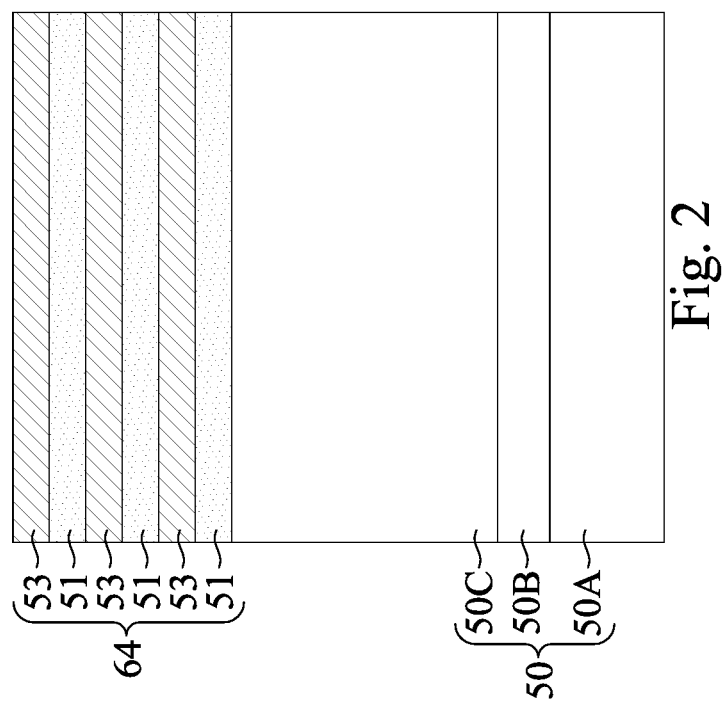

Reference is made to FIG. 2, a substrate 50 is shown. In some embodiments, the substrate 50 may be a semiconductor-on-insulator (SOI) substrate. The SOI substrate may include a buried oxide (BOX) layer formed by a process such as separation by implanted oxygen (SIMOX), and/or other suitable processes. In the example of FIG. 2, the substrate 50 is an SOI substrate including a bulk silicon layer 50A, an oxide layer 50B over the bulk silicon layer 50A, and a semiconductor layer 50C over the oxide layer 50B. The oxide layer 50B may be a buried oxide (BOX) layer. In some embodiments, the BOX layer is silicon dioxide ($SiO_2$). The semiconductor layer 50C may include silicon. The semiconductor layer 50C may be suitably doped with n-type and/or p-type dopants. In some embodiments, the thickness of the oxide layer 50B is in a range from about 180 Å to about 220 Å, such as 200 Å for example. In some embodiments, the thickness of the semiconductor layer 50C is in a range from about 360 Å to about 440 Å, such as 400 Å for example. In some embodiments, the semiconductor layer 50C may be thicker than the oxide layer 50B.

Further in FIG. 2, a multi-layer stack 64 is formed over the substrate 50. The multi-layer stack 64 includes alternating layers of first semiconductor layers 51 and second semiconductor layers 53. For purposes of illustration and as discussed in greater detail below, the first semiconductor layers 5I will be removed and the second semiconductor layers 53 will be patterned to form channel regions of nano-FETs.

The multi-layer stack 64 is illustrated as including three layers of each of the first semiconductor layers 51 and the second semiconductor layers 53 for illustrative purposes. In some embodiments, the multi-layer stack 64 may include suitable number of the first semiconductor layers 51 and the second semiconductor layers 53.

The first semiconductor layers 51 and the second semiconductor layers 53 may include different materials and/or components, such that the first semiconductor layers 51 and the second semiconductor layers 53 have different etching rates. In some embodiments, the first semiconductor layers 51 are made from SiGe. The germanium percentage (atomic percentage concentration) of the first semiconductor layers 51 is in the range between about 10 percent and about 20 percent, while higher or lower germanium percentages may be used. It is appreciated, however, that the values recited throughout the description are examples, and may be changed to different values. For example, the first semiconductor layers 51 may be $Si_{0.8}Ge_{0.2}$ or $Si_{0.9}Ge_{0.1}$, in which the proportion between Si and Ge may vary from embodiments, and the disclosure is not limited thereto. The second semiconductor layers 53 may be pure silicon layers that are free of germanium. The second semiconductor layers 53 may also be substantially pure silicon layers, for example, with a germanium percentage lower than about 1 percent. In some embodiments, the first semiconductor layers 51 have a higher germanium atomic percentage concentration than the second semiconductor layers 53. The first semiconductor layers 51 and the second semiconductor layers 53 may be formed by chemical vapor deposition (CVD), molecular beam epitaxy (MBE), or other suitable process(es). In some embodiments, the first semiconductor layers 51 and the second semiconductor layers 53 are formed by an epitaxy growth process, and thus the first semiconductor layers 51 and the second semiconductor layers 53 can also be referred to as epitaxial layers in this content.

Referring now to FIG. 3, fins 66 are formed in the semiconductor layer 50C of the substrate 50 and nanostructures 55 are formed from the multi-layer stack 64 (see FIG. 2), in accordance with some embodiments. In some embodiments, the nanostructures 55 and the fins 66 may be formed by etching trenches in the multi-layer stack 64 and the semiconductor layer 50C of the substrate 50. The etching may be any acceptable etch process, such as a reactive ion etch (RIE), neutral beam etch (NBE), the like, or a combination thereof. The etching may be anisotropic. Forming the nanostructures 55 by etching the multi-layer stack 64 may further define first nanostructures 52 from the first semiconductor layers 51 and define second nanostructures 54 from the second semiconductor layers 53. The first nanostructures 52 and the second nanostructures 54 may be collectively referred to as nanostructures 55.

The fins 66 and the nanostructures 55 may be patterned by any suitable method. For example, the fins 66 and the nanostructures 55 may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers may then be used to pattern the fins 66.

While each of the fins 66 and the nanostructures 55 are illustrated as having a consistent width throughout, in other embodiments, the fins 66 and/or the nanostructures 55 may have tapered sidewalls such that a width of each of the fins 66 and/or the nanostructures 55 continuously increases in a direction towards the substrate 50. In such embodiments, each of the nanostructures 55 may have a different width and be trapezoidal in shape.

Reference is made to FIG. 4. A dielectric layer 62 and dielectric layer 63 are formed over the fins 66. In some embodiments, the dielectric layer 62 is deposited conformal to the profile of the fins 66. Afterward, the dielectric layer 63 may be deposited over the dielectric layer 62 and filling the spaces in the dielectric layer 62. In some embodiments, the dielectric layer 62 and the dielectric layer 63 may be formed by high-density plasma CVD (HDP-CVD), flowable CVD (FCVD), the like, or a combination thereof. Other insulation materials formed by any acceptable process may be used. In some embodiments, the dielectric layer 62 may include oxide, such as silicon oxide. In some embodiments, the dielectric layer 63 may include nitride, such as silicon nitride. In some embodiments, the dielectric layer 62 and dielectric layer 63 are made of different materials.

Figure 5:
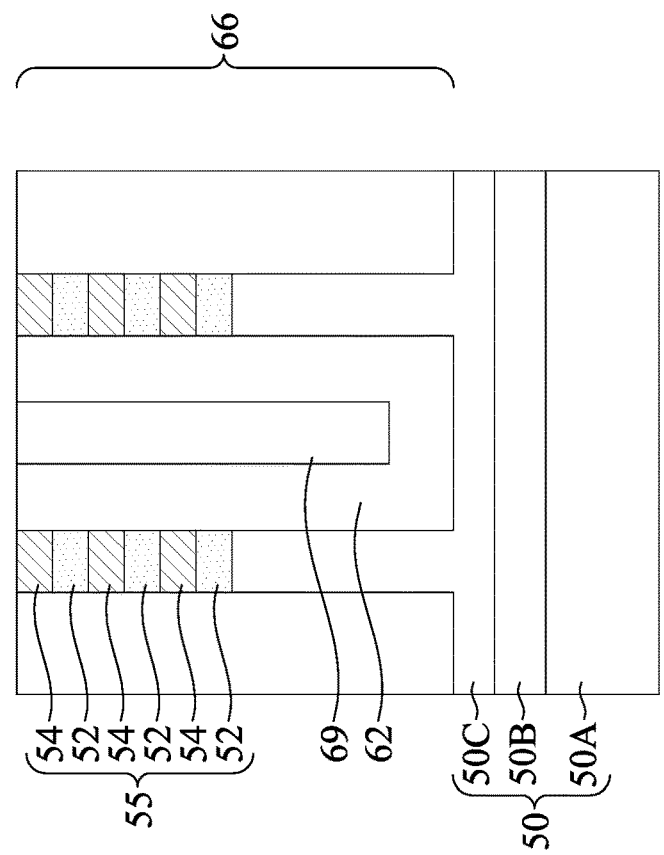

Reference is made to FIG. 5. The dielectric layer 62 and dielectric layer 63 are planarized, so as to level top surfaces of the dielectric layer 62 and dielectric layer 63. In some embodiments, the dielectric layer 62 and dielectric layer 63 may be planarized using a CMP process. The remaining portion of the dielectric layer 63 is referred to as dielectric fin 69. In some embodiments, the dielectric fin 69 may also be referred to as dummy fin.

Figure 6:
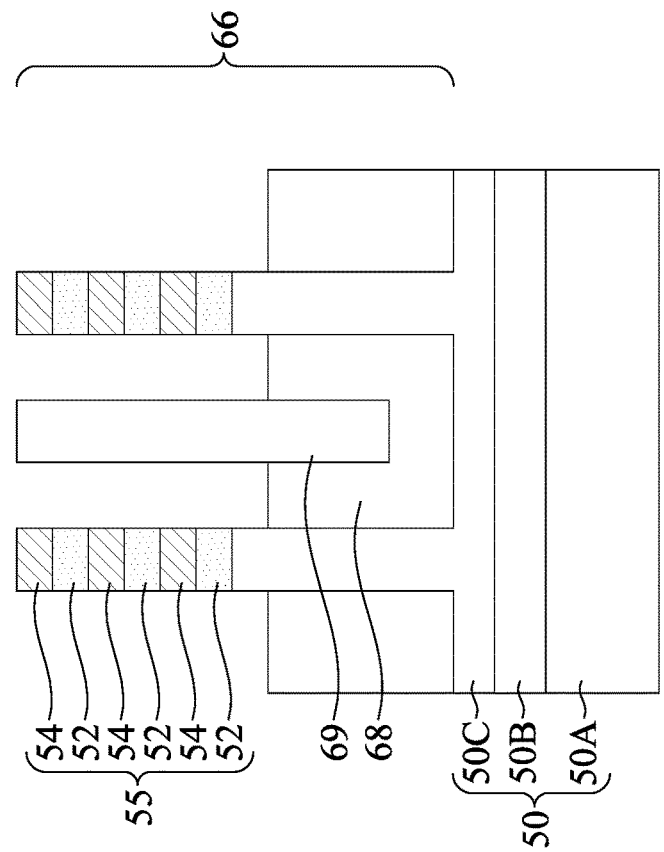

Reference is made to FIG. 6. The dielectric layer 62 is etched back to form shallow trench isolation (STI) regions 68 adjacent the fins 66. In some embodiments, the etch back process is chosen to selectively etch the dielectric layer 62 without substantially etching the dielectric fin 69, which allows for the dielectric fin 69 protruding from the STI regions 68 after the etch back process is completed. Thus, the STI region 68 may wrap around a lower portion of the dielectric fin 69, while leaving an upper portion of the dielectric fin 69 exposed. Further, the top surfaces of the STI regions 68 may have a flat surface as illustrated, a convex surface, a concave surface (such as dishing), or a combination thereof. The top surfaces of the STI regions 68 may be formed flat, convex, and/or concave by an appropriate etch. The STI regions 68 may be recessed using an acceptable etching process, such as one that is selective to the material of the STI regions 68 (e.g., etches the material of the STI regions 68 at a faster rate than the material of the fins 66, the nanostructures 55, and the dielectric fin 69). For example, an oxide removal using, for example, dilute hydrofluoric (dHF) acid may be used.

Figure 7A:
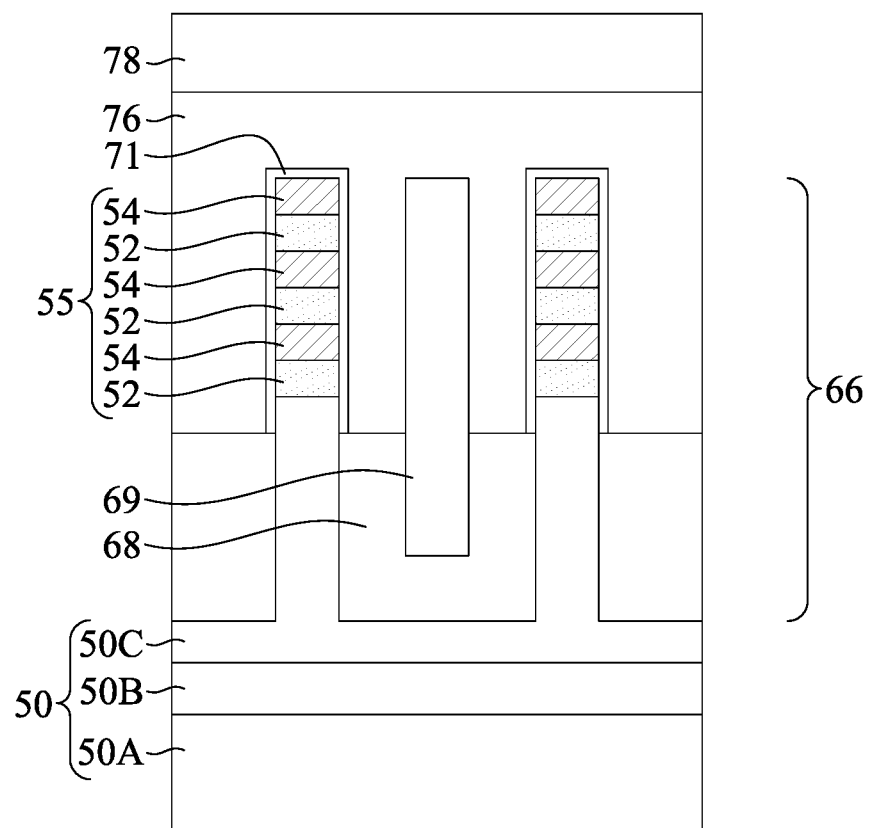
Figure 7B:
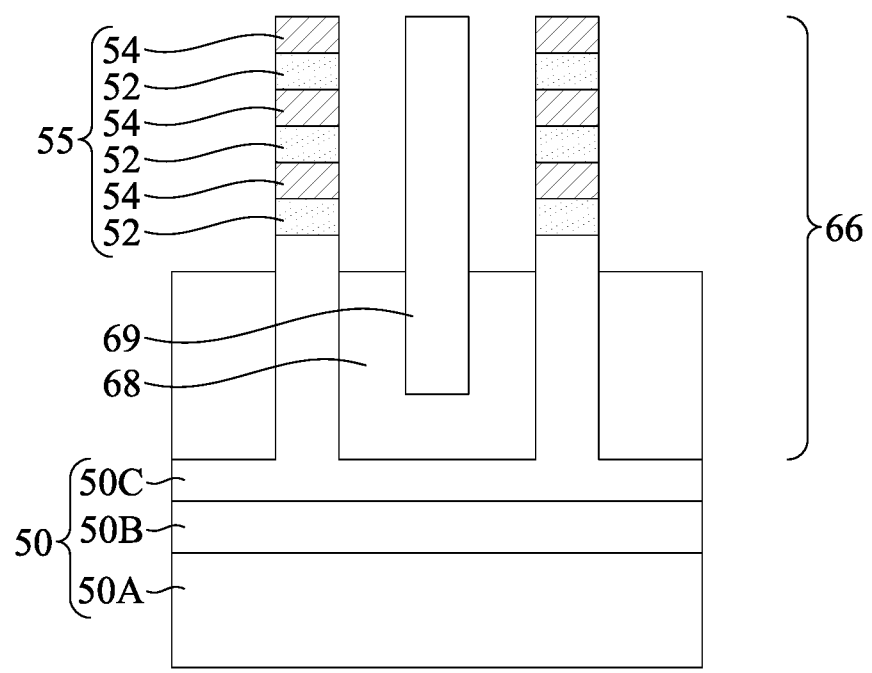
Figure 7C:
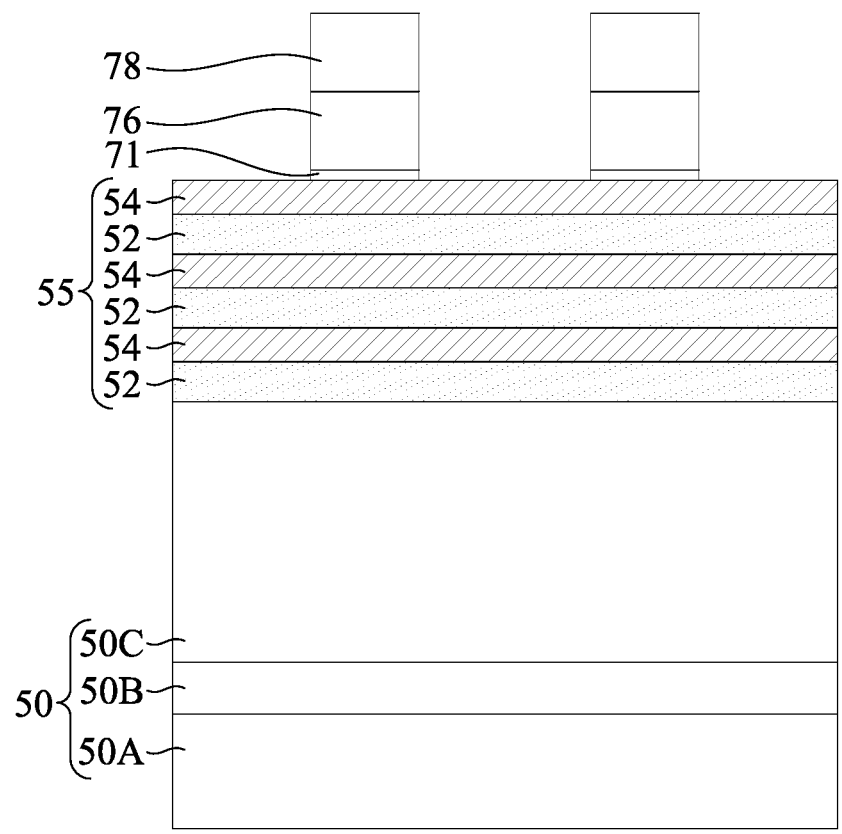

Reference is made to FIGS. 7A to 7C. Dummy gates 76 and dummy gate dielectrics 71 are formed over the substrate 50 and crossing the fins 66 and the dielectric fin 69. In some embodiments, patterned masks 78 may be formed over the dummy gates 76. The dummy gate dielectrics 71 may be, for example, silicon oxide, silicon nitride, a combination thereof, or the like, and may be deposited or thermally grown according to acceptable techniques. The dummy gates 76 may be a conductive or non-conductive material and may be selected from a group including amorphous silicon, polycrystalline-silicon (polysilicon), poly-crystalline silicon-germanium (poly-SiGe), metallic nitrides, metallic silicides, metallic oxides, and metals. The dummy gates 76 and the dummy gate dielectrics 71 may be formed by, for example, depositing a dummy dielectric layer and a dummy gate layer over the substrate, forming the patterned masks 78 over the dummy gate layer, and then performing a patterning process to the dummy dielectric layer and the dummy gate layer by using the patterned masks 78 as an etching mask. In some embodiments, the dummy gates 76 may be deposited by physical vapor deposition (PVD), CVD, sputter deposition, or other techniques for depositing the selected material. In some embodiments, the dummy gate dielectrics 71 may be formed by thermal oxidation, such that the dummy gate dielectrics 71 may be formed only on the exposed surfaces of the nanostructure 55. That is, the surfaces of the STI region 68 and the dielectric fin 69 are free from coverage of the dummy gate dielectrics 71. The patterned masks 78 may include, for example, silicon nitride, silicon oxynitride, or the like.

Figure 8A:
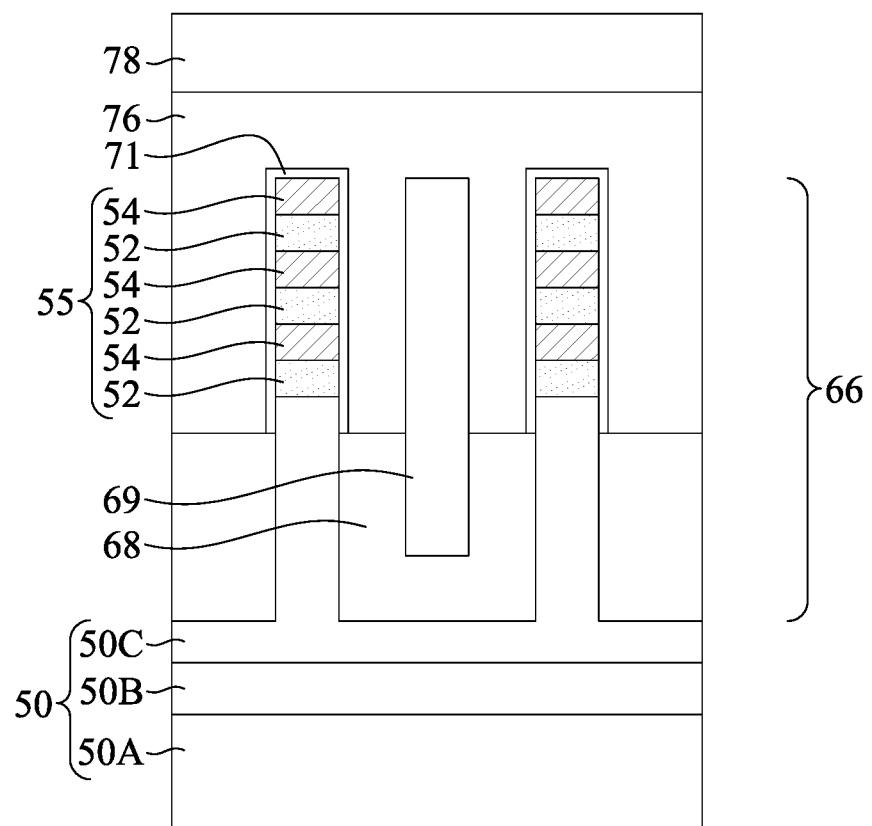
Figure 8B:
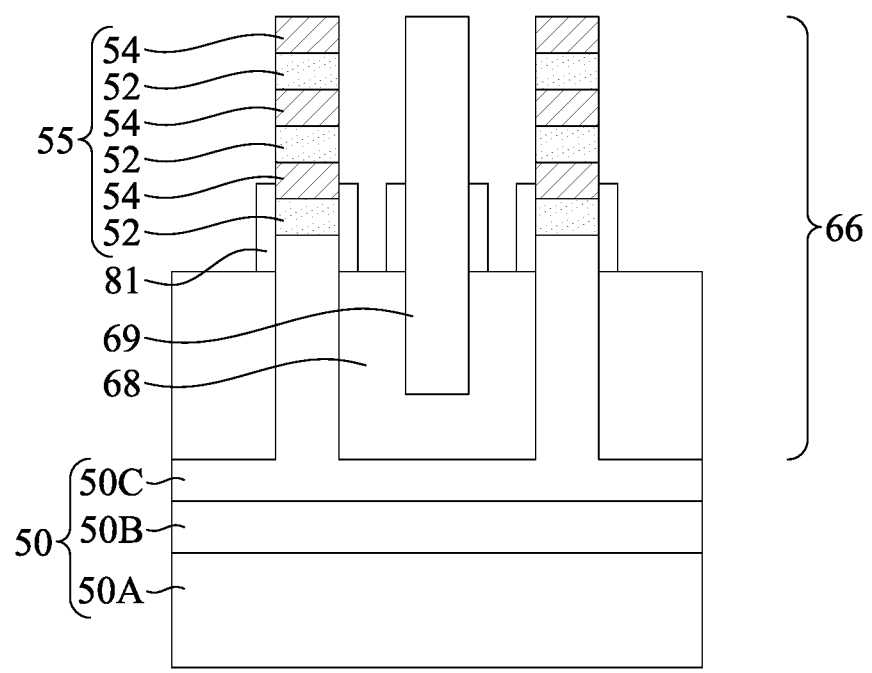
Figure 8C:
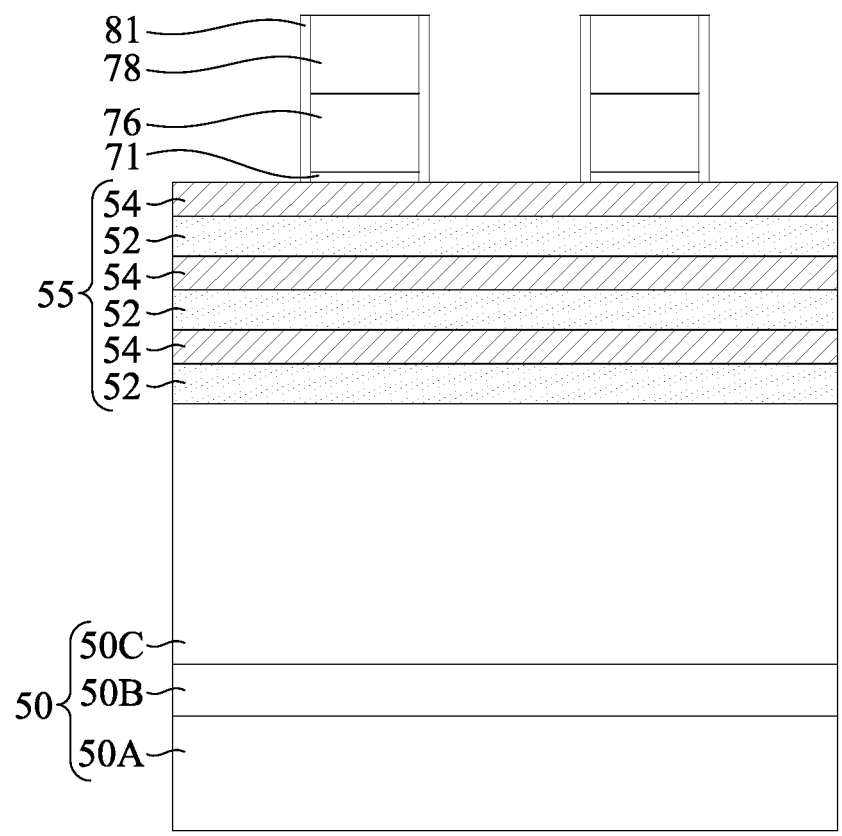

Reference is made to FIGS. 8A to 8C. Spacers 81 are formed on opposite sidewalls of the dummy gates 76, opposite sidewalls of the fins 66, and opposite sidewalls of the dielectric fin 69. In some embodiments, the spacers 81 may be formed by, for example, depositing a spacer layer blanket over the substrate, and subsequently performing an anisotropic etching process to remove horizontal portions of the spacer layer, such that vertical portions of the spacer layer remain on sidewalls of the dummy gates 76, the fins 66, and the dielectric fin 69. The spacers 81 may be formed of silicon oxide, silicon nitride, silicon oxynitride, combinations thereof, using techniques such as thermal oxidation or deposited by CVD, ALD, or the like. In FIG. 8B, the spacers 81 may include portions on opposite sidewalls of the fins 66. In some embodiments, top surfaces of the portions of the spacers 81 may be lower than top surfaces of the fins 66. That is, the top surfaces of the portions of the spacers 81 are not aligned with the top surfaces of the fins 66.

Figure 9A:
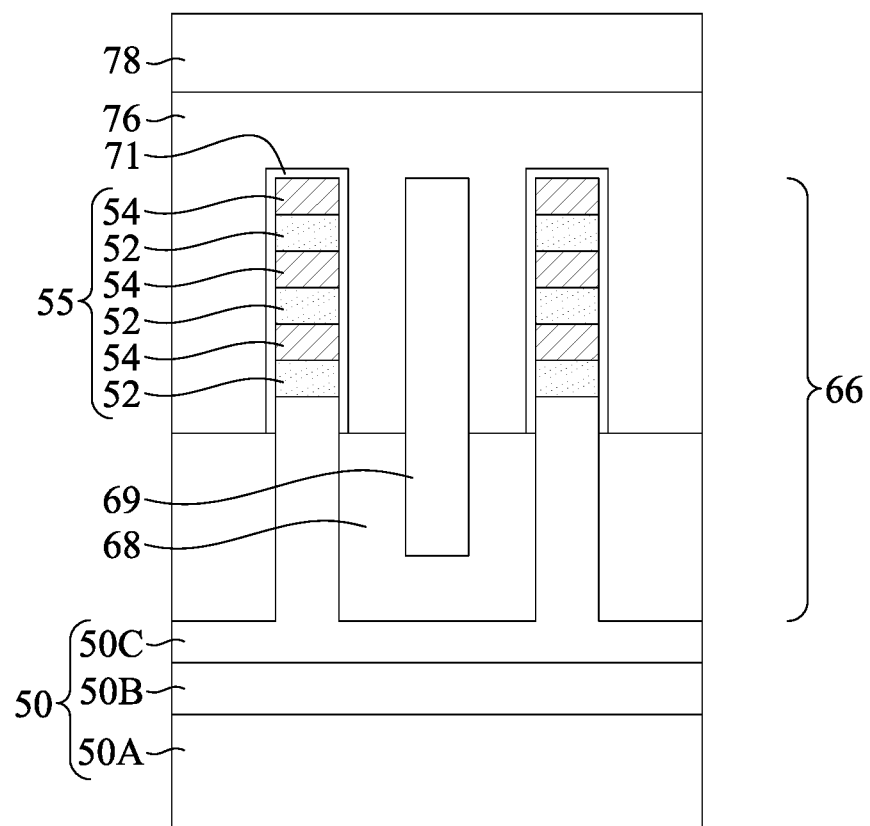
Figure 9B:
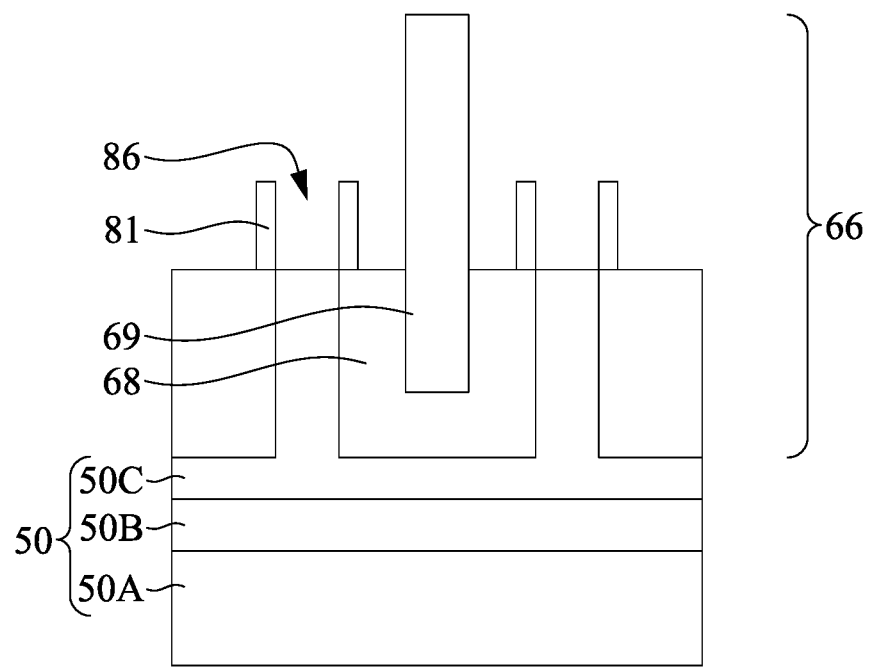
Figure 9C:
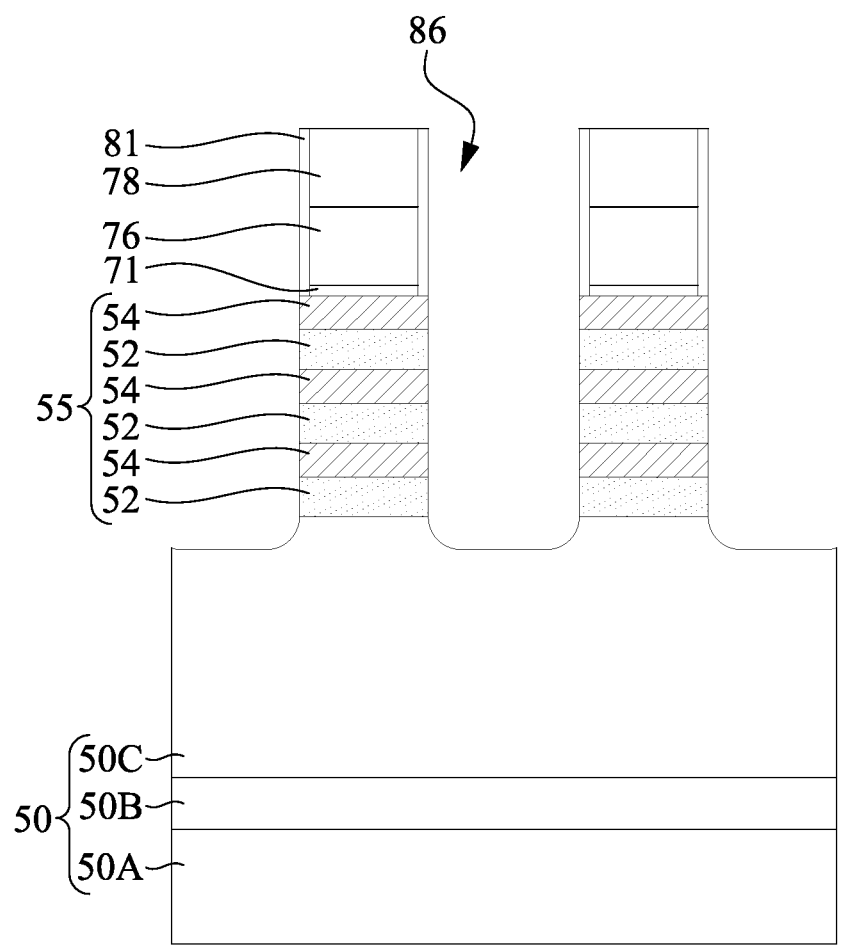

Reference is made to FIGS. 9A to 9C. First recesses 86 are formed in the fins 66, the nanostructures 55, and the semiconductor layer 50C of the substrate 50, in accordance with some embodiments. The first recesses 86 may extend through the first nanostructures 52 and the second nanostructures 54, and into the semiconductor layer 50C of the substrate 50. As illustrated in FIG. 9B, top surfaces of the STI regions 68 may be level with bottom surfaces of the first recesses 86. In various embodiments, the fins 66 may be etched such that bottom surfaces of the first recesses 86 are below the top surfaces of the STI regions 68. The first recesses 86 may be formed by etching the fins 66, the nanostructures 55, and the semiconductor layer 50C of the substrate 50 using anisotropic etching processes, such as RIE, NBE, or the like. The spacers 81 and the patterned masks 78 mask portions of the fins 66, the nanostructures 55, and the substrate 50 during the etching processes used to form the first recesses 86. A single etch process or multiple etch processes may be used to etch each layer of the nanostructures 55 and/or the fins 66. Timed etch processes may be used to stop the etching of the first recesses 86 after the first recesses 86 reach a desired depth.

Figure 10A:
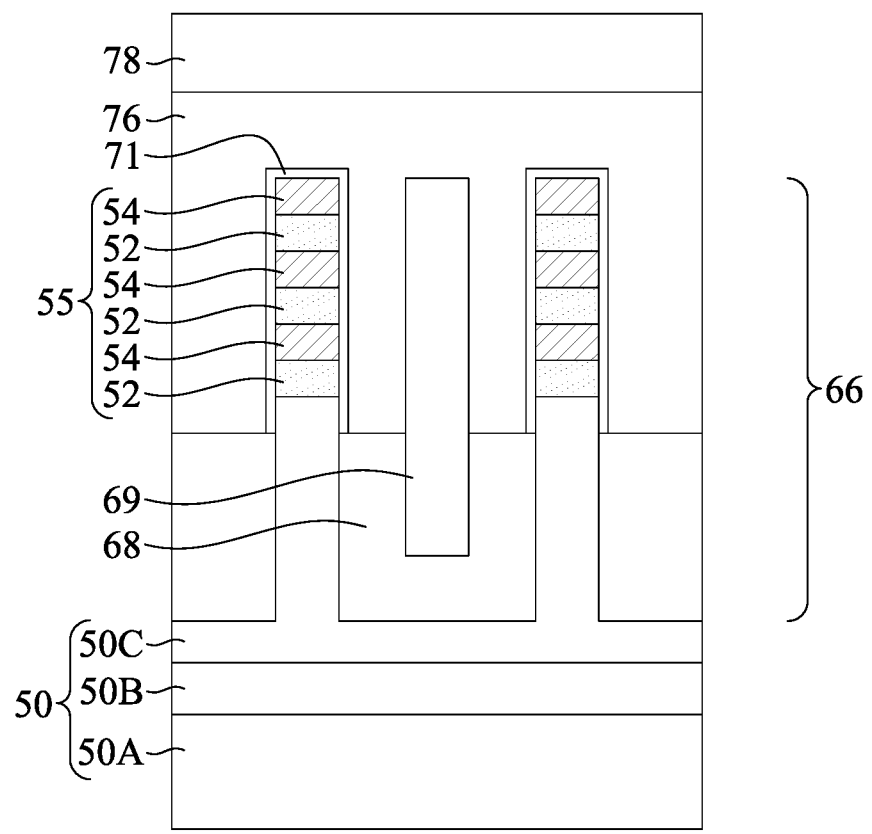
Figure 10B:
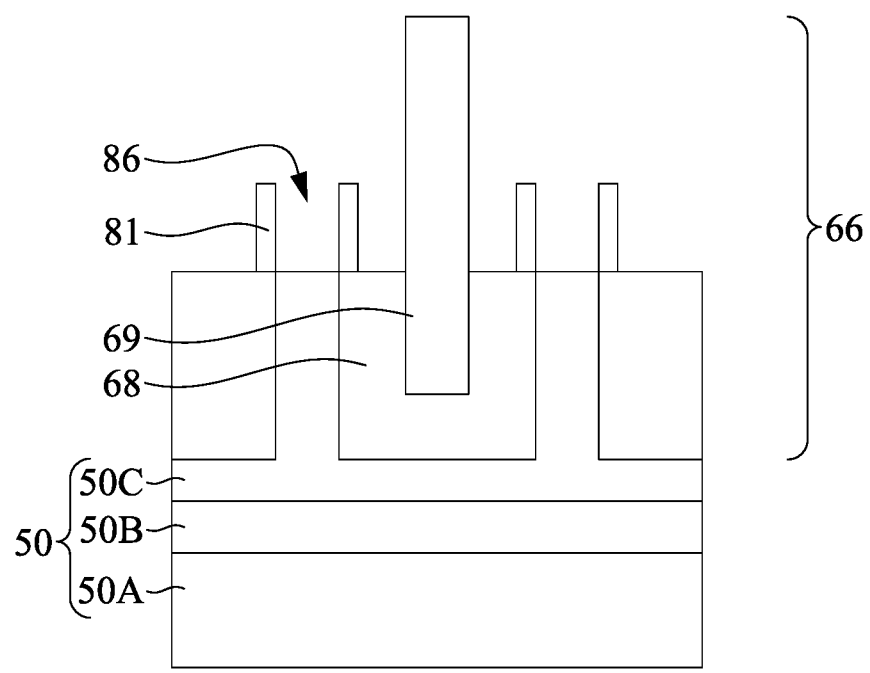
Figure 10C:
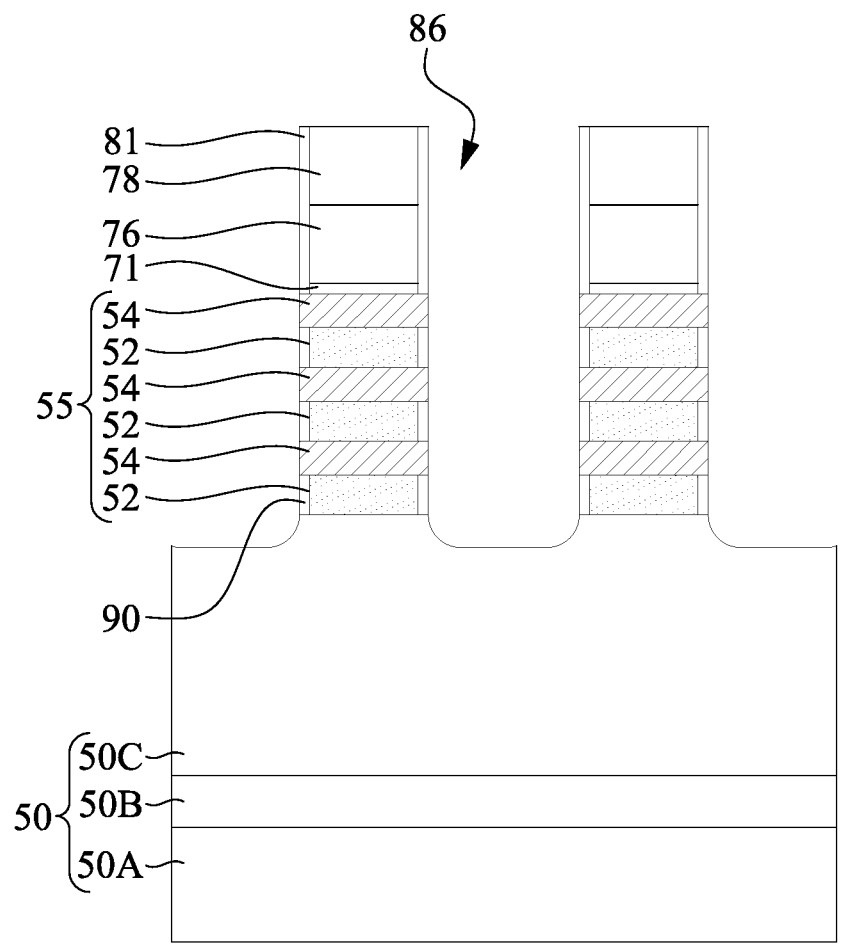

Reference is made to FIGS. 10A to 10C. Portions of the first nanostructures 52 exposed by the first recesses 86 are etched to form sidewall recesses, and then inner spacers 90 are formed in the sidewall recesses. In some embodiments, the sidewalls of the first nanostructures 52 may be etched using isotropic etching processes, such as wet etching or the like. In some embodiments in which the first nanostructures 52 include, e.g., SiGe, and the second nanostructures 54 include, e.g., Si or SiC, a dry etch process with tetramethylammonium hydroxide (TMAH), ammonium hydroxide (NH$_4$OH), or the like may be used to etch sidewalls of the first nanostructures 52.

The inner spacers 90 may be deposited by a conformal deposition process, such as CVD, ALD, or the like. The inner spacer layer may include a material such as silicon nitride or silicon oxynitride, although any suitable material, such as low-dielectric constant (low-k) materials having a k-value less than about 3.5, may be utilized. The inner spacers 90 may be formed by, for example, depositing an inner spacer layer blanket over the substrate 50 and filling the sidewall recesses of the first nanostructures 52, and then performing an anisotropic etching to remove unwanted portions of the inner spacer layer. Although outer sidewalls of the inner spacers 90 are illustrated as being flush with sidewalls of the second nanostructures 54, the outer sidewalls of the inner spacers 90 may extend beyond or be recessed from sidewalls of the second nanostructures 54.

Figure 11A:
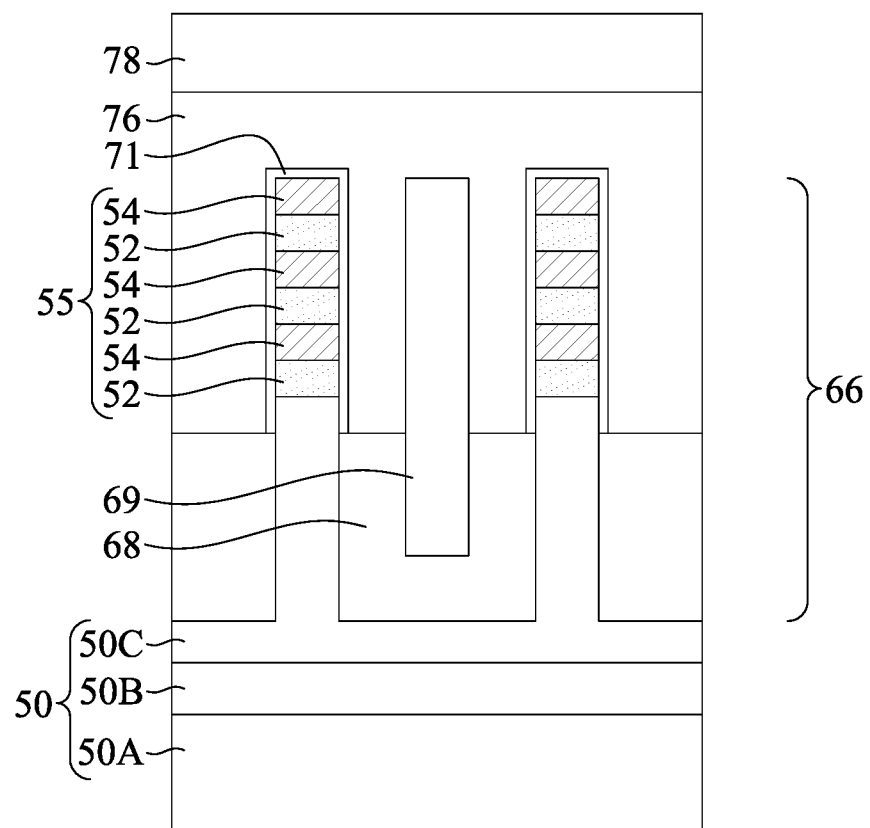
Figure 11B:
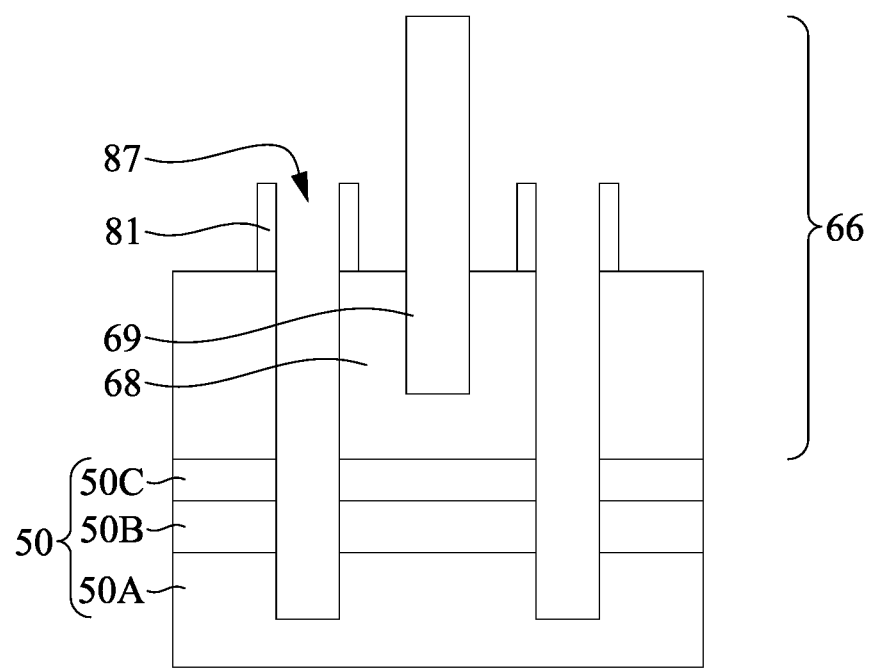
Figure 11C:
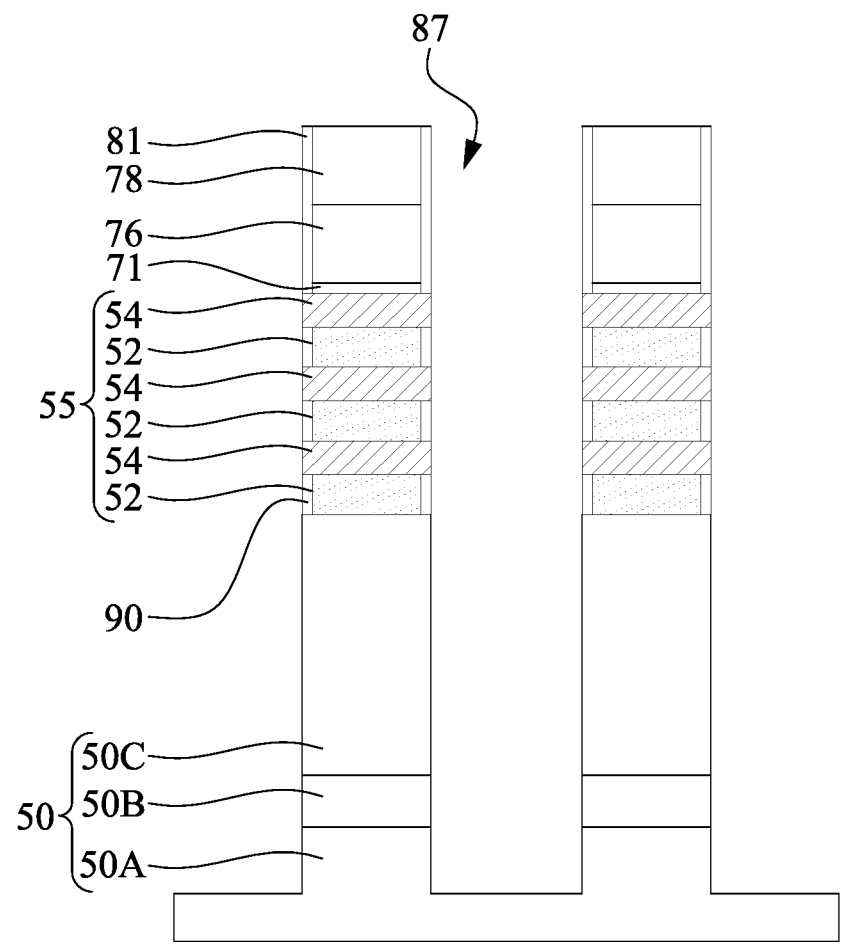

Reference is made to FIGS. 11A to 11C. Second recesses 87 are formed in the substrate 50. In some embodiments, the second recesses 87 may be deep enough to expose the bulk silicon layer 50A of the substrate 50. In some embodiments, after the second recesses 87 are formed, the bottom surfaces of the second recesses 87 may be lower than the topmost surfaces of the bulk silicon layer 50A of the substrate 50. Stated another way, the bottom surfaces of the second recesses 87 may be lower than the interface of the bulk silicon layer 50A and the oxide layer 50B. In some embodiments, the second recesses 87 can be formed in the bulk silicon layer 50A of the substrate 50 using, for example, an anisotropic etching process. In some embodiments, the anisotropic etching may be performed by a dry chemical etch with a plasma source and a reaction gas. By way of example and not limitation, the plasma source may be an inductively coupled plasma (ICP) source, a transformer coupled plasma (TCP) source, an electron cyclotron resonance (ECR) source or the like, and the reaction gas may be a fluorine-based gas (such as $SF_6$, $CH_2F_2$, $CH_3F$, $CHF_3$, or the like), chloride-based gas (e.g., $Cl_2$), hydrogen bromide gas (HBr), oxygen gas ($O_2$), the like, or combinations thereof.

Figure 12A:
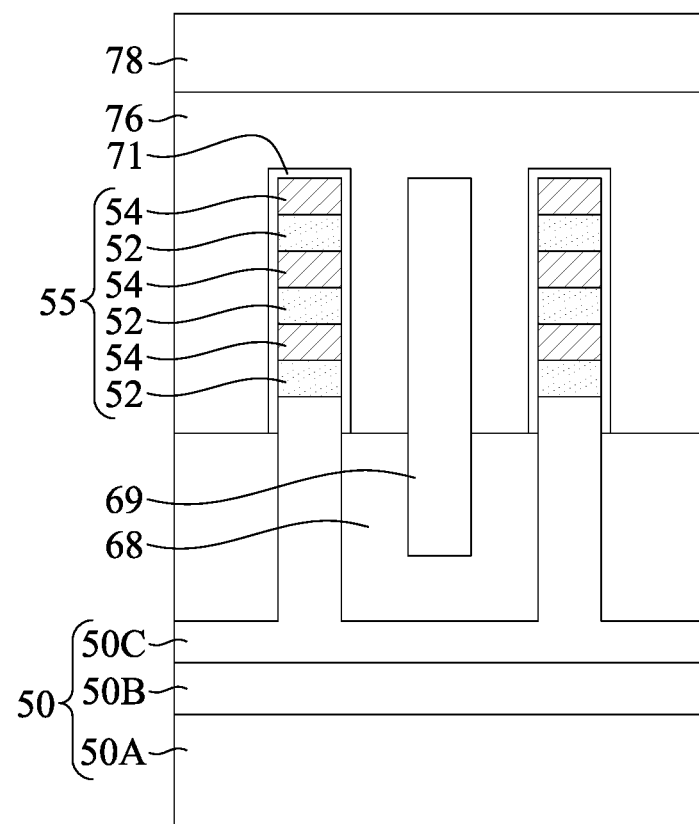
Figure 12B:
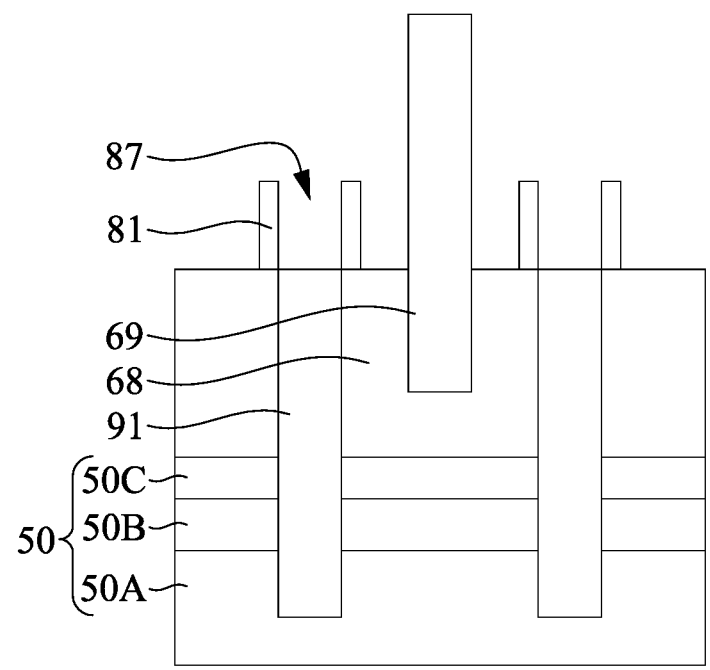
Figure 12C:
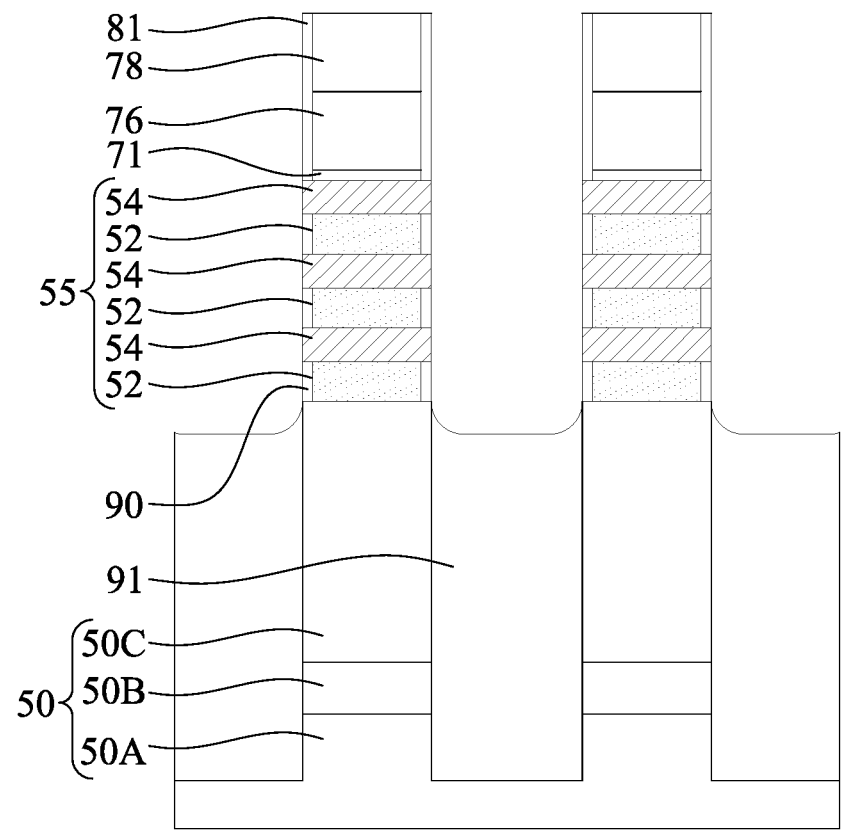

Reference is made to FIGS. 12A to 12C. Epitaxial plugs 91 are formed in the second recesses 87. In some embodiments, the epitaxial plugs 91 are in physical contact with the bulk silicon layer 50A of the substrate 50. In some embodiments, an epitaxial growth process is performed to grow an epitaxial material in the second recesses 87 until the epitaxial material builds up epitaxial plugs 91 filling the second recesses 87. The epitaxial plugs 91 may include a different composition or different material than the bulk silicon layer 50A and the semiconductor layer 50C of substrate 50. For example, the bulk silicon layer 50A and the semiconductor layer 50C of the substrate 50 are Si and the epitaxial plugs 91 are SiGe. In some embodiments, the epitaxial plugs 91 are doped with suitable dopant (e.g., heavily n-type dopant or p-type dopant) to act as a backside conductive plug electrically connecting subsequently formed epitaxial source/drain structures to a backside interconnect structure.

In some embodiments where the epitaxial plugs 91 are made of SiGe, in order to prevent SiGe from being inadvertently formed on end surfaces of the second nanostructures 54, the epitaxial plugs 91 can be grown in a bottom-up fashion, in accordance with some embodiments of the present disclosure. By way of example and not limitation, the epitaxial plugs 91 can be grown by an epitaxial deposition/partial etch process, which repeats the epitaxial deposition/partial etch process at least once. Such repeated deposition/partial etch process is also called a cyclic deposition-etch (CDE) process. In some other embodiments, the epitaxial plugs 91 may be formed by, for example, depositing an epitaxial material filling the first recesses 86 and the second recesses 87, and then etching back the epitaxial material to form the epitaxial plugs 91.

Figure 13A:
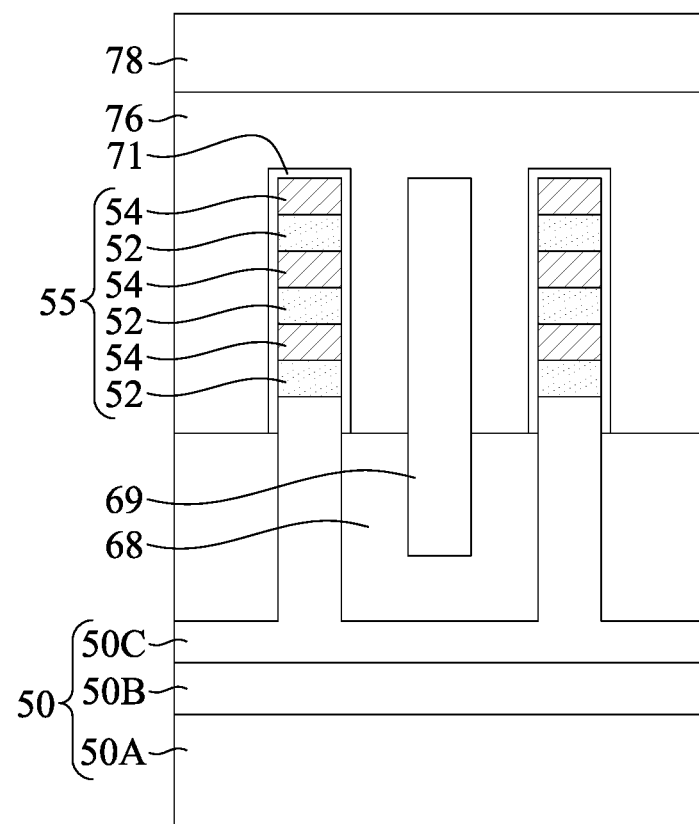
Figure 13B:
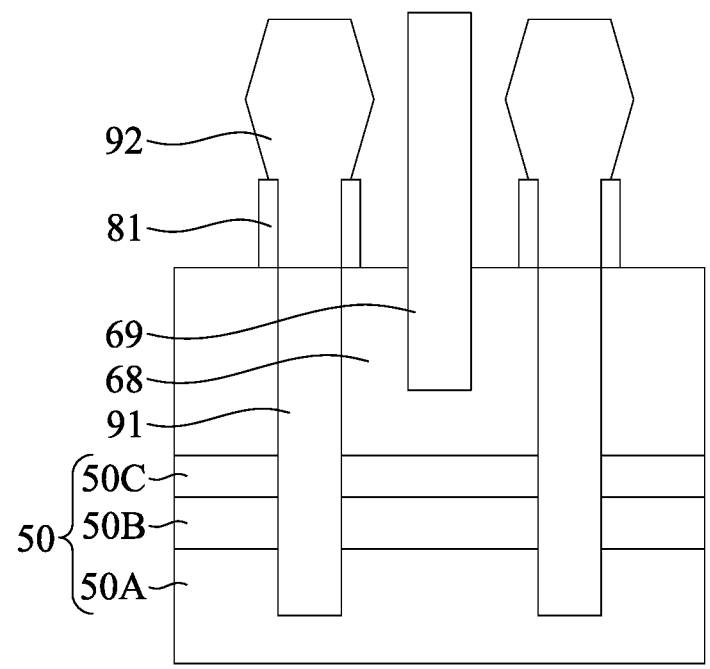
Figure 13C:
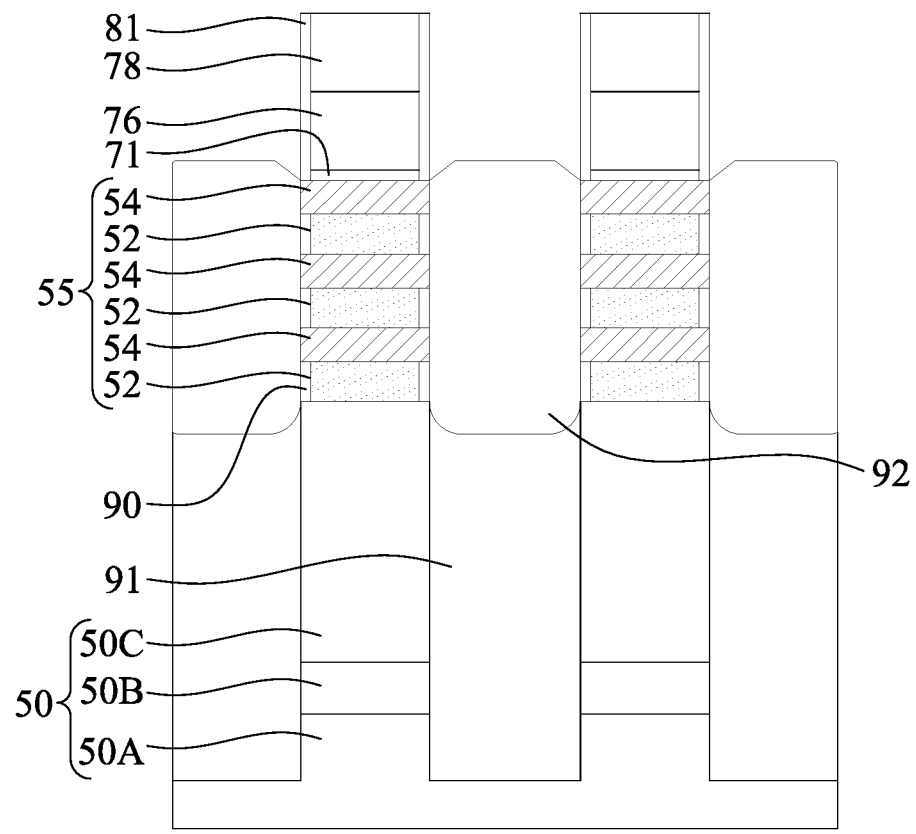

Reference is made to FIGS. 13A to 13C, epitaxial source/drain structures 92 are formed in the first recesses 86. In some embodiments, the epitaxial source/drain structures 92 may exert stress on the second nanostructures 54, thereby improving performance. As illustrated in FIG. 13C, the epitaxial source/drain structures 92 are formed in the first recesses 86 such that each dummy gate 76 is disposed between respective neighboring pairs of the epitaxial source/drain structures 92. In some embodiments, the spacers 81 are used to separate the epitaxial source/drain structures 92 from the dummy gates 76 and the inner spacers 90 are used to separate the epitaxial source/drain structures 92 from the first nanostructures 52 by an appropriate lateral distance so that the epitaxial source/drain structures 92 do not short out with subsequently formed gates of the resulting nano-FETs.

In some embodiments, the epitaxial source/drain structures 92 include p-type dopants such as boron for formation of p-type FETs. In other embodiments, the epitaxial source/drain structures 92 include n-type dopants such as phosphorus for formation of n-type FETs.

Figure 14A:
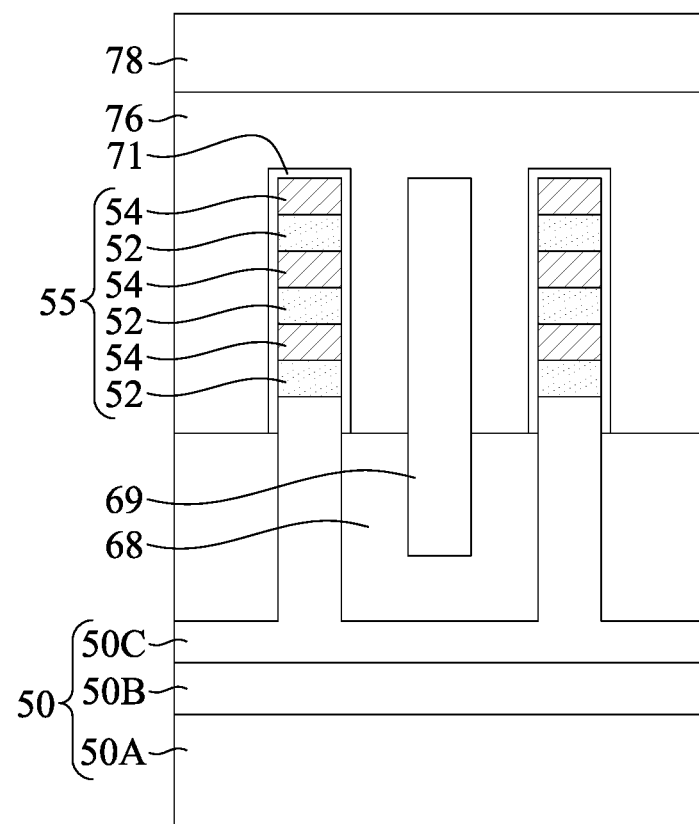
Figure 14B:
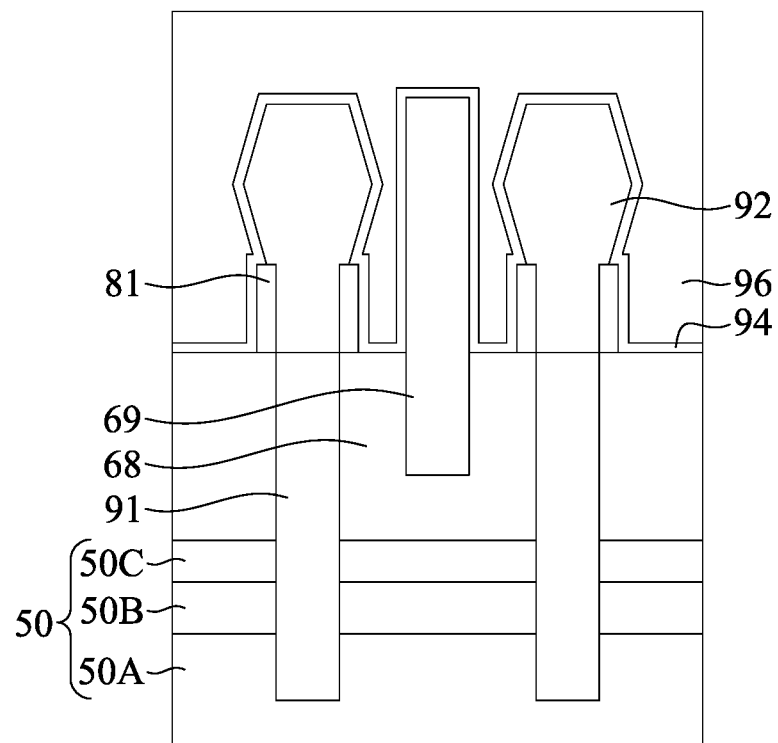
Figure 14C:
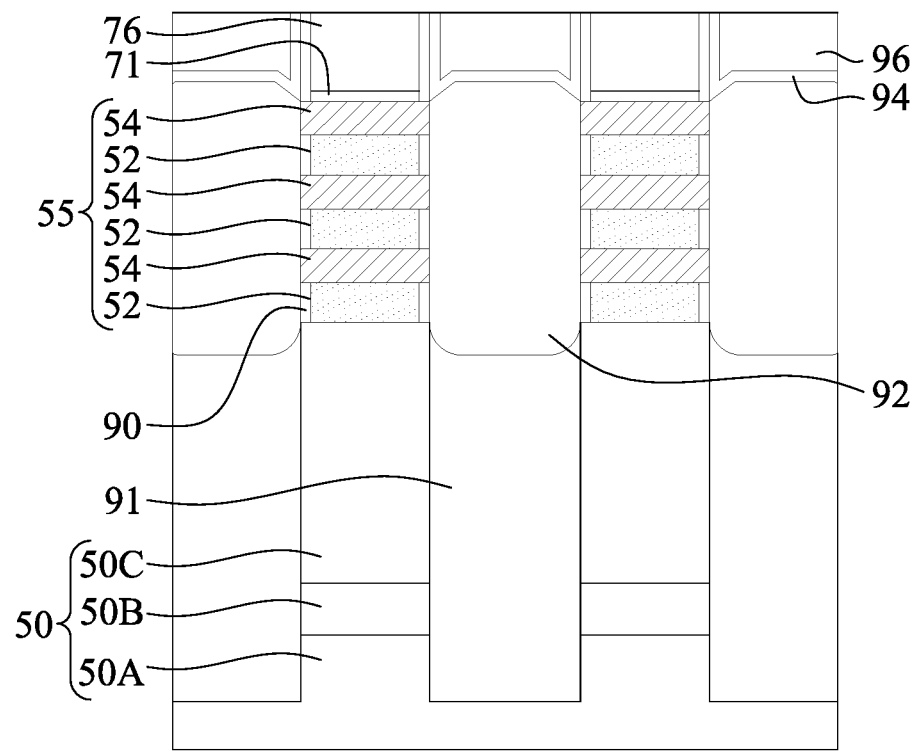

Reference is made to FIGS. 14A to 14C. A first interlayer dielectric (ILD) 96 is deposited over the structure illustrated in FIGS. 13A to 13C, respectively. In some embodiments, a CMP process may be performed to the first ILD 96 until the top surfaces of the dummy gates 76 are exposed. The first ILD 96 may be formed of a dielectric material, and may be deposited by any suitable method, such as CVD, plasma-enhanced CVD (PECVD), or FCVD. Dielectric materials may include phospho-silicate glass (PSG), boro-silicate glass (BSG), boron-doped phospho-silicate glass (BPSG), undoped silicate glass (USG), or the like. Other insulation materials formed by any acceptable process may be used. In some embodiments, a contact etch stop layer (CESL) 94 is disposed between the first ILD 96 and the epitaxial source/drain structures 92, and the spacers 81. The CESL 94 may extend along sidewalls and top surface of the dielectric fin 69. The CESL 94 may include a dielectric material, such as, silicon nitride, silicon oxide, silicon oxynitride, or the like, having a different etch rate than the material of the overlying first ILD 96. In some embodiments, the thickness of the first ILD 96 is in a range from about 1100 Å to about 1300 Å, such as 1200 Å for example.

Figure 15A:
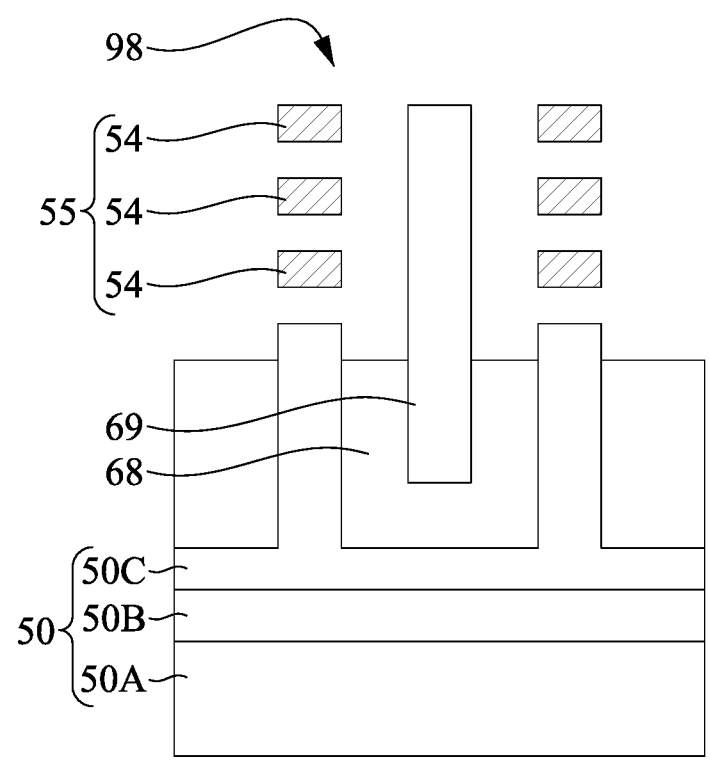
Figure 15B:
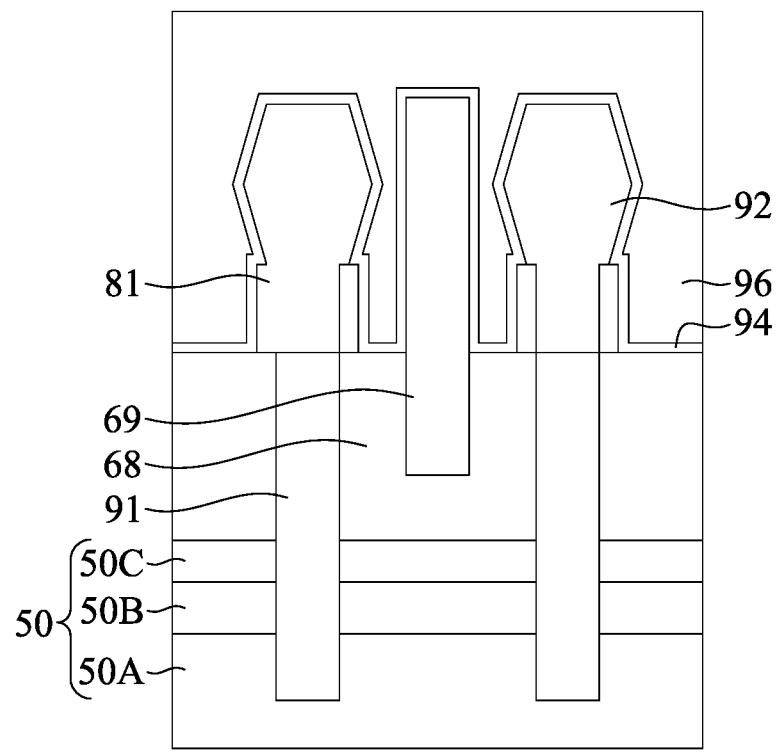
Figure 15C:
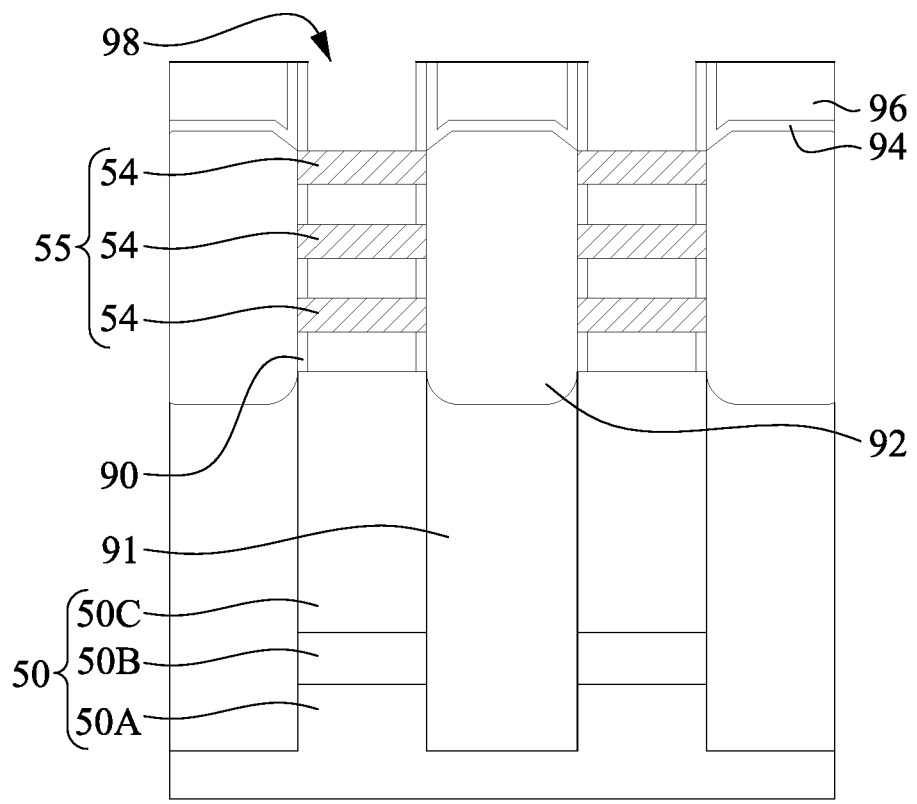

Reference is made to FIGS. 15A to 15C. The dummy gates 76 and the dummy gate dielectrics 71 are removed in one or more etching steps, so that third recesses 98 are formed. In some embodiments, the dummy gates 76 and the dummy gate dielectrics 71 may be removed by an anisotropic dry etch process. For example, the etching process may include a dry etch process using reaction gas(es) that selectively etch the dummy gates 76 at a faster rate than the first ILD 96 or the spacers 81. Each third recess 98 exposes and/or overlies portions of nanostructures 55, which act as channel regions in subsequently completed nano-FETs. Portions of the nanostructures 55 which act as the channel regions are disposed between neighboring pairs of the epitaxial source/drain structures 92. During the removal, the dummy gate dielectrics 71 may be used as etch stop layers when the dummy gates 76 are etched. The dummy gate dielectrics may then be removed after the removal of the dummy gates 76.

Next, the first nanostructures 52 are removed to extend the third recesses 98. The first nanostructures 52 may be removed by performing an isotropic etching process such as wet etching or the like using etchants which are selective to the materials of the first nanostructures 52, while the second nanostructures 54, the substrate 50, the STI regions 68 remain relatively unetched as compared to the first nanostructures 52. In embodiments in which the first nanostructures 52 include, e.g., SiGe, and the second nanostructures 54 include, e.g., Si or SiC, tetramethylammonium hydroxide (TMAH), ammonium hydroxide ($NH_4OH$), or the like may be used to remove the first nanostructures 52.

Figure 16A:
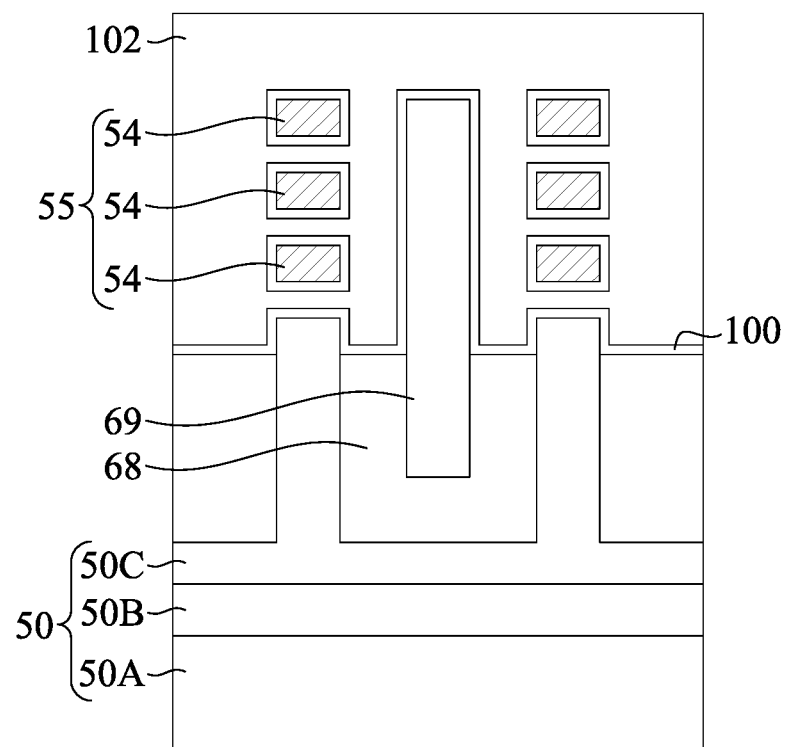
Figure 16B:
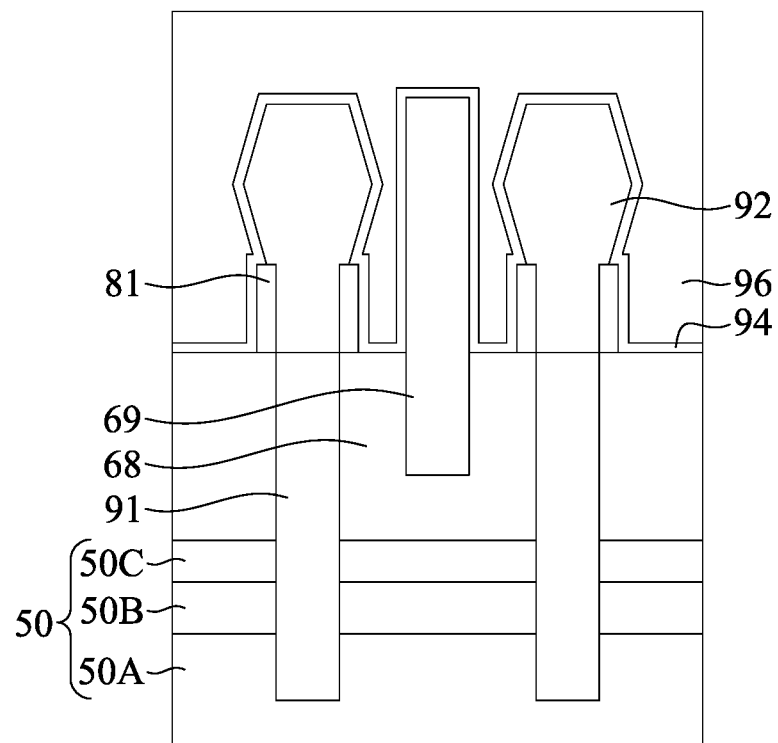
Figure 16C:
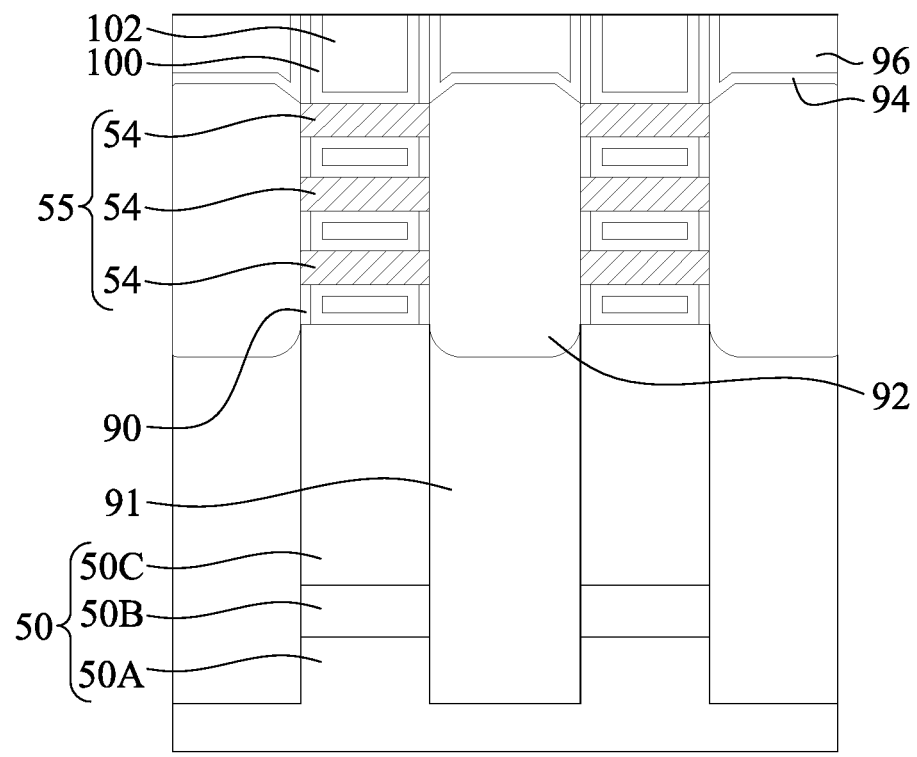

Reference is made to FIGS. 16A to 16C. Gate dielectric layers 100 and gate electrodes 102 are formed for replacement gates. The gate dielectric layers 100 are deposited conformally in the third recesses 98. The gate dielectric layers 100 may be formed on top surfaces and sidewalls of the substrate 50 and on top surfaces, sidewalls, and bottom surfaces of the second nanostructures 54.

In accordance with some embodiments, the gate dielectric layers 100 may include one or more dielectric layers, such as an oxide, a metal oxide, the like, or combinations thereof.

For example, in some embodiments, the gate dielectrics may include a silicon oxide layer and a metal oxide layer over the silicon oxide layer. In some embodiments, the gate dielectric layers 100 include a high-k dielectric material, and in these embodiments, the gate dielectric layers 100 may have a k value greater than about 7.0, and may include a metal oxide or a silicate of hafnium, aluminum, zirconium, lanthanum, manganese, barium, titanium, lead, and combinations thereof. The formation methods of the gate dielectric layers 100 may include molecular-beam deposition (MBD), ALD, PECVD, and the like.

The gate electrodes 102 are deposited over the gate dielectric layers 100, respectively, and fill the remaining portions of the third recesses 98. The gate electrodes 102 may include a metal-containing material such as titanium nitride, titanium oxide, tantalum nitride, tantalum carbide, cobalt, ruthenium, aluminum, tungsten, combinations thereof, or multi-layers thereof. For example, although single layer gate electrodes 102 are illustrated in FIGS. 16A to 16C, the gate electrodes 102 may include any number of liner layers, any number of work function tuning layers, and a fill material.

After the filling of the third recesses 98, a planarization process, such as a CMP, may be performed to remove the excess portions of the gate dielectric layers 100 and the material of the gate electrodes 102, which excess portions are over the top surface of the first ILD 96. The remaining portions of material of the gate electrodes 102 and the gate dielectric layers 100 thus form replacement gate structures of the resulting nano-FETs. The gate electrodes 102 and the gate dielectric layers 100 may be collectively referred to as "gate structures."

Figure 17A:
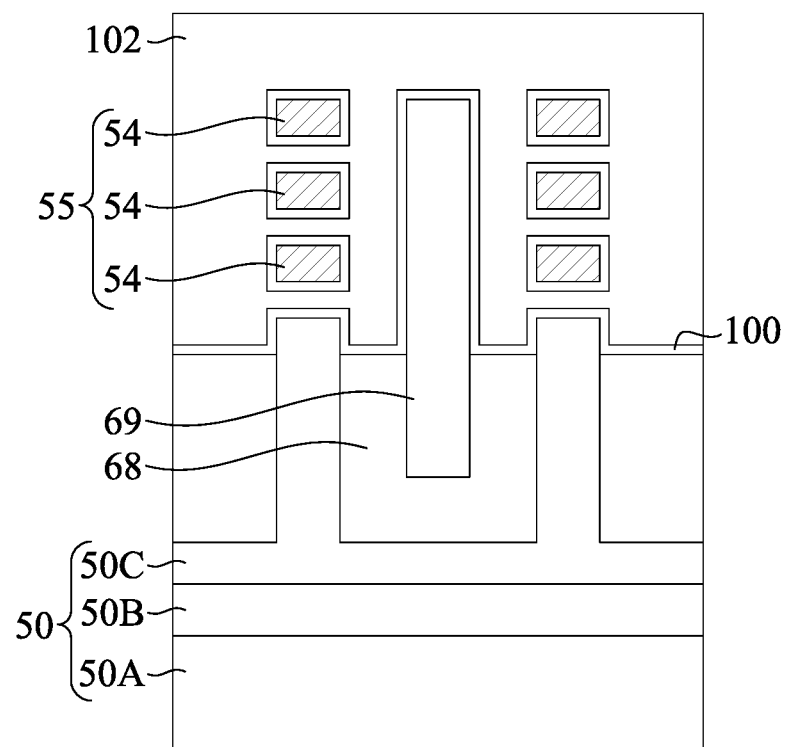
Figure 17B:
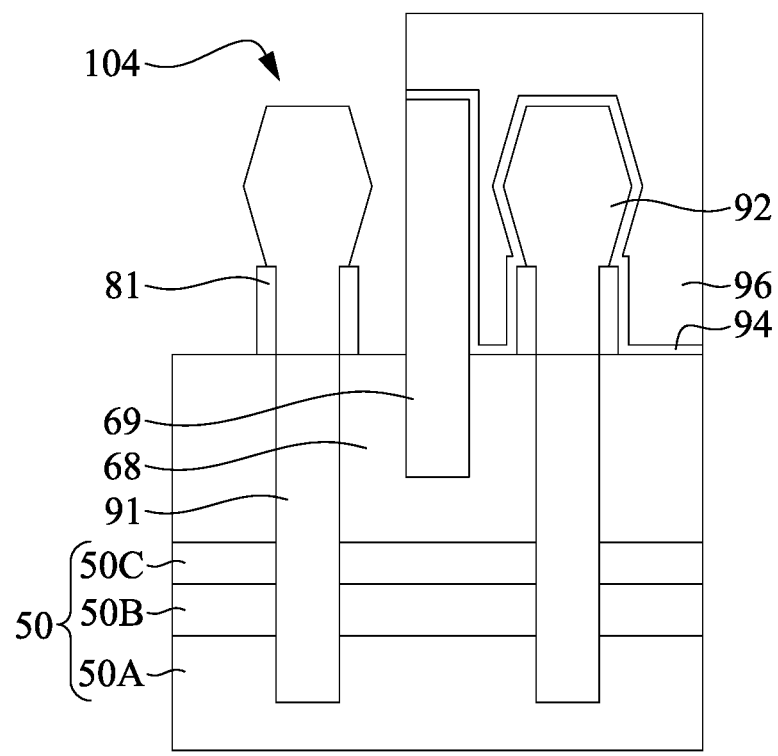
Figure 17C:
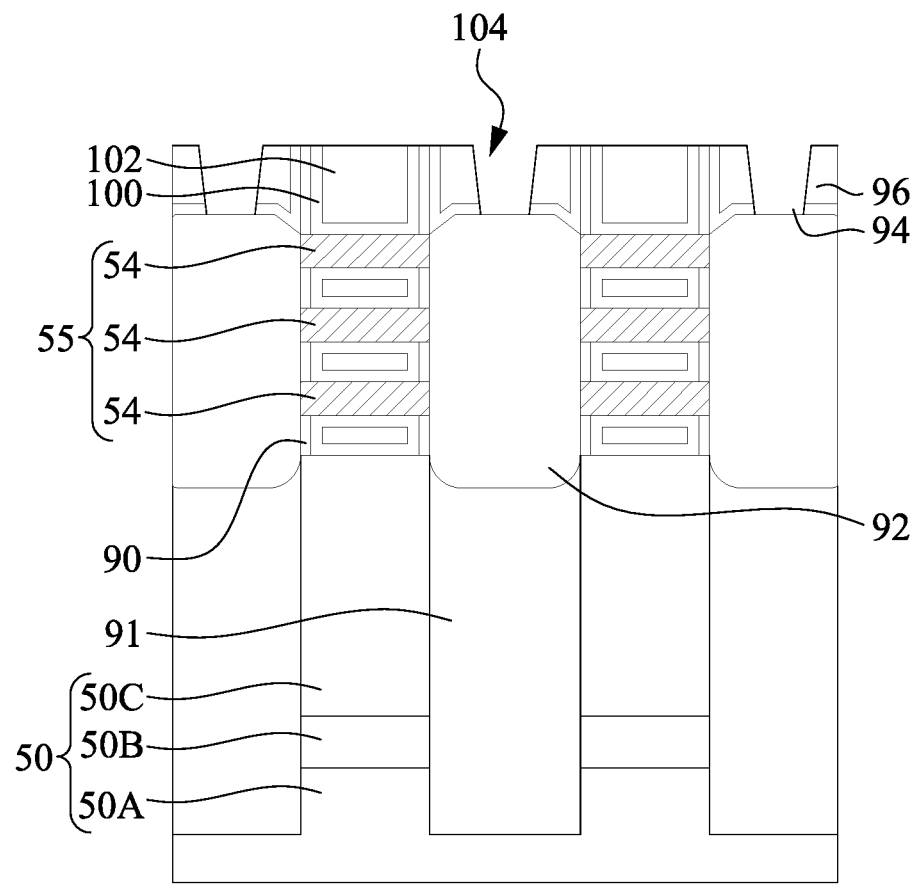

Reference is made to FIGS. 17A to 17C. Contact openings 104 are formed in the first ILD 96 to expose the epitaxial source/drain structures 92. In some embodiments, the openings 104 may be formed by, for example, forming a mask layer, such as a photoresist layer, over the first ILD 96, patterning the mask layer to form openings in the mask layer, etching the first ILD 96 through the openings of the mask layer, and then removing the mask layer. As shown in the cross-section of FIG. 17B, in some embodiments, an epitaxial source/drain structure 92 (on the right side) is covered by the first ILD 96 after the contact openings 104 are formed. In such embodiments, one sidewall of the dielectric fin 69 may be exposed by the opening 104, while the other one sidewall and the top surface of the dielectric fin 69 may be covered by the first ILD 96.

Figure 18A:
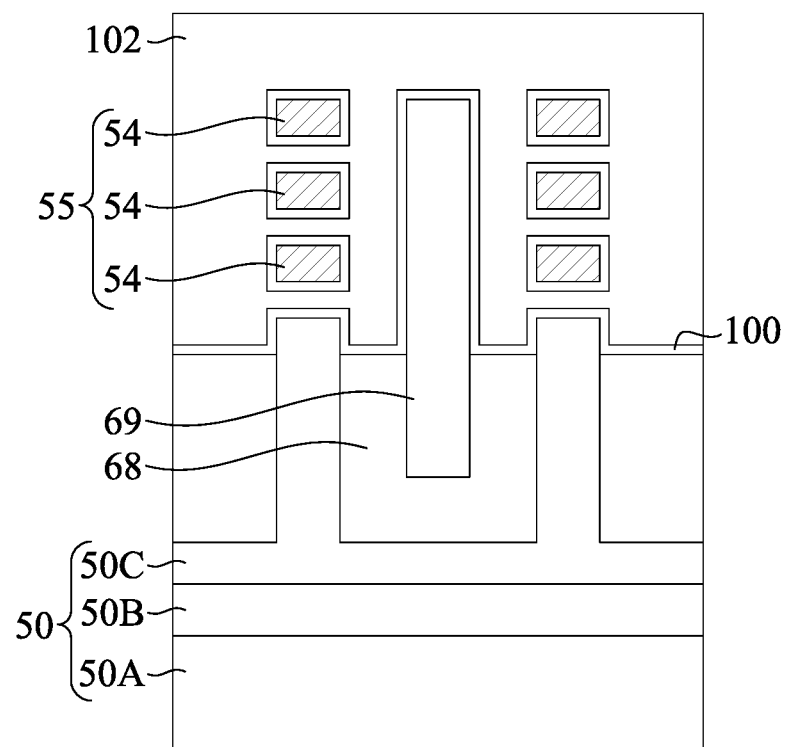
Figure 18B:
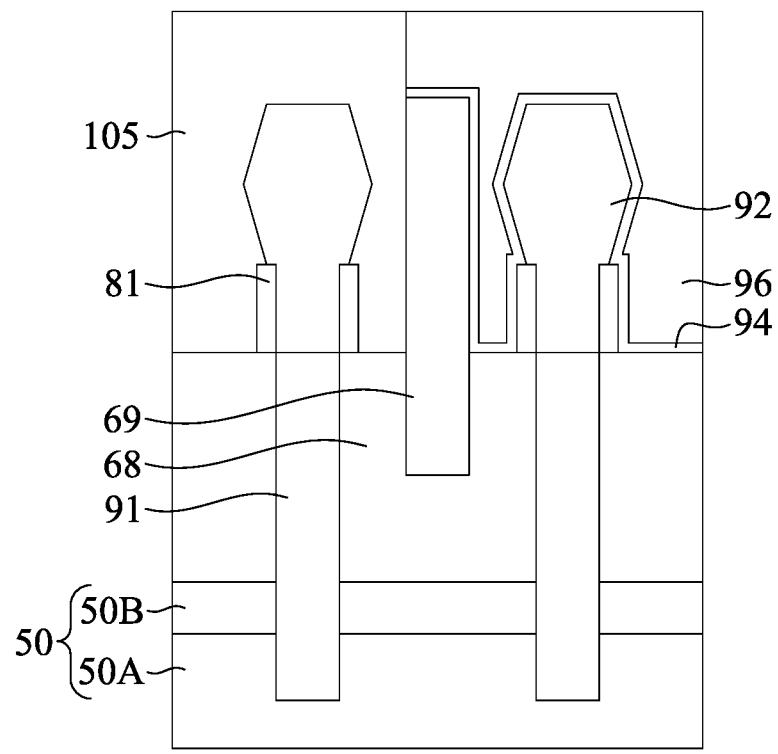
Figure 18C:
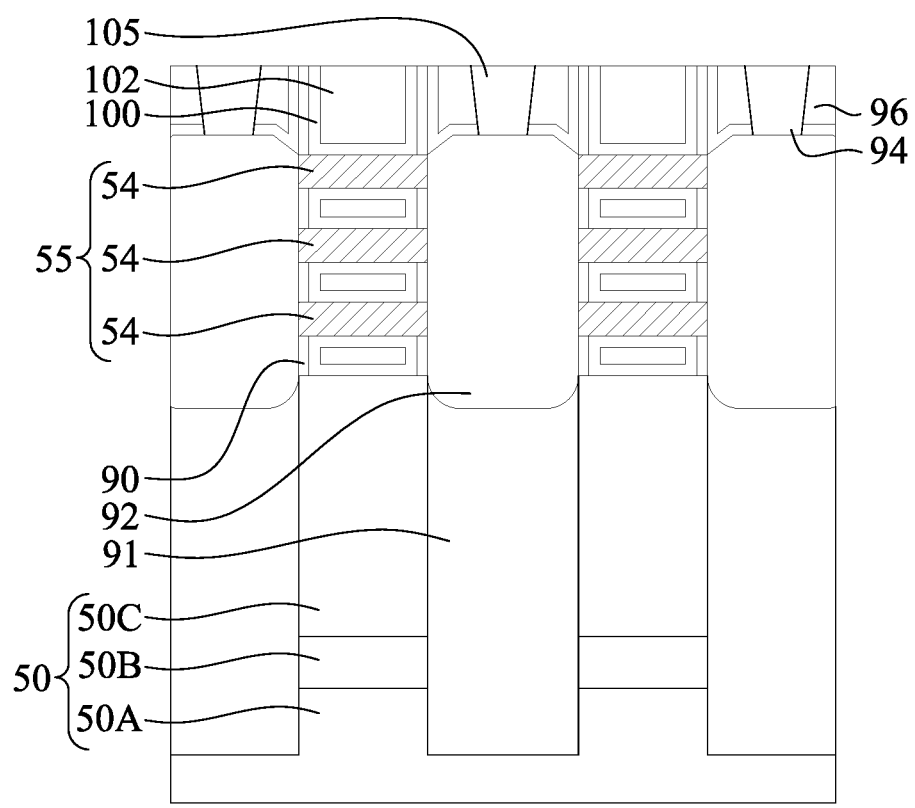

Reference is made to FIGS. 18A to 18C. Source/drain contacts 105 are formed in the contact openings 104, respectively. In some embodiments, the source/drain contacts 105 may be formed by, for example, depositing one or more conductive materials in the contact openings 104, and performing a CMP process to remove excess conductive materials until the top surface of the first ILD 96 is exposed. The contacts 105 may include one or more layers, such as barrier layers, diffusion layers, and fill materials. In some embodiments, the contacts each may include a barrier layer made of titanium, titanium nitride, tantalum, tantalum nitride, or the like, and a conductive material made of copper, a copper alloy, silver, gold, tungsten, cobalt, aluminum, nickel, or the like.

In some embodiments, prior to forming the source/drain contacts 105, silicide layers (not shown) may be formed over the epitaxial source/drain structures 92 exposed by the openings 104. In some embodiments, the silicide layers are formed by first depositing a metal (not shown) capable of reacting with the semiconductor materials of the underlying epitaxial source/drain structures 92 (e.g., silicon, silicon germanium, germanium) to form silicide or germanide regions, such as nickel, cobalt, titanium, tantalum, platinum, tungsten, other noble metals, other refractory metals, rare earth metals or their alloys, over the exposed portions of the epitaxial source/drain structures 92, then performing a thermal anneal process to form the silicide layers. The unreacted portions of the deposited metal are then removed, e.g., by an etching process.

Figure 19A:
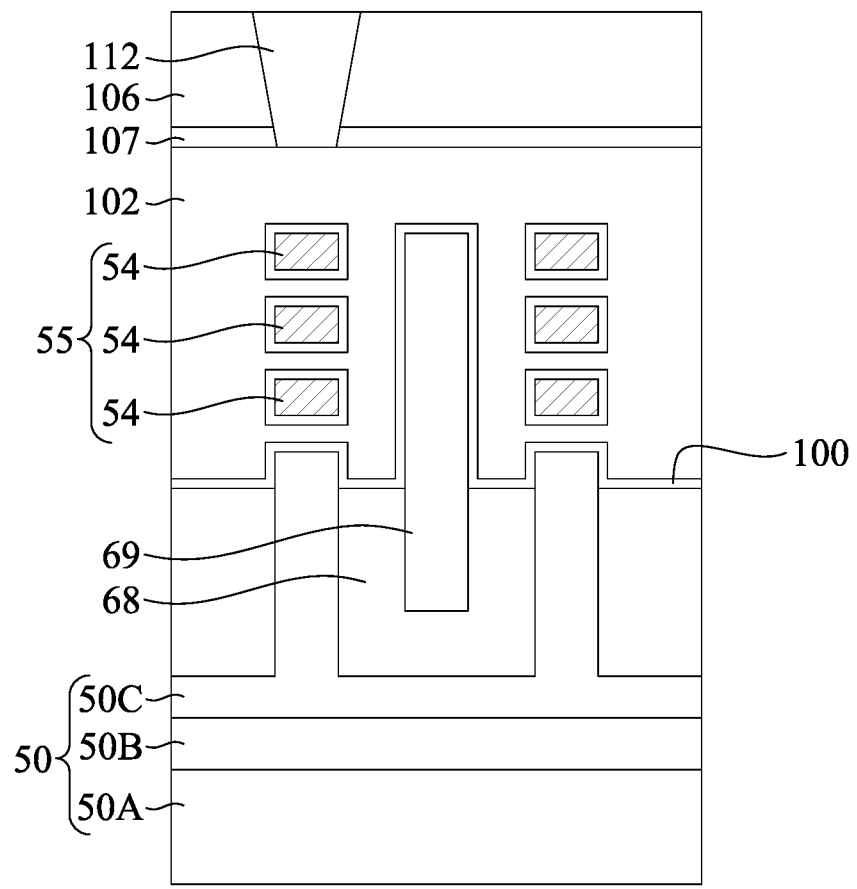
Figure 19B:
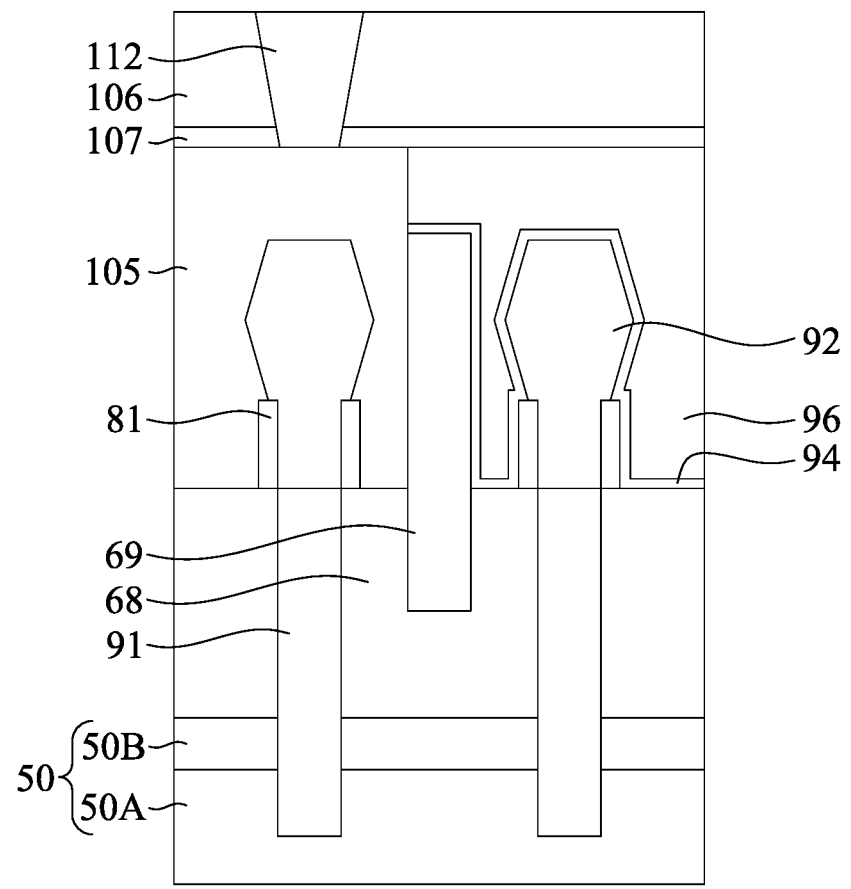
Figure 19C:
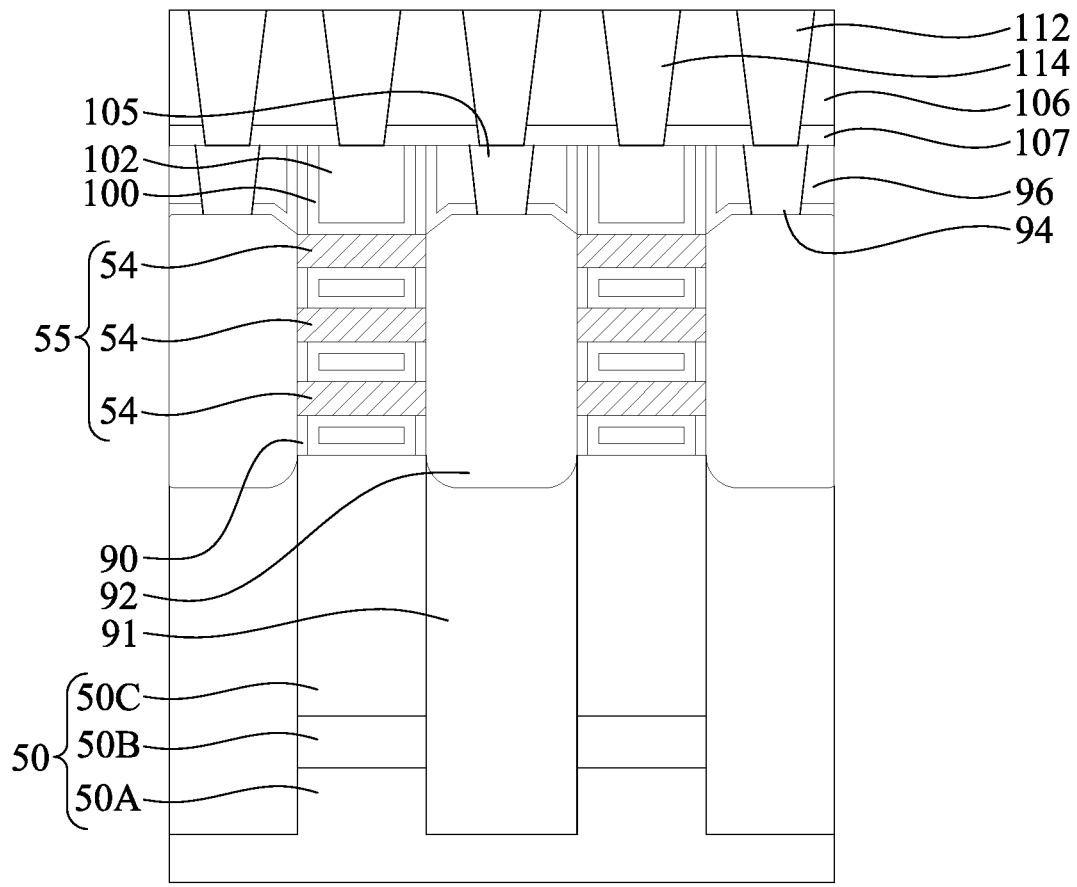

Reference is made to FIGS. 19A to 19C. An etch stop layer (ESL) 107 is formed over the first ILD 96, a second ILD 106 is formed over the ESL 107, and source/drain vias 112 and gate contacts 114 are formed extending through the second ILD 106 and the ESL 107 to the source/drain contacts 105 and the gate electrodes 102, respectively. In some embodiments, the source/drain vias 112 and gate contacts 114 may be formed by, for example, patterning the second ILD 106 and the ESL 107 to form openings, depositing one or more conductive materials in the openings, and performing a CMP process to remove excess conductive materials until the top surface of the second ILD 106 is exposed. The source/drain vias 112 and gate contacts 114 may include one or more layers, such as barrier layers, diffusion layers, and fill materials. In some embodiments, the contacts each may include a barrier layer made of titanium, titanium nitride, tantalum, tantalum nitride, or the like, and a conductive material made of copper, a copper alloy, silver, gold, tungsten, cobalt, aluminum, nickel, or the like. In some embodiments, the total thickness of the second ILD 106 and the ESL 107 is in a range from about 450 Å to about 550 Å, such as 500 Å for example.

Figure 20A:
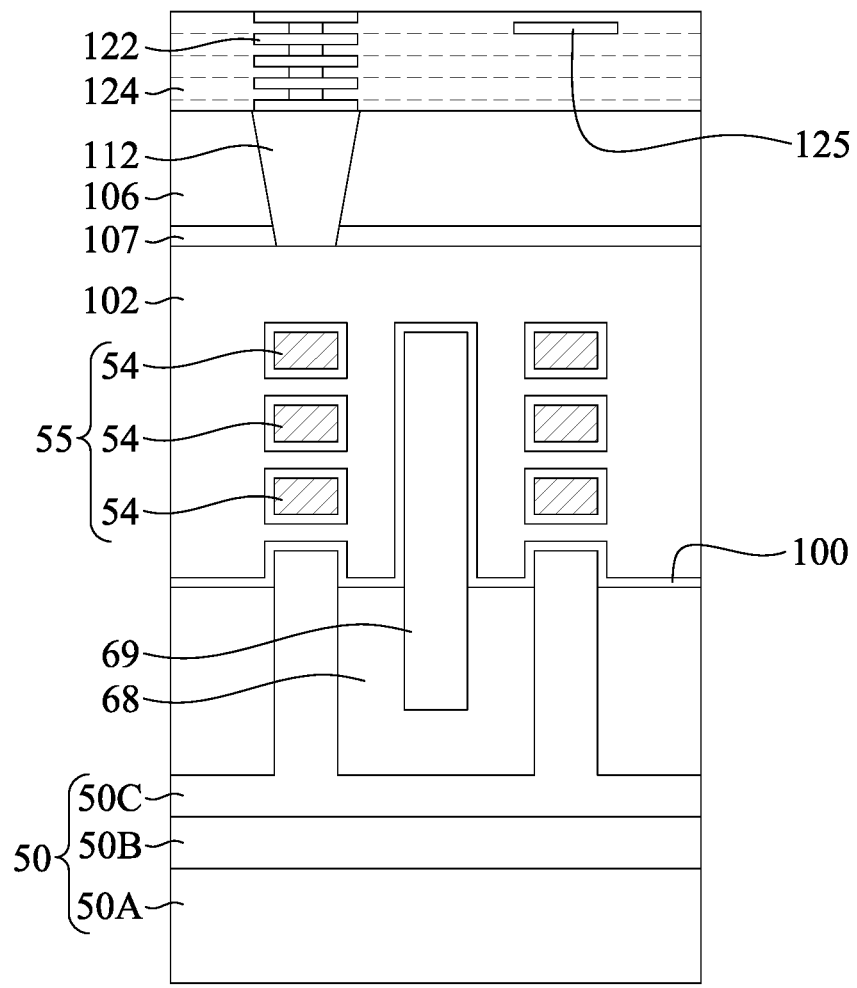
Figure 20B:
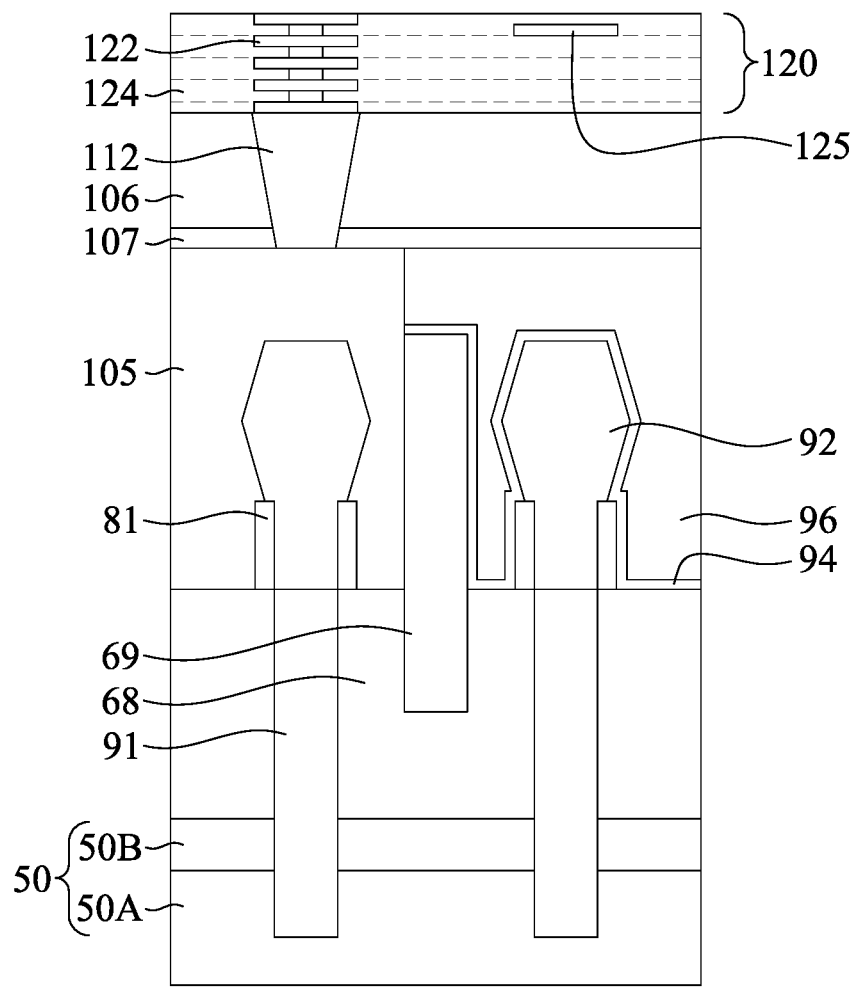
Figure 20C:
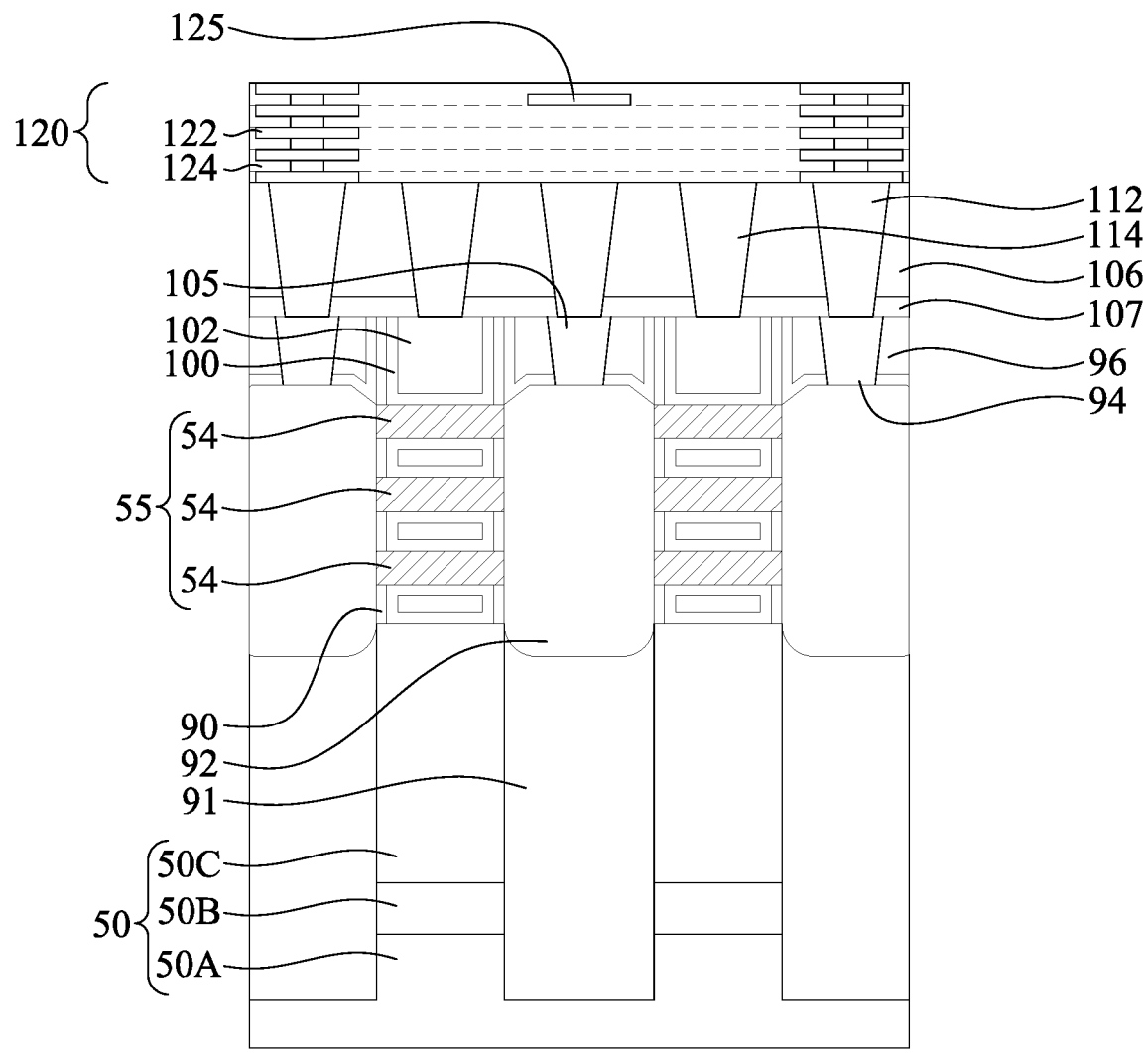

Reference is made to FIGS. 20A to 20C. An interconnect structure 120 is formed over the second ILD 106. The interconnect structure 120 may also be referred to as a front-side interconnect structure because it is formed on a front-side of the substrate 50. In some embodiments, the thickness of the interconnect structure 120 is in a range from about 28000 Å to about 30000 Å, such as 28940 Å for example.

The interconnect structure 120 may include one or more layers of conductive features 122 formed in one or more stacked dielectric layers 124. Each of the stacked dielectric layers 124 may include a dielectric material, such as a low-k dielectric material, an extra low-k (ELK) dielectric material, or the like. The dielectric layers 124 may be deposited using an appropriate process, such as, CVD, ALD, PVD, PECVD, or the like.

Conductive features 122 may include conductive lines and conductive vias interconnecting the layers of conductive lines. The conductive vias may extend through respective ones of the dielectric layers 124 to provide vertical connections between layers of conductive lines. The conductive features 122 may be formed through any acceptable process, such as, a damascene process, a dual damascene process, or the like.

For example, the conductive features 122 may be formed using a damascene process in which a respective dielectric layer 124 is patterned utilizing a combination of photolithography and etching techniques to form trenches corresponding to the desired pattern of the conductive features 122. An optional diffusion barrier and/or optional adhesion layer may be deposited and the trenches may then be filled with a conductive material. Suitable materials for the barrier layer includes titanium, titanium nitride, titanium oxide, tantalum, tantalum nitride, r other alternatives, and suitable materials for the conductive material include copper, silver, gold, tungsten, aluminum, combinations thereof, or the like.

In an embodiment, the conductive features 122 may be formed by depositing a seed layer of copper or a copper alloy, and filling the trenches by electroplating. A chemical mechanical planarization (CMP) process or the like may be used to remove excess conductive material from a surface of the respective dielectric layer 124 and to planarize the surface for subsequent processing.

In some embodiments, a high resistance (HiR) resistor 125 may be formed in the interconnect structure 120. For example, the HiR resistor 125 is formed of a high resistance material, e.g. Titanium nitride (TiN) or Tantalum nitride (TaN).

In FIGS. 20A to 20C, five layers of conductive features 122 and dielectric layers 124 are illustrated. However, it should be appreciated that the interconnect structure 120 may include any number of conductive features disposed in any number of dielectric layers. The interconnect structure 120 may be electrically connected to gate contacts 114 and source/drain vias 112 to form functional circuits. That is, the interconnect structure 120 may be electrically connected to gate electrode 102 (or gate structure) and source/drain structures 92. In some embodiments, the functional circuits formed by the interconnect structure 120 may include logic circuits, memory circuits, image sensor circuits, or the like.

Figure 21A:
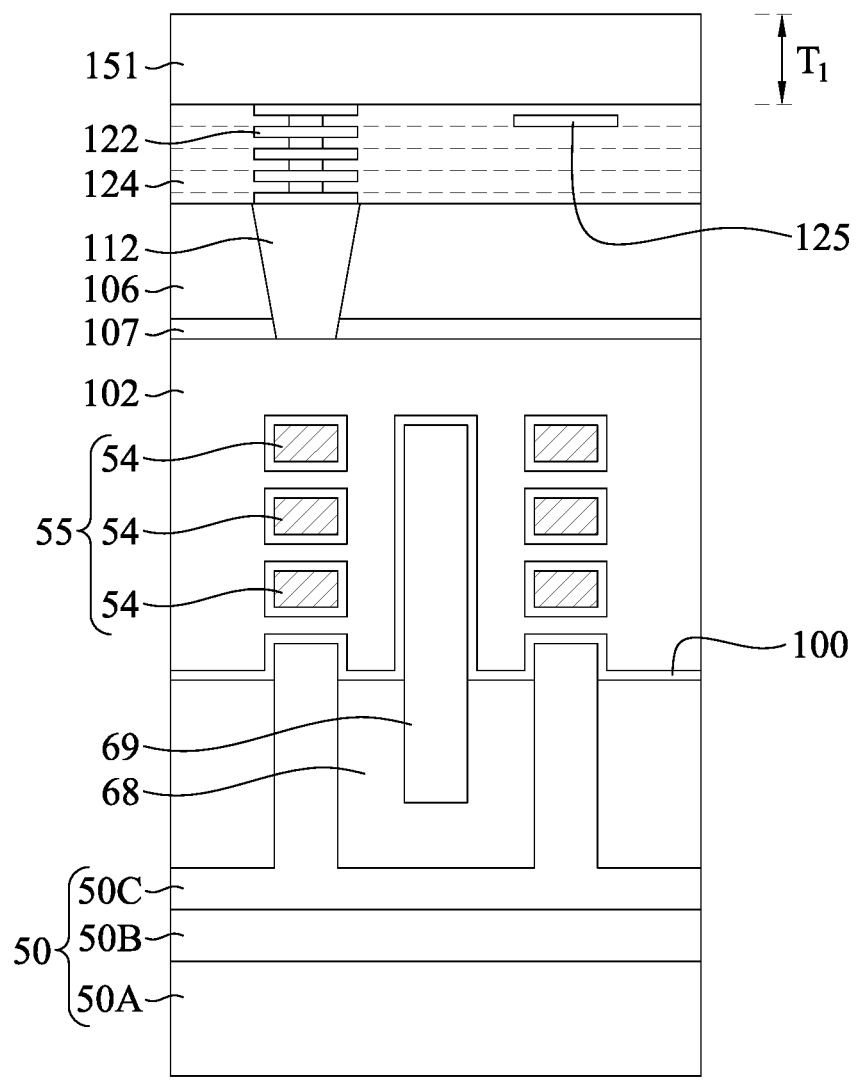
Figure 21B:
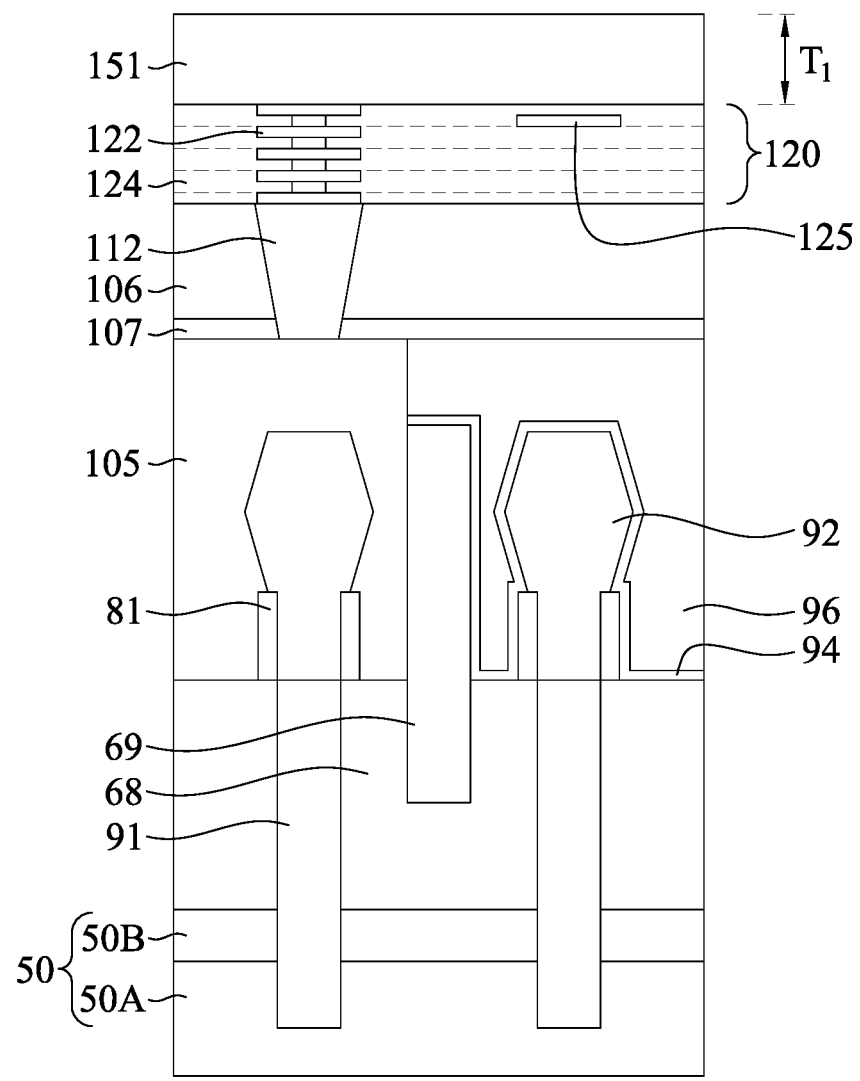
Figure 21C:
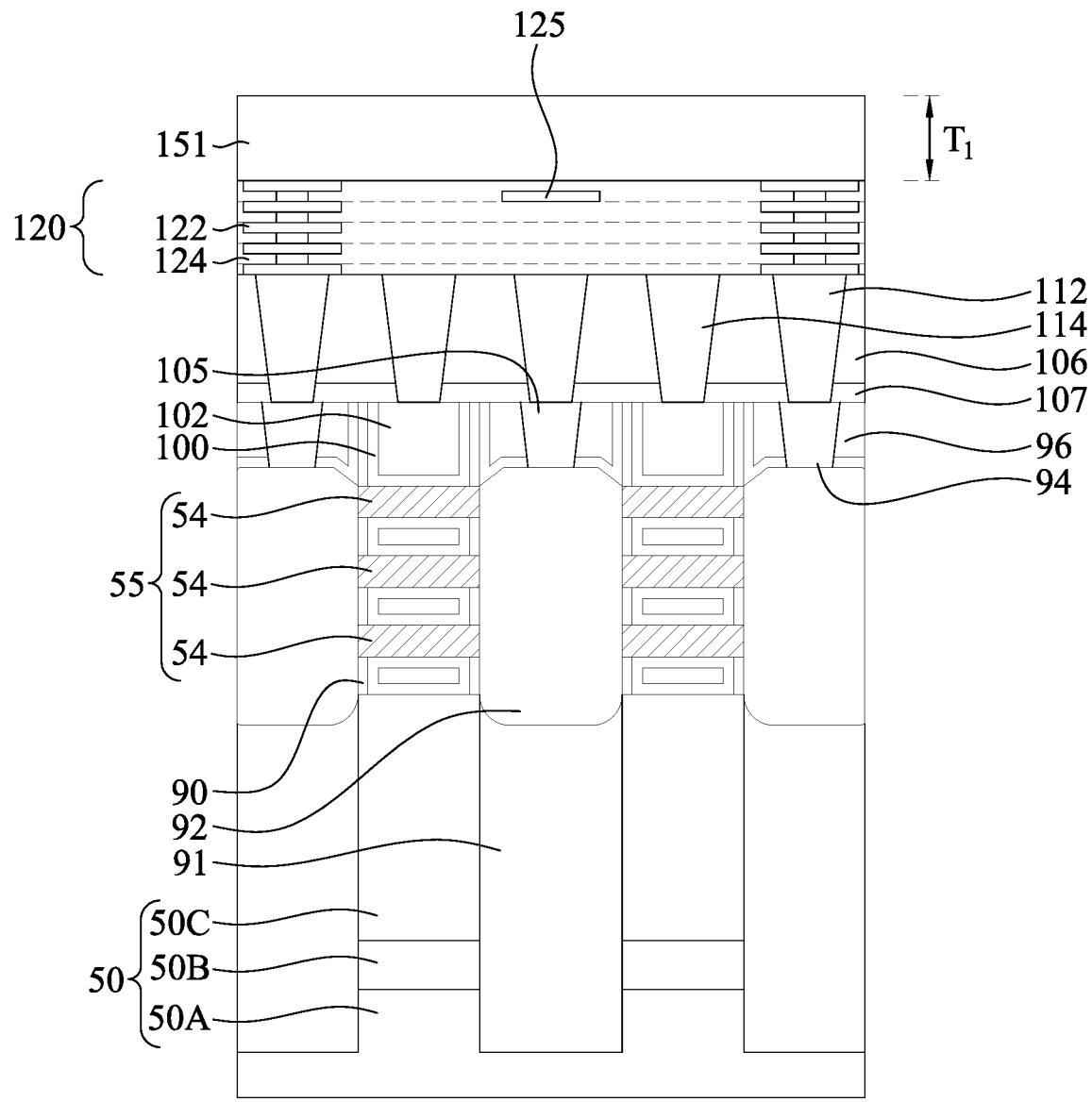

Reference is made to FIGS. 21A to 21C. A first dielectric layer 151 is formed over the interconnect structure 120. In some embodiments, the first dielectric layer 151 may be formed of un-doped silicate glass (USG), silicon oxide (SiO$_x$), silicon dioxide (SiO$_2$), or other suitable materials. The first dielectric layer 151 may also be referred to as an oxide layer. In some embodiments, the first oxide layer 151 may be formed by a high density plasma (HDP) deposition process, such as plasma enhanced chemical vapor deposition (PECVD). Accordingly, the first dielectric layer 151 may also be referred to as a HDP dielectric layer or a HDP oxide layer. In some embodiments, the first dielectric layer 151 has a thickness T1, in which the thickness T1 is in a range from about 17000 Å to about 19000 Å, such as 18000 Å for example.

Figure 22A:
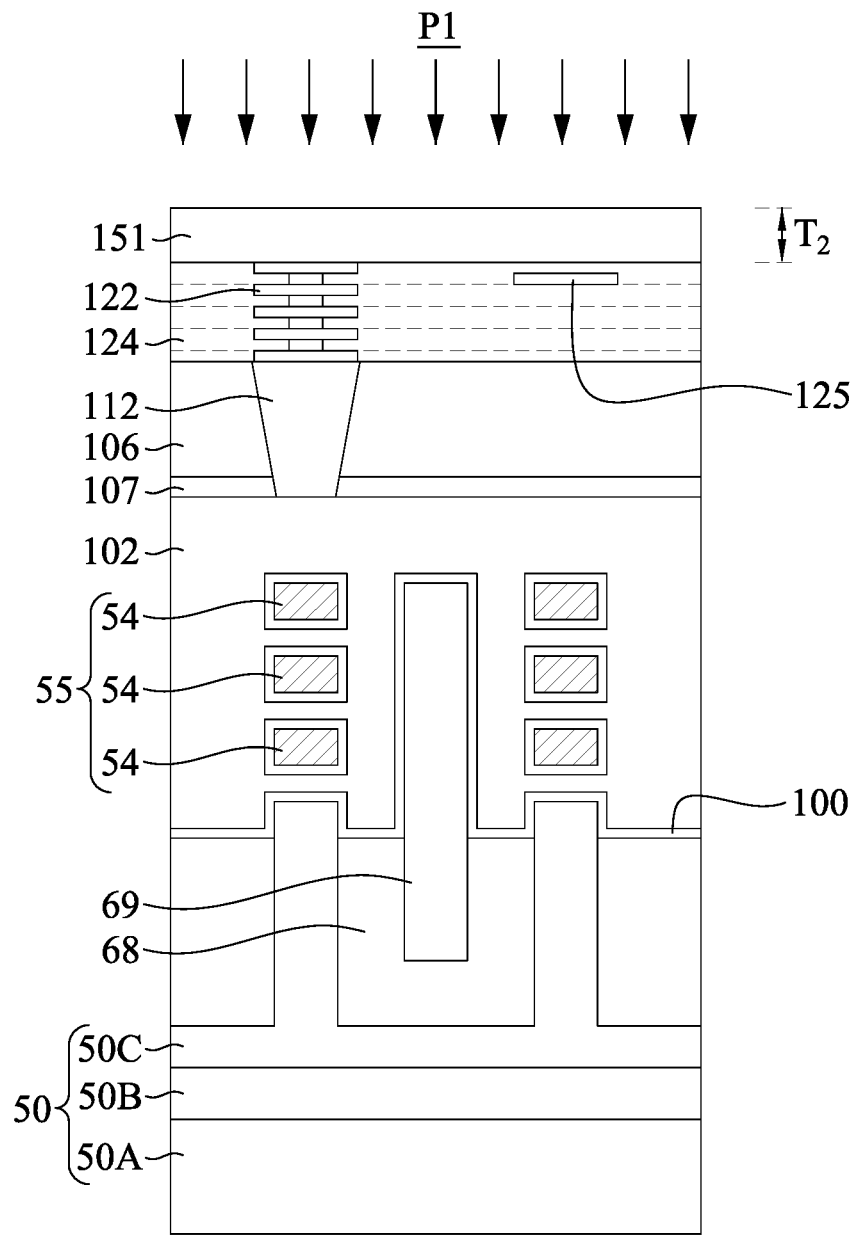
Figure 22B:
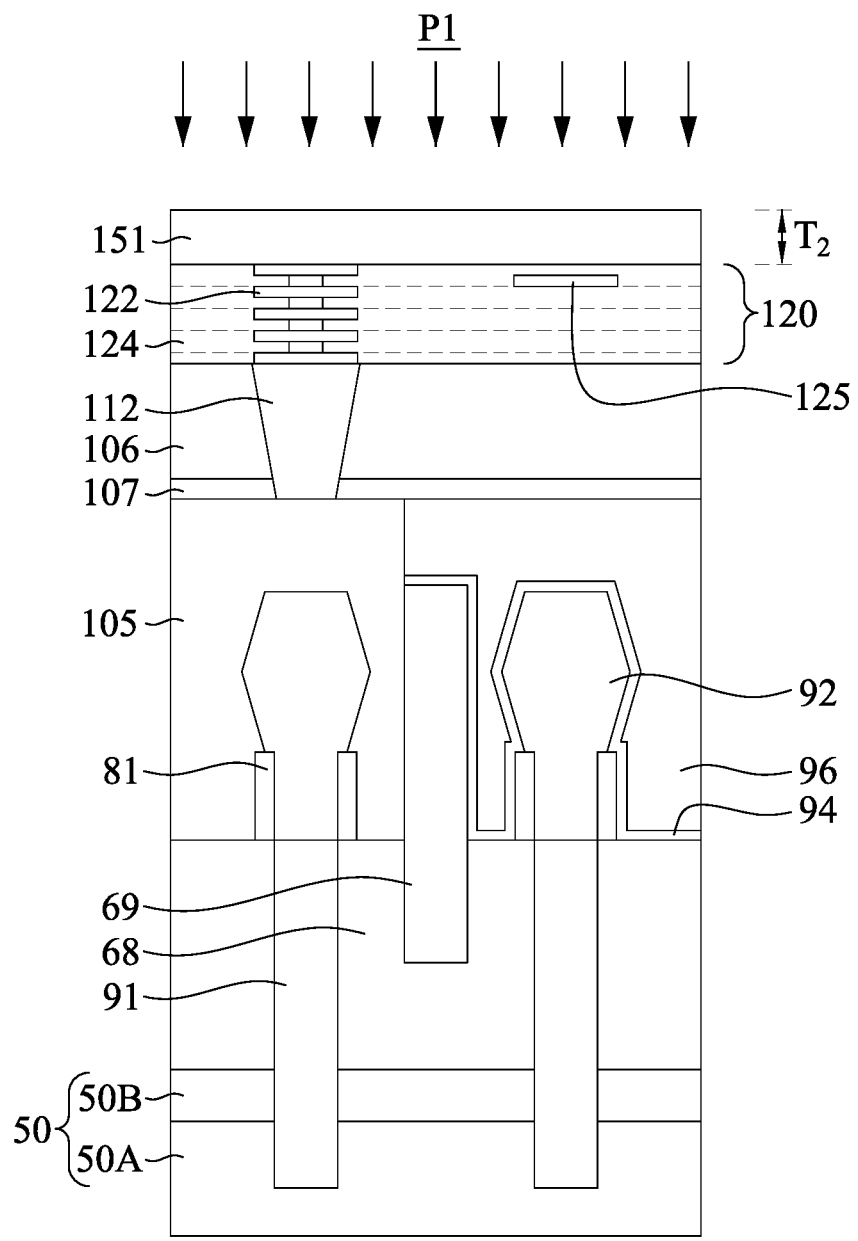
Figure 22C:
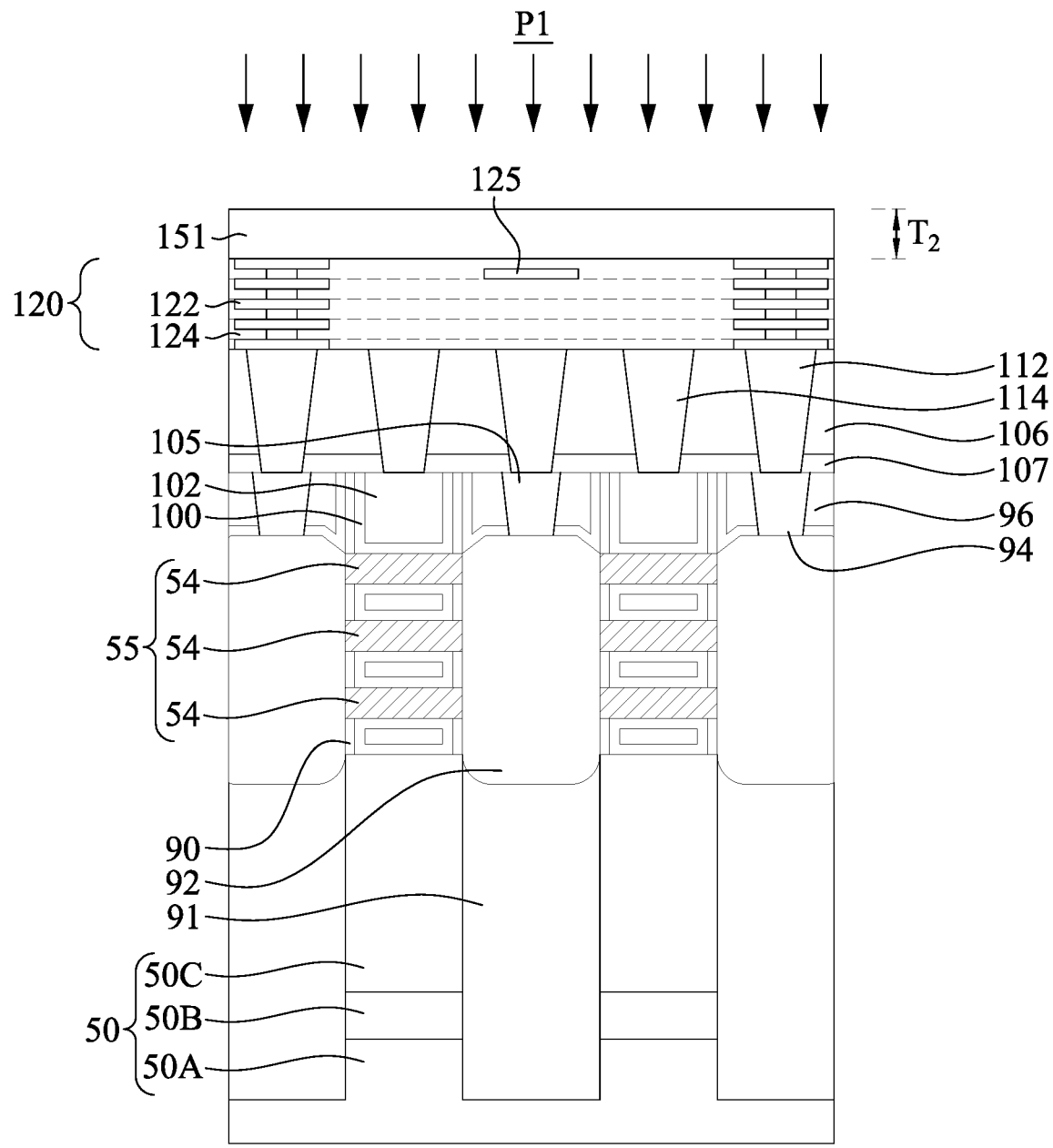

Reference is made to FIGS. 22A to 22C. A first chemical mechanical polishing (CMP) process P1 is performed to the first dielectric layer 151 to planarize the top surface of the first dielectric layer 151. In some embodiments, the first CMP process P1 also reduces the thickness of the first dielectric layer 151. Accordingly, after the first CMP process P1, the thickness T1 of first dielectric layer 151 (see FIGS. 22A to 22C) is reduced to a thickness T2 lower than the thickness T1. In some embodiments, the thickness T2 is in a range from about 3500 Å to about 4500 Å, such as 4000 Å for example.

Figure 23A:
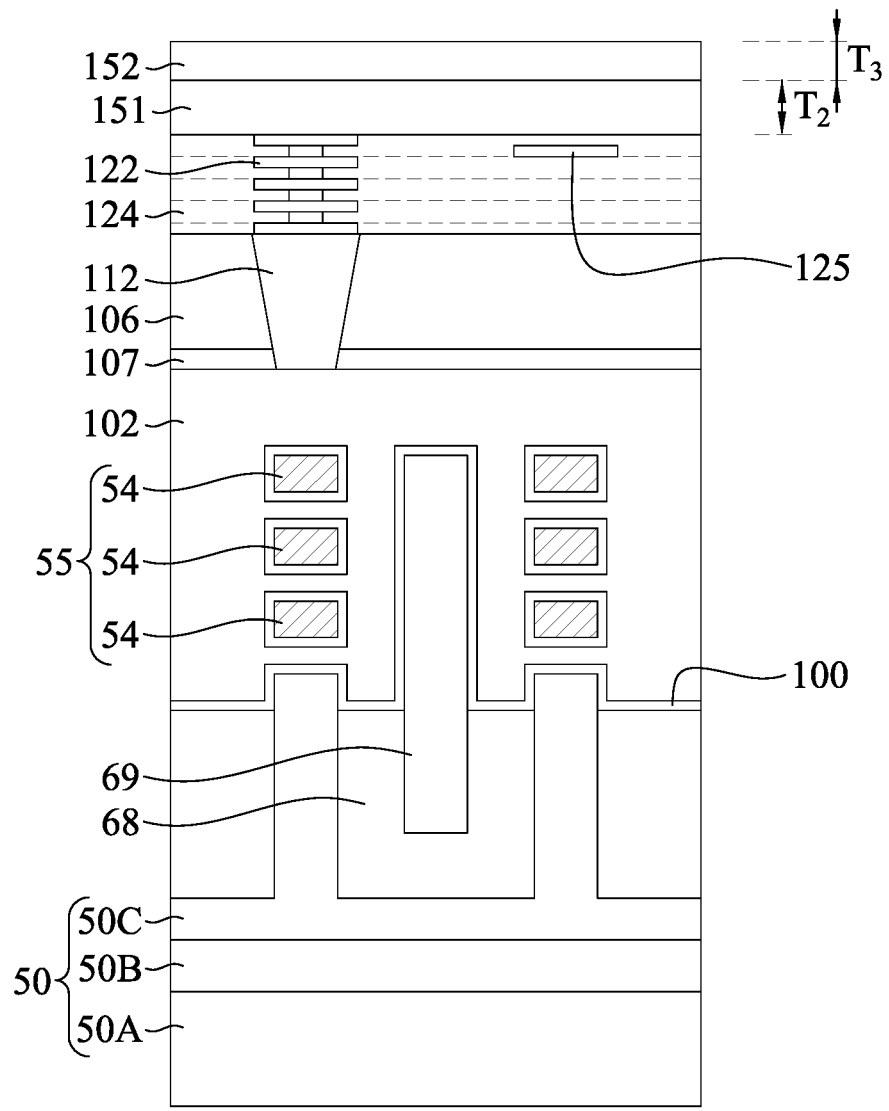
Figure 23B:
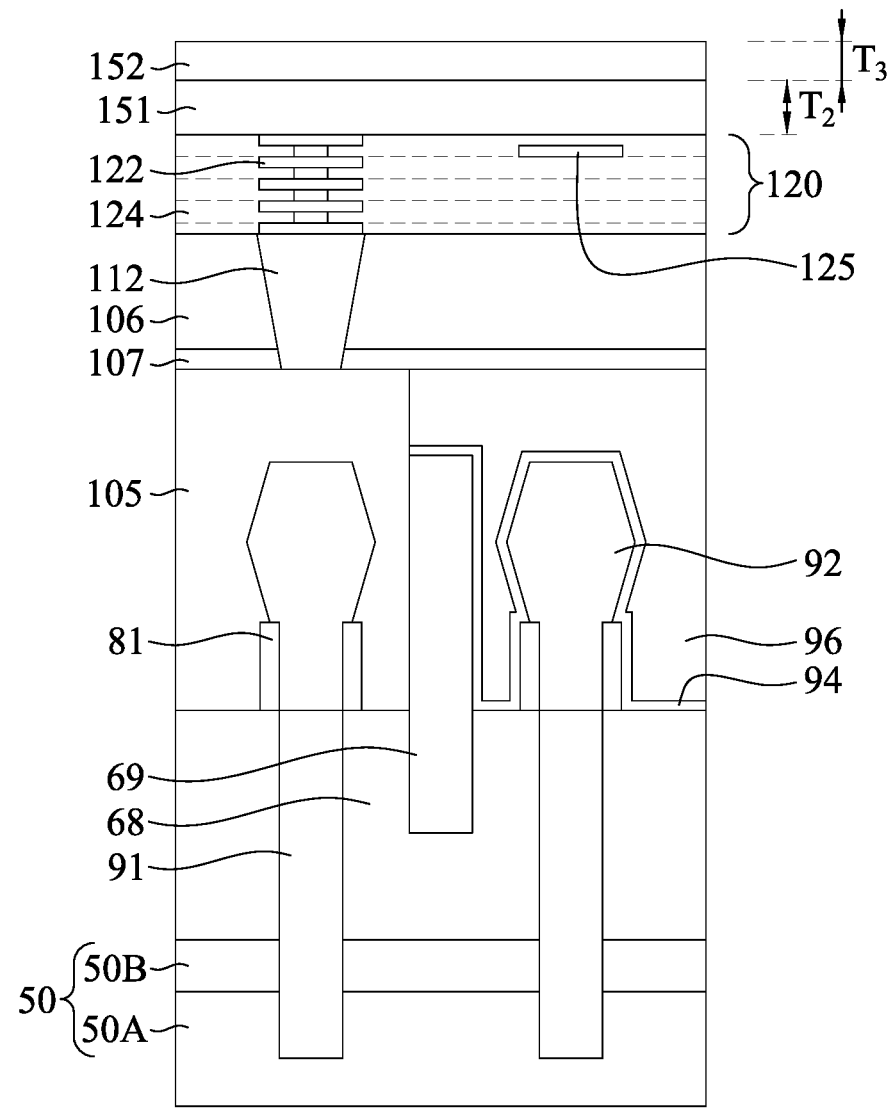
Figure 23C:
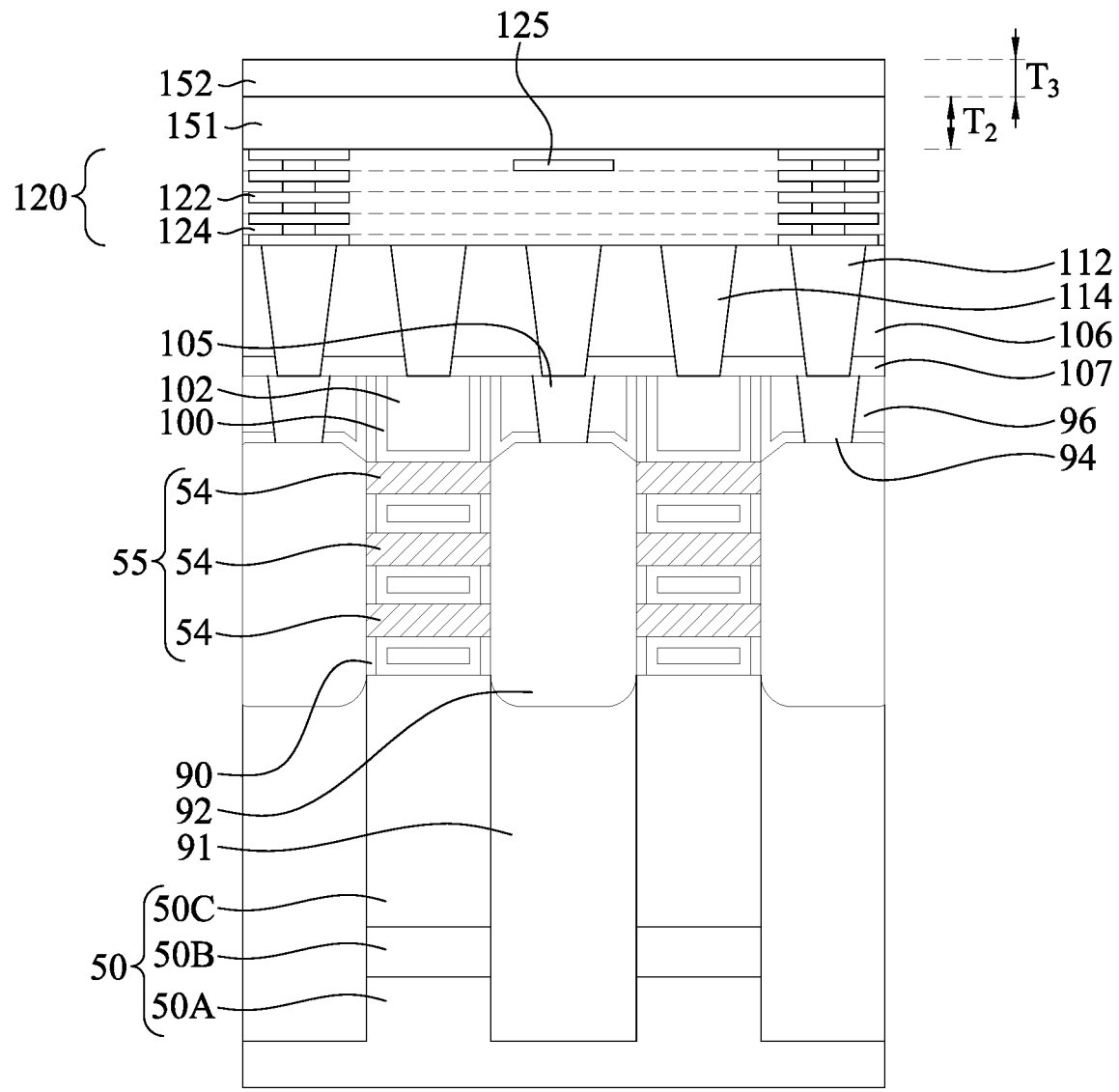

Reference is made to FIGS. 23A to 23C. A second dielectric layer 152 is formed over the first dielectric layer 151. In some embodiments the second dielectric layer 152 may include the same material as the first dielectric layer 151. In some embodiments, the second dielectric layer 152 may be formed of USG, silicon oxide (SiO$_x$), silicon dioxide (SiO$_2$), or other suitable materials. The second dielectric layer 152 may also be referred to as an oxide layer. In some embodiments, the second oxide layer 152 may be formed by a high density plasma (HDP) deposition process, such as plasma enhanced chemical vapor deposition (PECVD). Accordingly, the second oxide layer 152 may also be referred to as a HDP dielectric layer or a HDP oxide layer. In some embodiments, the first and second oxide layers 151 and 152 are made of a same oxide material using a same deposition process (e.g., HDP deposition). In some embodiments, the second oxide layer 152 has a thickness T3, in which the thickness T3 is in a range from about 1300 Å to about 1500 Å, such as 1400 Å for example. In some embodiments, the thickness T3 of the second oxide layer 152 may be lower than the thickness T2 of the first dielectric layer 151. In some embodiments, the thickness T3 of the second oxide layer 152 may be lower than the original thickness T1 of the first dielectric layer 151 prior to performing the first CMP process P1. The thickness T2 (or thickness T1) of the first dielectric layer 151 is greater than the thickness T3 of the second dielectric layer 152, so that the first dielectric layer 151 can provide sufficient buffer thickness under the first CMP process P1, such that the first dielectric layer 151 is flat enough and thick enough to act as a base layer of the bonding layer formed in later steps (e.g., the bonding layer 154 in FIGS. 24A to 24C).

Figure 24A:
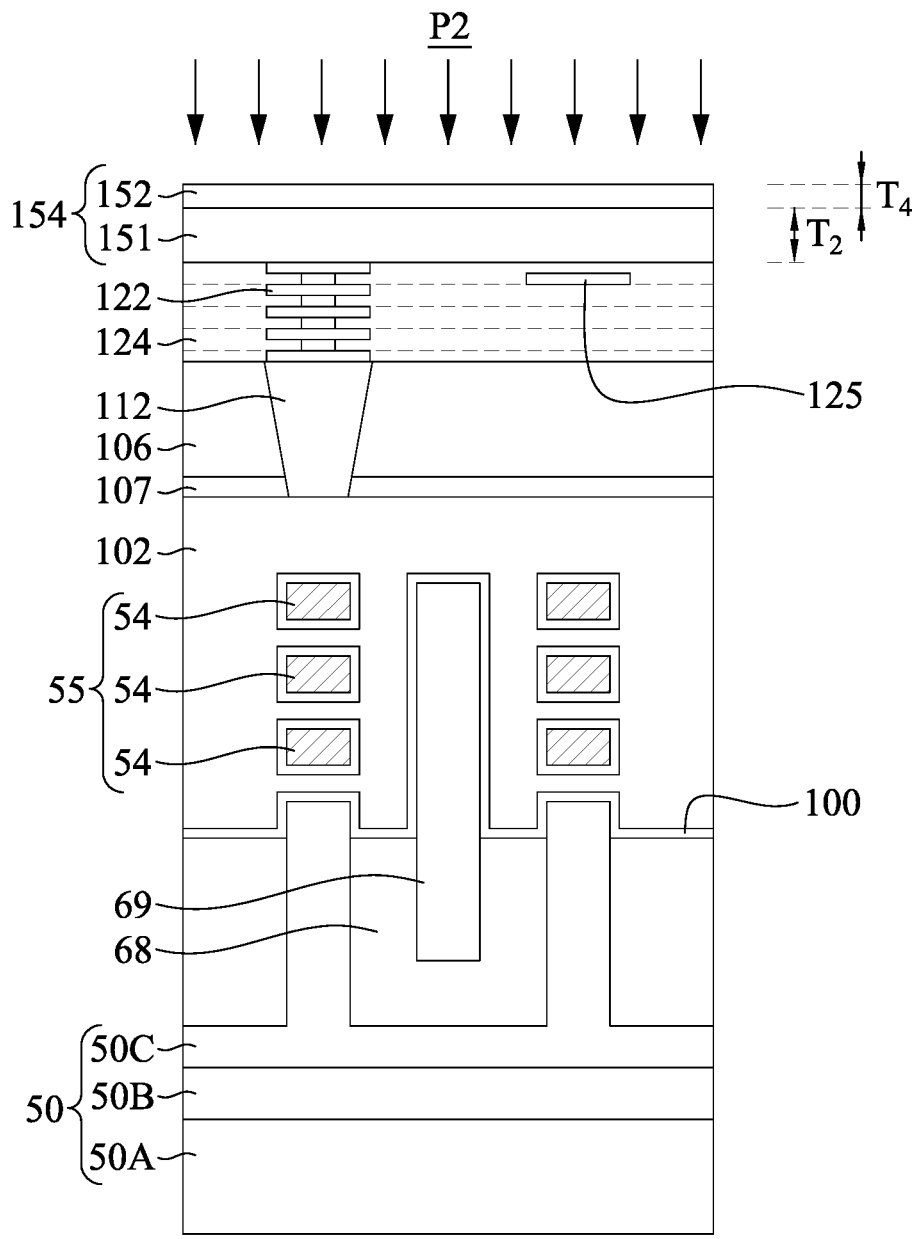
Figure 24B:
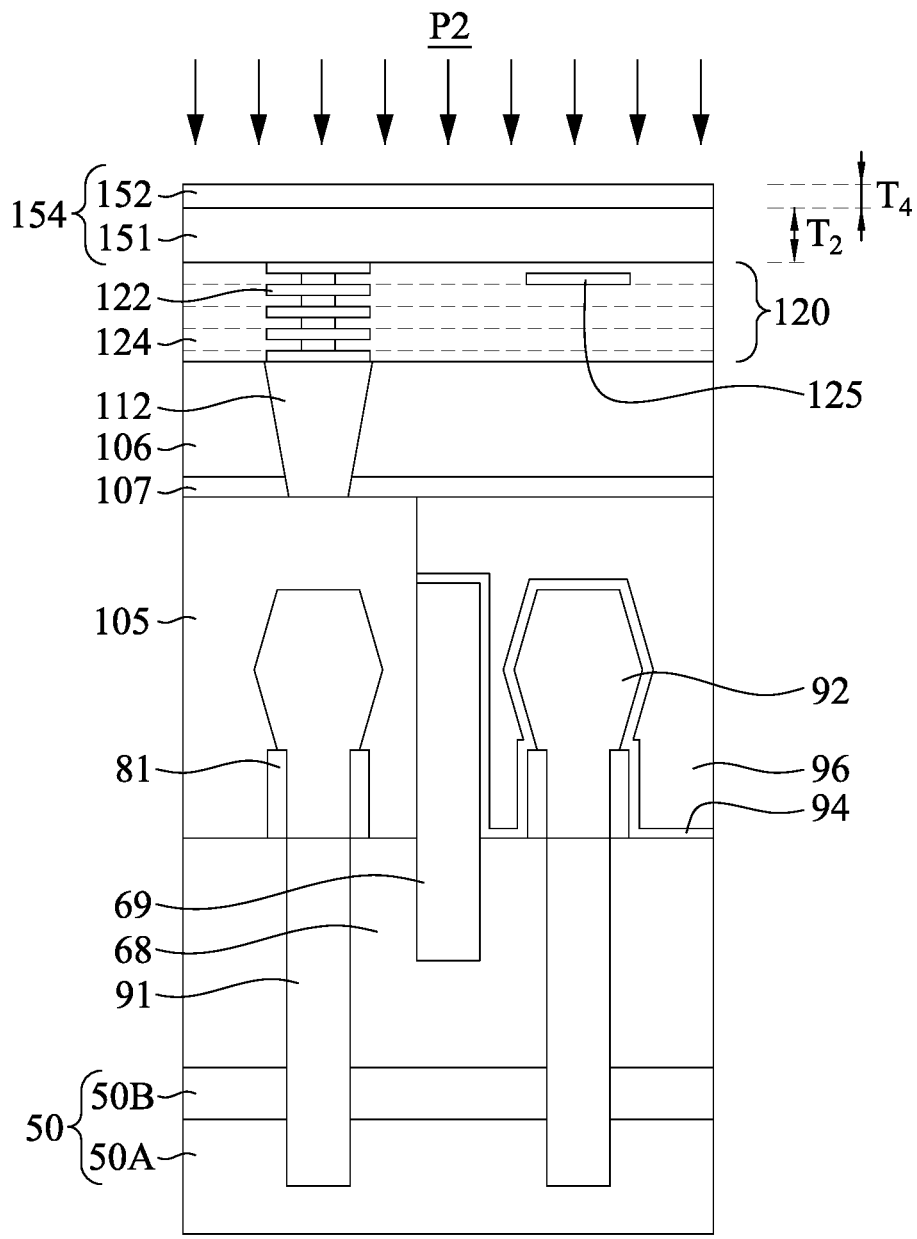
Figure 24C:
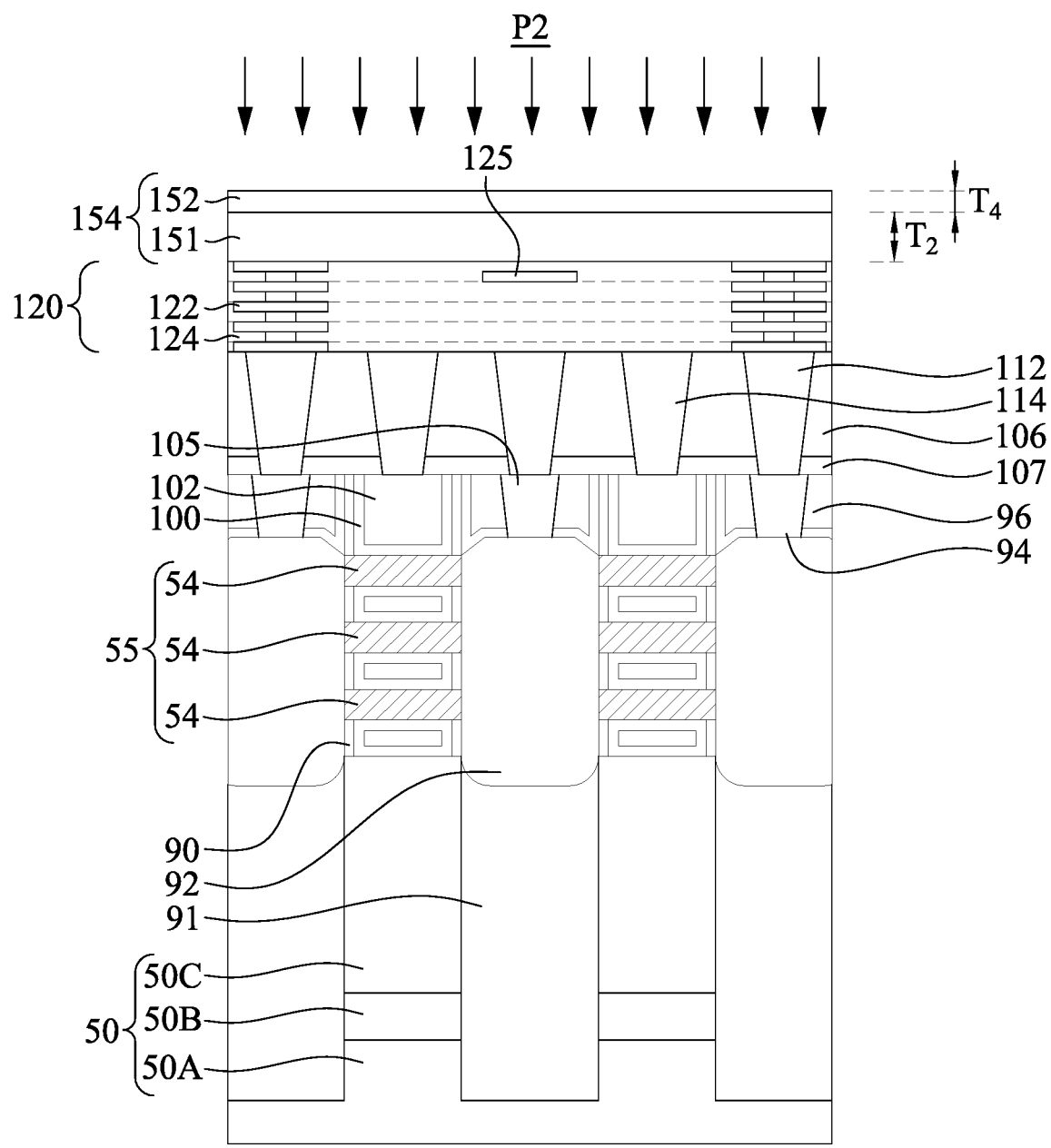

Reference is made to FIGS. 24A to 24C. A second chemical mechanical polishing (CMP) process P2 is performed to the second dielectric layer 152 to planarize the top surface of the second dielectric layer 152. In some embodiments, the second CMP process P2 also reduces the thickness of the second dielectric layer 152. Accordingly, after the second CMP process P2, the thickness T3 of the second dielectric layer 152 (see FIGS. 23A to 23C) is reduced to a thickness T4 lower than the thickness T3. In some embodiments, the thickness T4 is in a range from about 900 Å to about 1100 Å, such as 1000 Å for example. After the second CMP process P2, the first dielectric layer 151 and the second dielectric layer 152 has a total thickness T5, in which the total thickness T5 is a sum of the thickness T2 and the thickness T4. In some embodiments, the total thickness T5 is in a range from about 4500 Å to about 5500 Å, such as 5000 Å for example. In some embodiments, the ratio of the original thickness T1 of the first dielectric layer 151 to the original thickness T3 of the second dielectric layer 152 is in a range from about 3.5 to about 4.5. If the ratio is too large (e.g., larger than about 4.5), a lengthy deposition time may be required for depositing the first dielectric layer 151, or the second dielectric layer 152 may provide insufficient thickness for the second CMP process P2. If the ratio is too small (e.g., smaller than about 3.5), the first dielectric layer 151 may provide insufficient buffer thickness for the first CMP process P1, or a lengthy deposition time may be required for the second dielectric layer 152.

After the second CMP process P2, the first dielectric layer 151 and the second dielectric layer 152 can be collectively referred to as a composite dielectric layer 154, which is a bi-layer film stack of two HDP oxide layers. In some embodiments, within the bi-layer film stack, an observable interface may exist between the HDP oxide layers, even if they are made of a same oxide material. This is because deposition of the upper HDP oxide layer 152 is performed after performing a CMP process on the lower HDP oxide layer 151. In some embodiments, the composite dielectric layer 154 may also be referred to as a bonding layer 154 that serves to bond the device wafer 50 to a carrier wafer in subsequent processing.

In some embodiments of the present disclosure, a first planarization process (e.g., the first CMP process P1) is performed to the first dielectric layer 151 to improve the flatness of the first dielectric layer 151. Thus, the second dielectric layer 152 can be deposited over a flat surface of the first dielectric layer 151. Afterwards, a second planarization process (e.g., the second CMP process P2) is performed to the second dielectric layer 152 to improve the flatness of the second dielectric layer 152. In some embodiments, the first dielectric layer 151 is thicker than the second dielectric layer 152, such that the first dielectric layer 151 can provide sufficient buffer thickness under the first planarization process (e.g., the first CMP process P1), such that the first dielectric layer 151 is flat enough and thick enough to act as a base layer of the bonding layer 154. Furthermore, the second planarization process (e.g., the second CMP process P2) is performed to the second dielectric layer 152 to fine tune local flatness. As a result, the overall flatness of the composite dielectric layer 154 may be improved, which in turn will improve the bonding process in later steps (e.g., the processes discussed in FIGS. 26A to 26C).

Figure 25A:
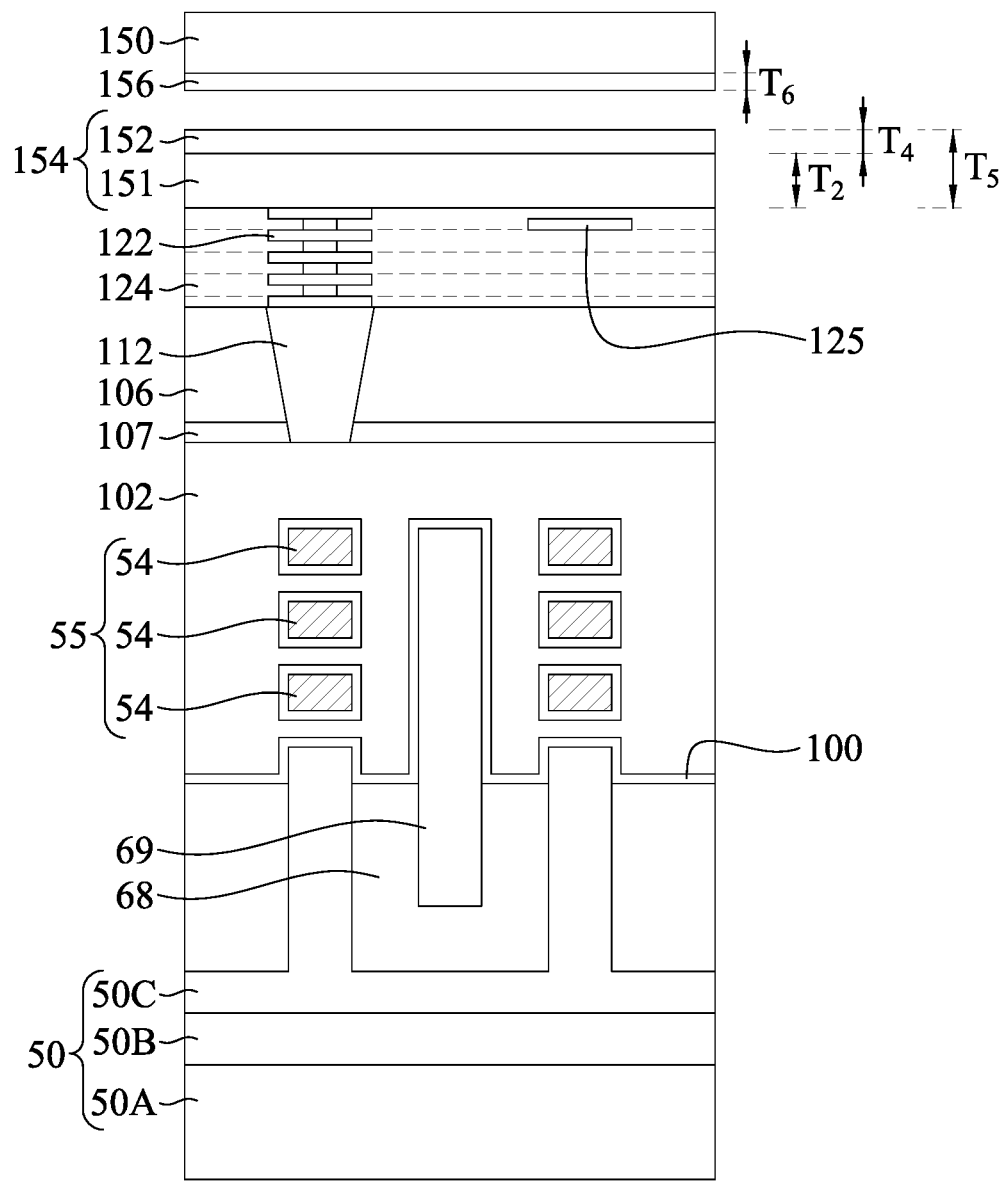
Figure 25B:
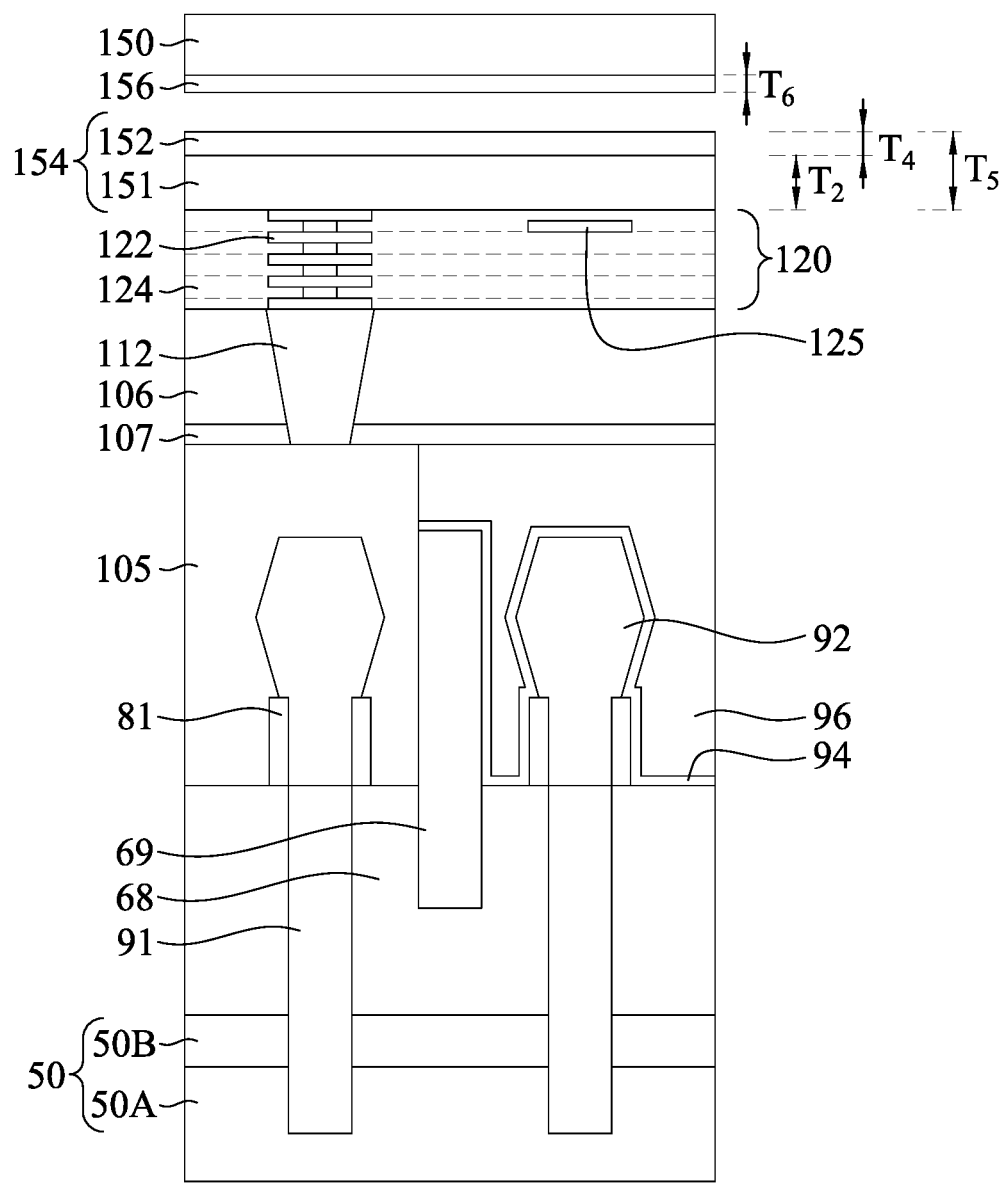
Figure 25C:
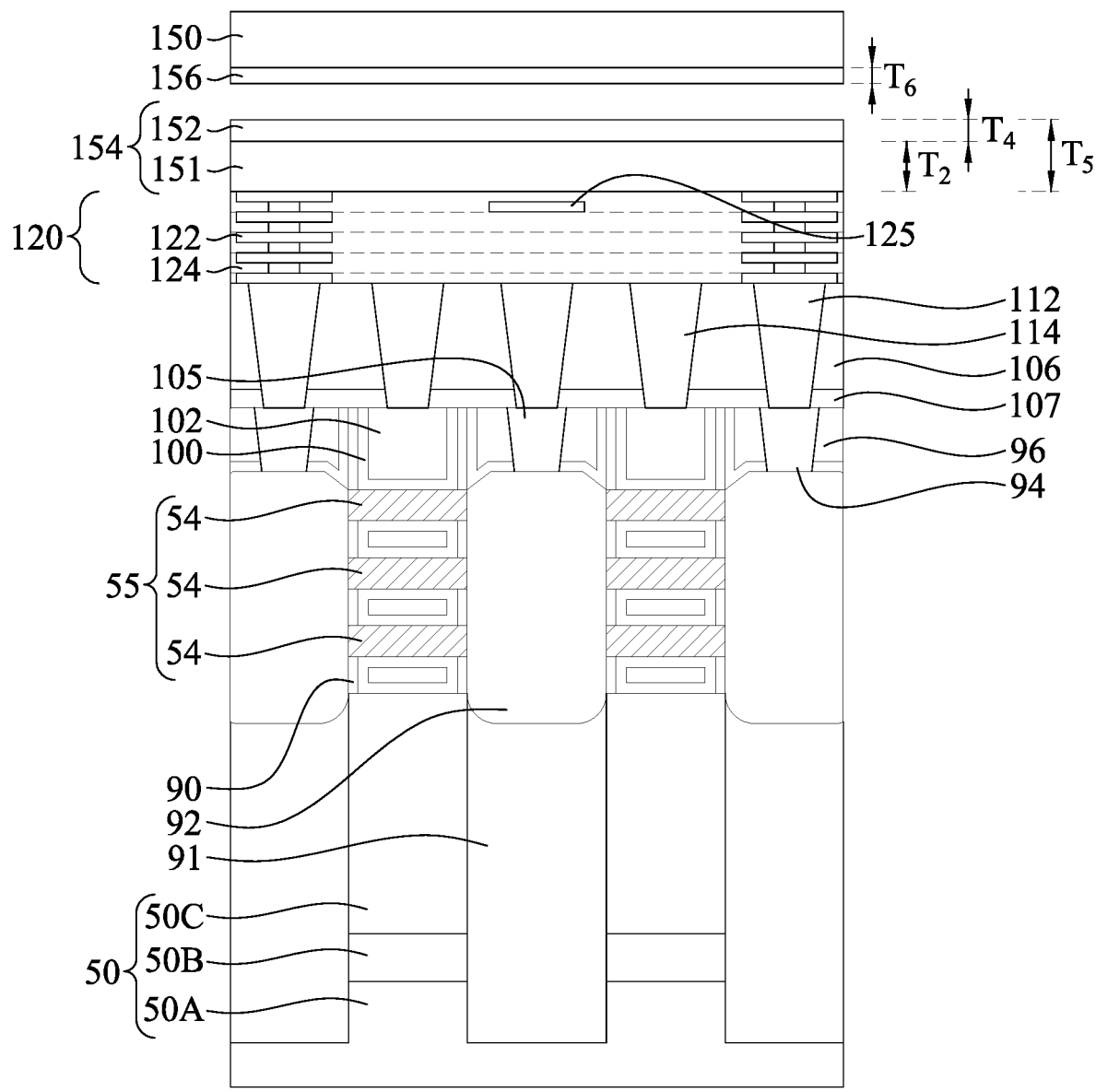

Reference is made to FIGS. 25A to 25C. A carrier substrate 150 is prepared. In some embodiments, the carrier substrate 150 may be a glass carrier substrate, a ceramic carrier substrate, a semiconductor substrate (e.g., a silicon substrate), a wafer (e.g., a silicon wafer), or the like. The carrier substrate 150 may provide structural support during subsequent processing steps and in the completed device. The carrier substrate 150 is substantially free of any active or passive devices. In some embodiments, the carrier substrate 150 can also be referred to as a supporting substrate.

A dielectric layer 156 is formed on over the carrier substrate 150. In some embodiments, the dielectric layer 156 may include the same material as the first dielectric layer 151 and the second dielectric layer 152. In some embodiments, the dielectric layer 156 may be formed of USG, silicon oxide ($SiO_x$), silicon dioxide ($SiO_2$), or other suitable materials. The dielectric layer 156 may also be referred to as an oxide layer. In some embodiments, the dielectric layer 156 may be formed by a high density plasma (HDP) deposition process, such as plasma enhanced chemical vapor deposition (PECVD). Accordingly, the dielectric layer 156 may also be referred to as a HDP dielectric layer or a HDP oxide layer. In some embodiments, the dielectric layer 156 has a thickness T6, in which the thickness T6 is in a range from about 300 Å to about 400 Å, such as 350 Å for example. In some embodiments, the thickness T6 of the dielectric layer 156 may be lower than the thickness T2 of the first dielectric layer 151 and the thickness T4 of the second dielectric layer 152, and may be lower than the thickness T5 of the composite dielectric layer 154. In some embodiments, the dielectric layer 156 may also be referred to as a bonding layer.

Figure 26A:
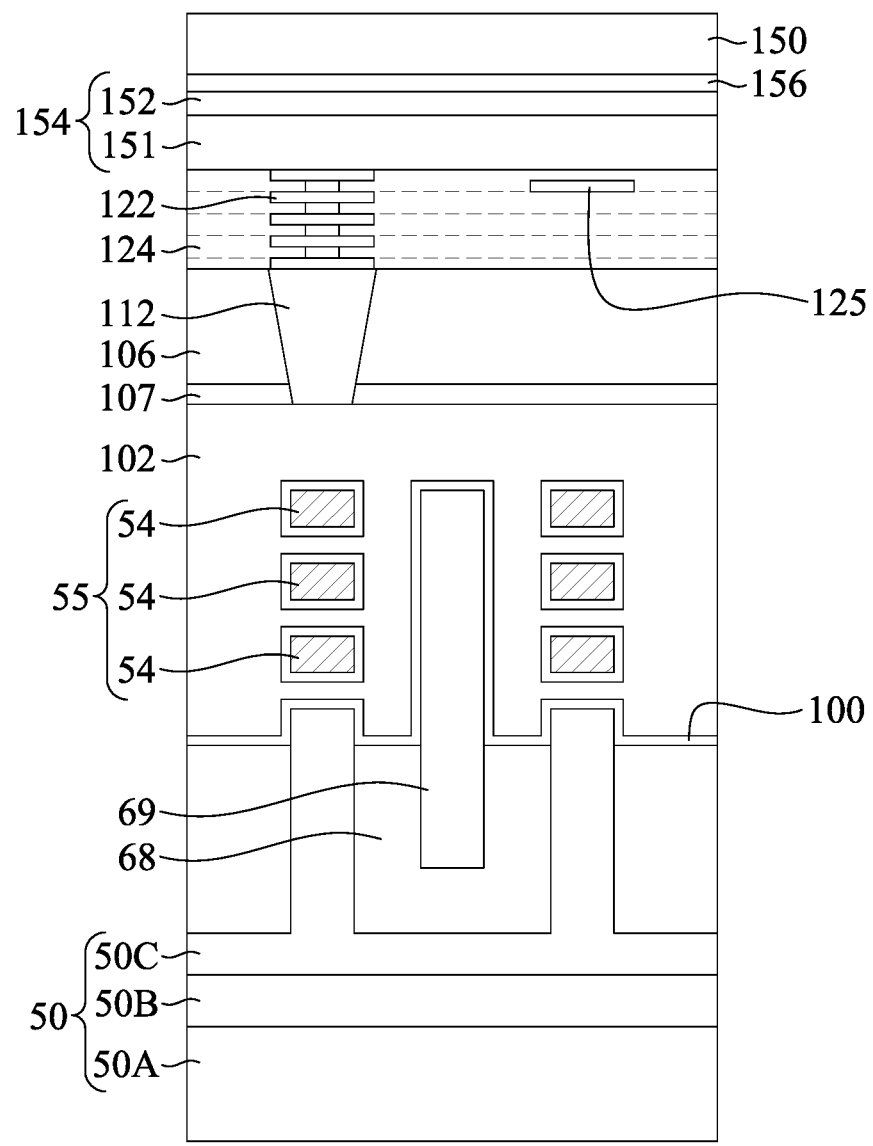
Figure 26B:
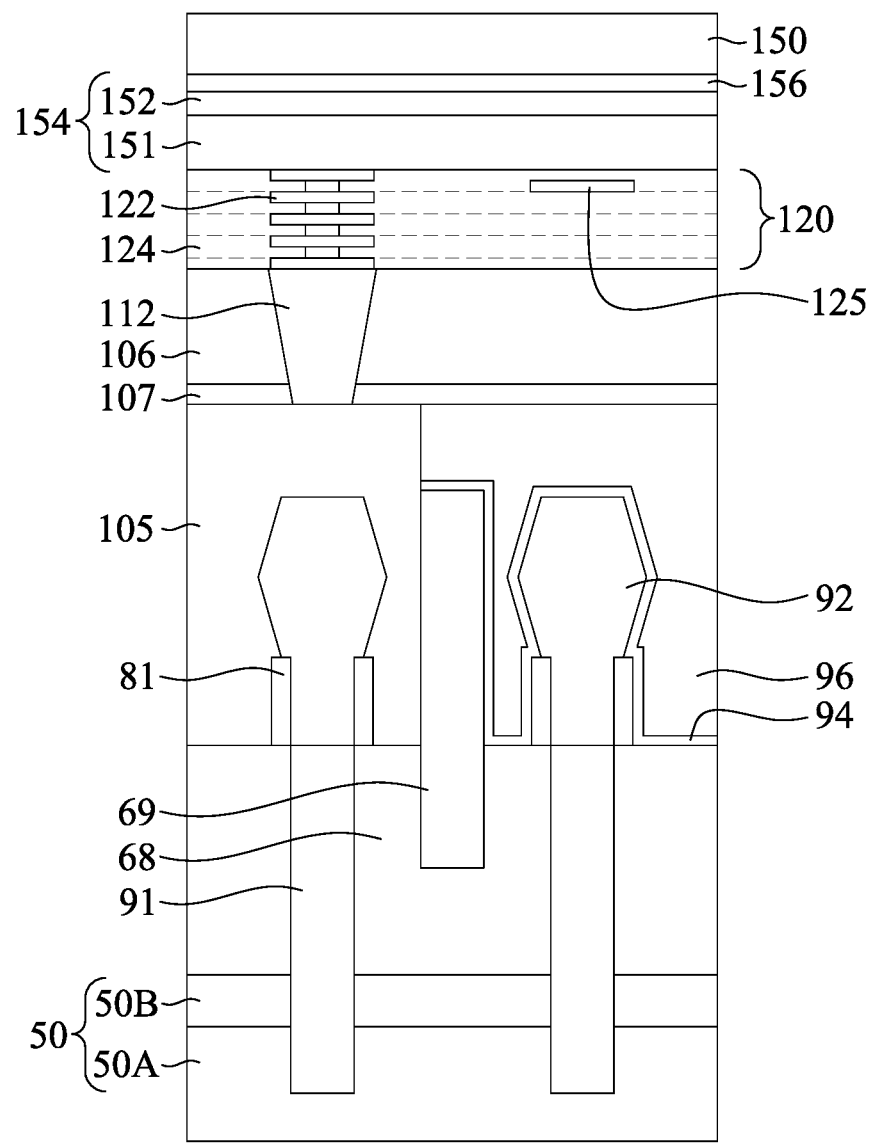
Figure 26C:
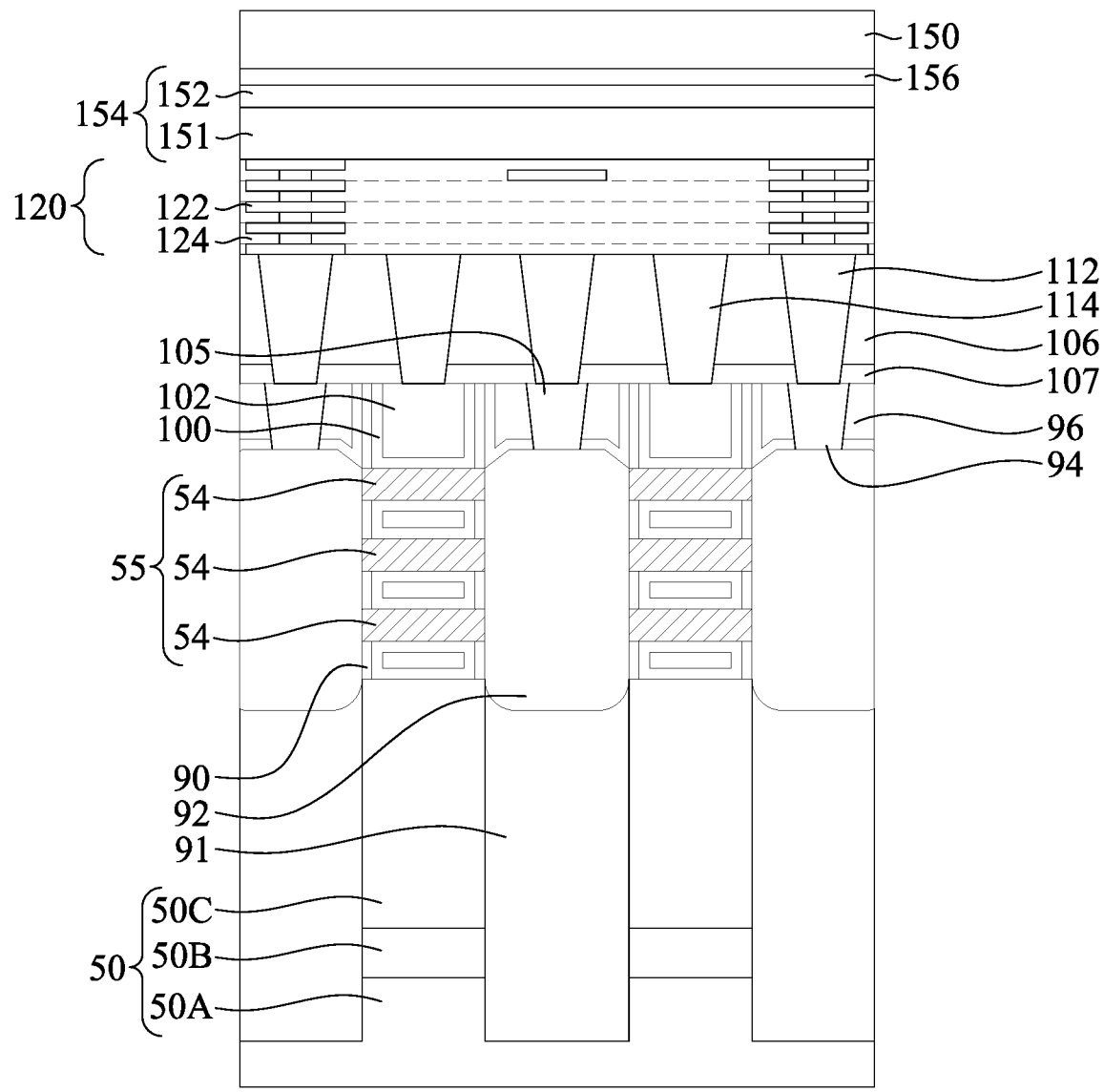

Reference is made to FIGS. 26A to 26C. The carrier substrate 150 is bonded to the composite dielectric layer 154 via the dielectric layer 156. Stated another way, the carrier substrate 150 is bonded to the interconnect structure 120 via the composite dielectric layer 154 and the dielectric layer 156. In various embodiments, the carrier substrate 150 may be bonded to the interconnect structure 120 using a suitable technique. In some embodiments, the bonding process may further include applying surface treatments to the surfaces of the composite dielectric layer 154 and the dielectric layer 156, respectively. The surface treatment may include a plasma treatment. The plasma treatment may be performed in a vacuum environment. After the plasma treatment, the surface treatment may further include a cleaning process (e.g., a rinse with deionized water, or the like) that may be applied to the composite dielectric layer 154 and the dielectric layer 156. The carrier substrate 150 is then aligned with the interconnect structure 120, and the composite dielectric layer 154 and the dielectric layer 156 are pressed against each other to initiate a pre-bonding of the carrier substrate 150 to the interconnect structure 120. The pre-bonding may be performed at room temperature (between about 21° C. and about 25° C.). After the pre-bonding, an annealing process may be applied to the composite dielectric layer 154 and the dielectric layer 156 that have already been pressed against each other by for example, heating the interconnect structure 120 and the carrier substrate 150 to a temperature of about 200° ° C. to about 400° C., such as 300° C. for example. The annealing process may be performed for time duration from about 2.5 hours to about 3.5 hours, such as 3 hours for example. The annealing process results in an increased bonding force between the composite dielectric layer 154 and the dielectric layer 156, such that even if the composite dielectric layer 154 and the dielectric layer 156 is no longer subjected to the pressing force, they will not delaminate or peel from each other. In some embodiments the composite dielectric layer 154 and the dielectric layer 156 can be collectively referred to as a bonding layer between the carrier substrate 150 and the interconnect structure 120. In some embodiments, the composite dielectric layer 154 and the dielectric layer 156 may be free of a metal material in the interconnect structure 120, such as the conductive features 122 (e.g., conductive lines or conductive vias) in the interconnect structure 120.

Figure 27A:
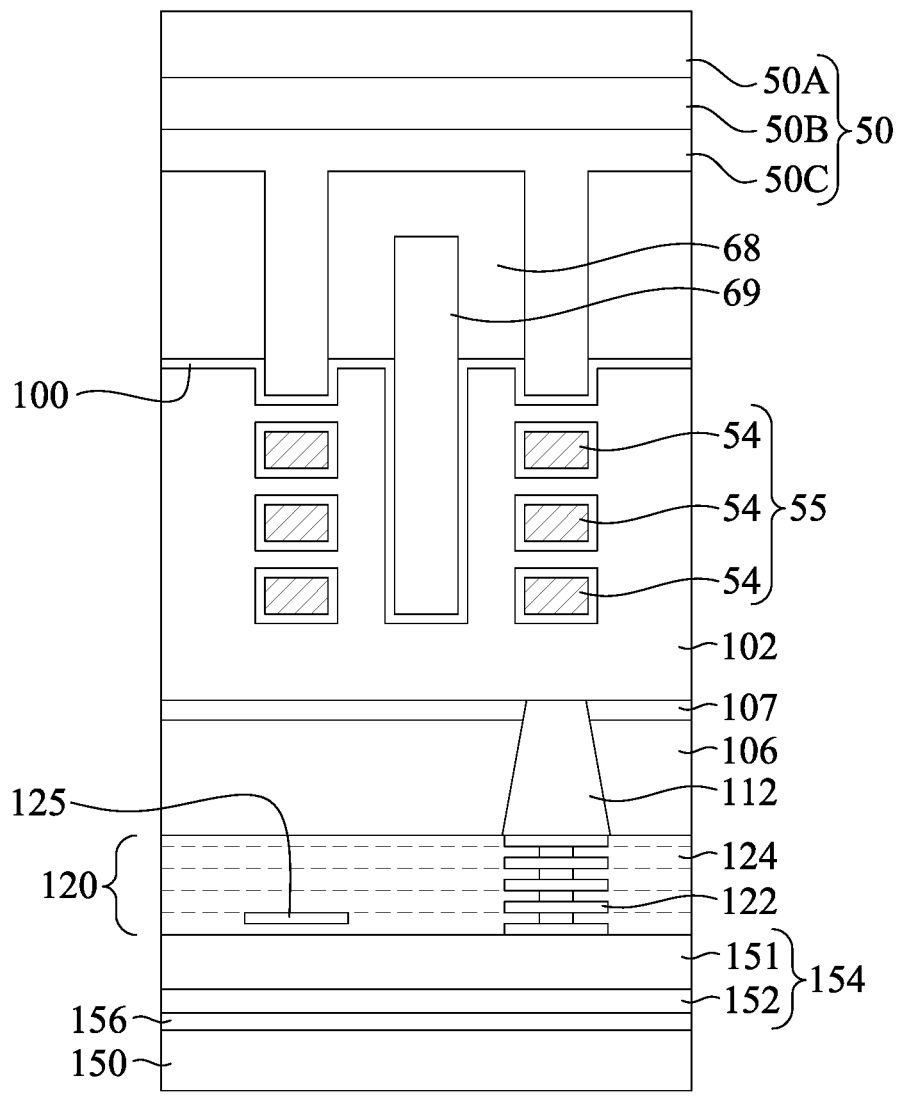
Figure 27B:
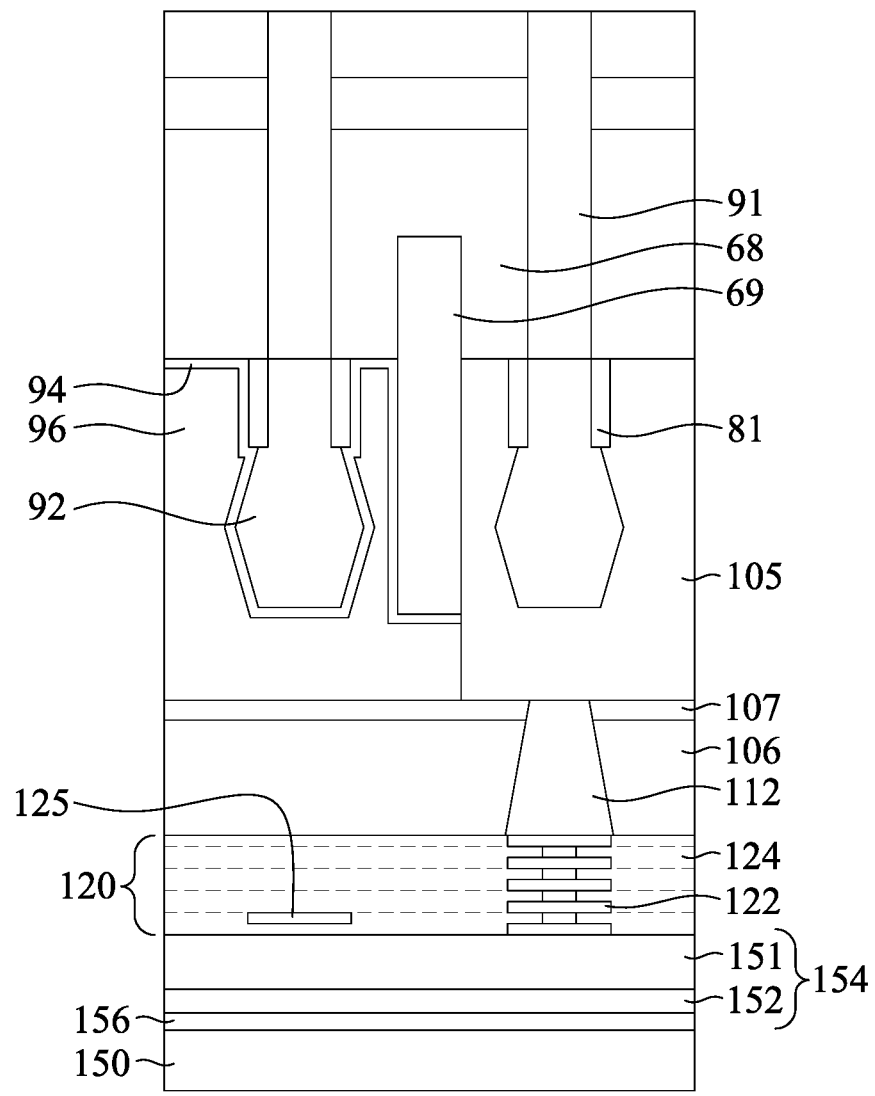
Figure 27C:
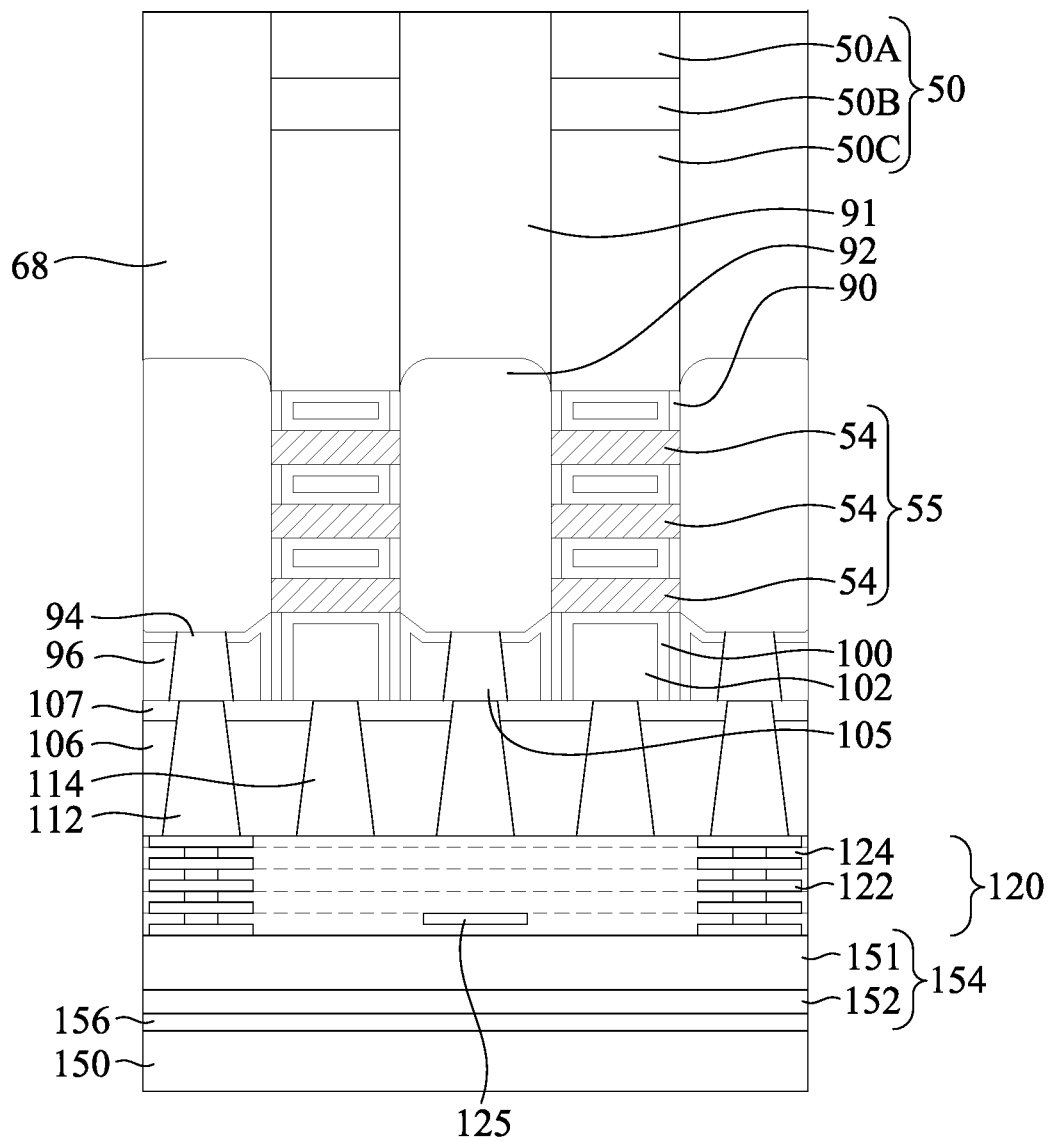

Reference is made to FIGS. 27A to 27C. After the carrier substrate 150 is bonded to the interconnect structure 120, the device may be flipped such that a backside of the substrate 50 faces upwards. The backside of the substrate 50 may refer to a side opposite to the front-side of the substrate 50 on which the device layer (e.g., layer including a transistor) is formed. Next, a CMP process is performed on the backside of the substrate 50. In some embodiments, the CMP process is controlled to remove the bulk silicon layer 50A of the substrate 50 until the epitaxial plugs 91 are exposed.

Figure 28A:
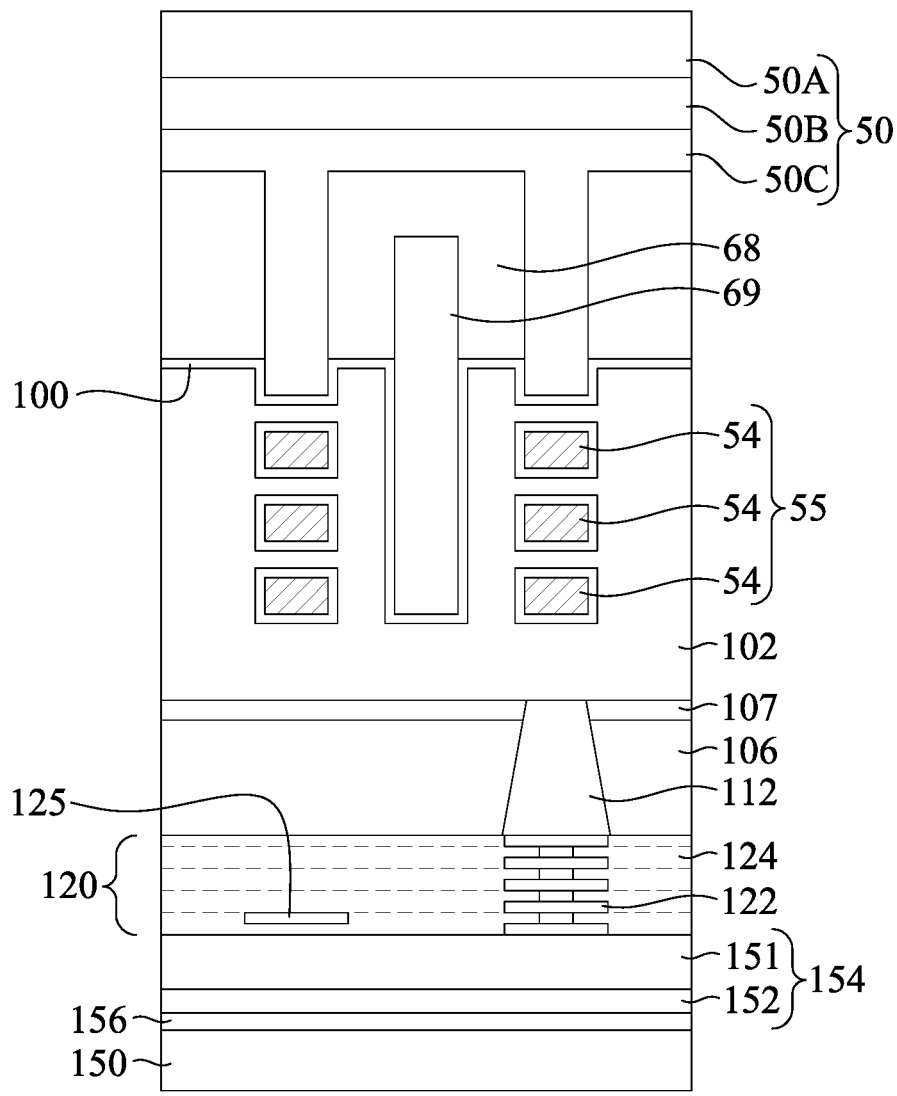
Figure 28B:
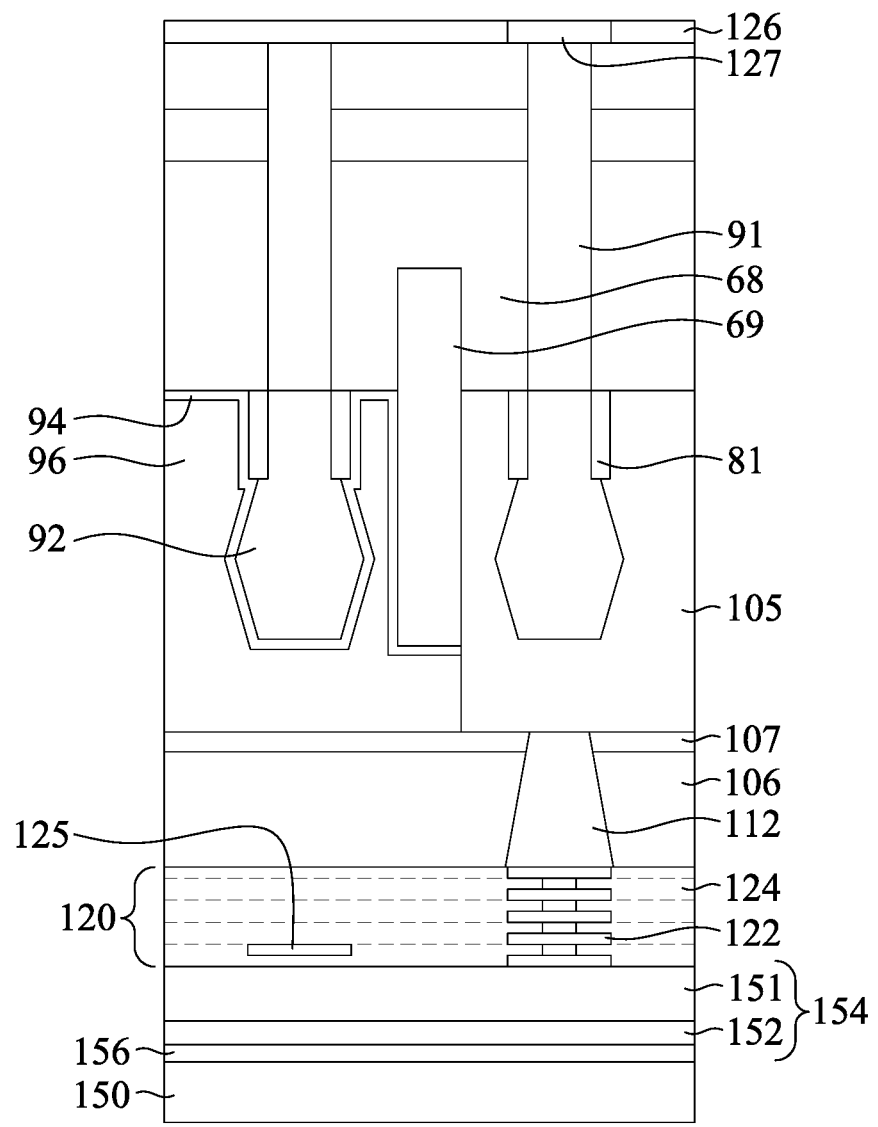
Figure 28C:
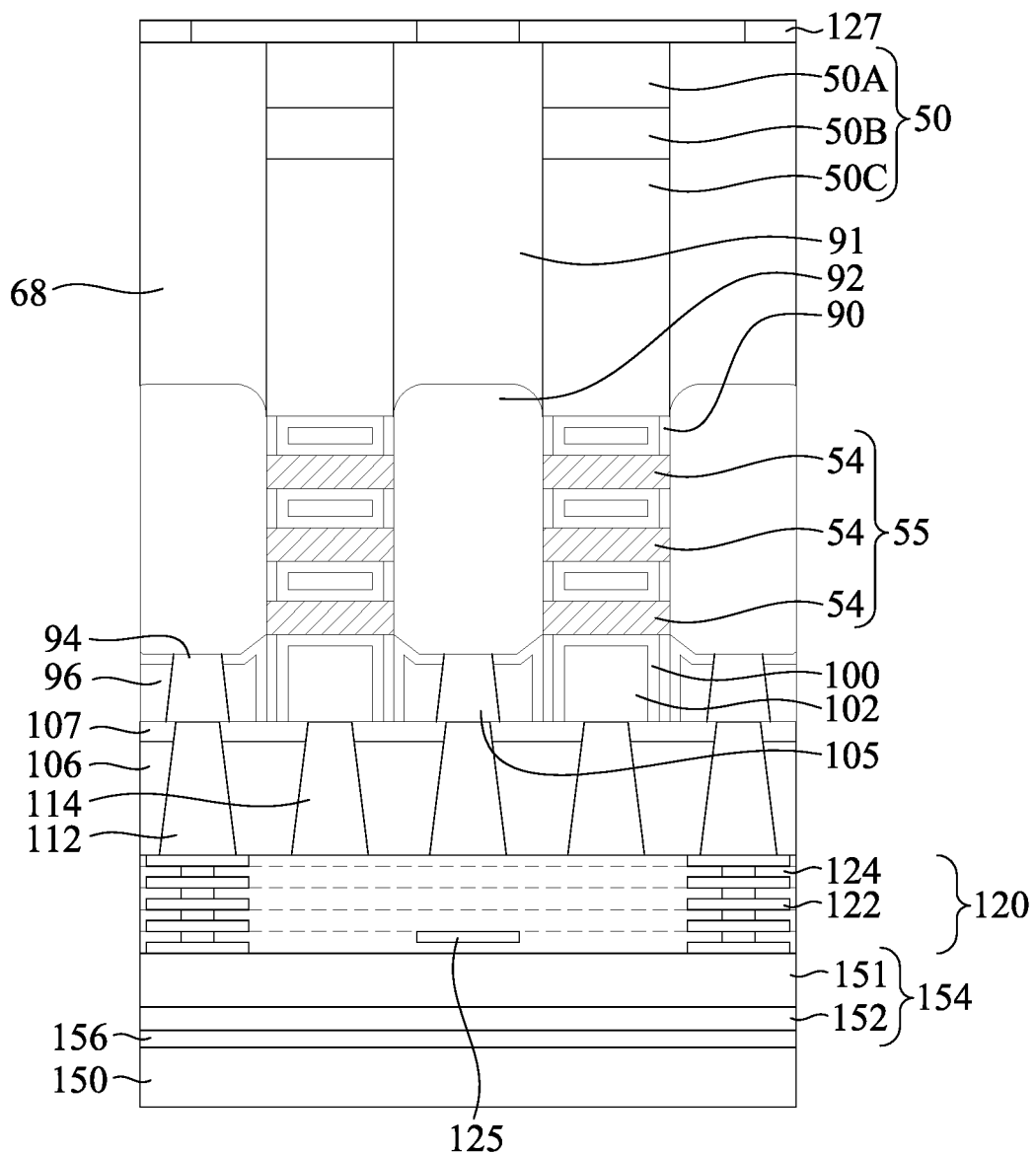

Reference is made to FIGS. 28A to 28C. A dielectric layer 126 is deposited on the bulk silicon layer 50A of the substrate 50, and conductive pads 127 are formed in the dielectric layer 126 and are in contact with the epitaxial plugs 91. In some embodiments, the dielectric layer 126 may be formed by depositing a dielectric material over the oxide layer 50B, and optionally performing a CMP process to thin down the dielectric material. The conductive pads 127 may be formed by, for example, patterning the dielectric layer 126 to form openings, depositing a conductive material in the openings, and then performing a CMP process to remove excess conductive material until the top surface of the dielectric layer 126 is exposed. In some embodiments, the dielectric layer 126 may include phospho-silicate glass (PSG), boro-silicate glass (BSG), boron-doped phospho-silicate glass (BPSG), undoped silicate glass (USG), or the like. In some embodiments, the conductive pads 127 may include copper, silver, gold, tungsten, aluminum, combinations thereof, or the like.

Figure 29A:
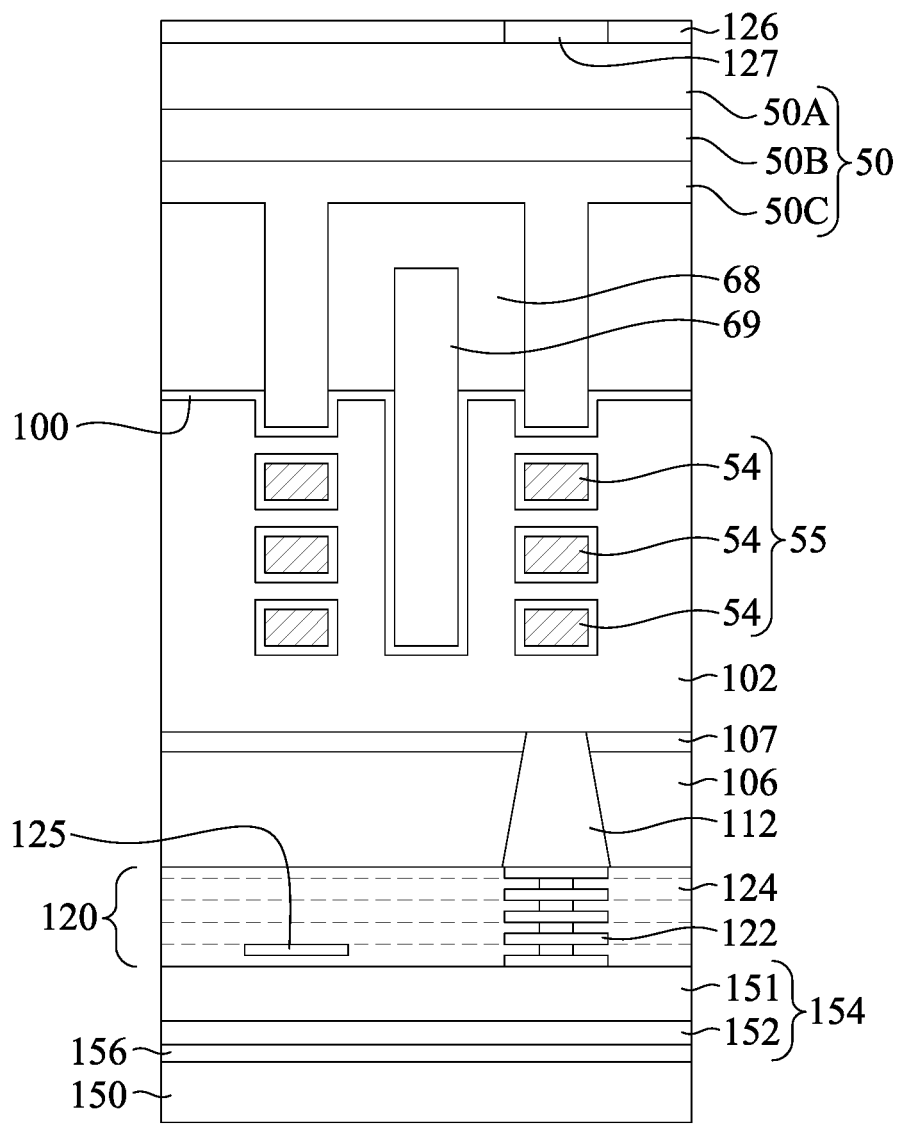
Figure 29B:
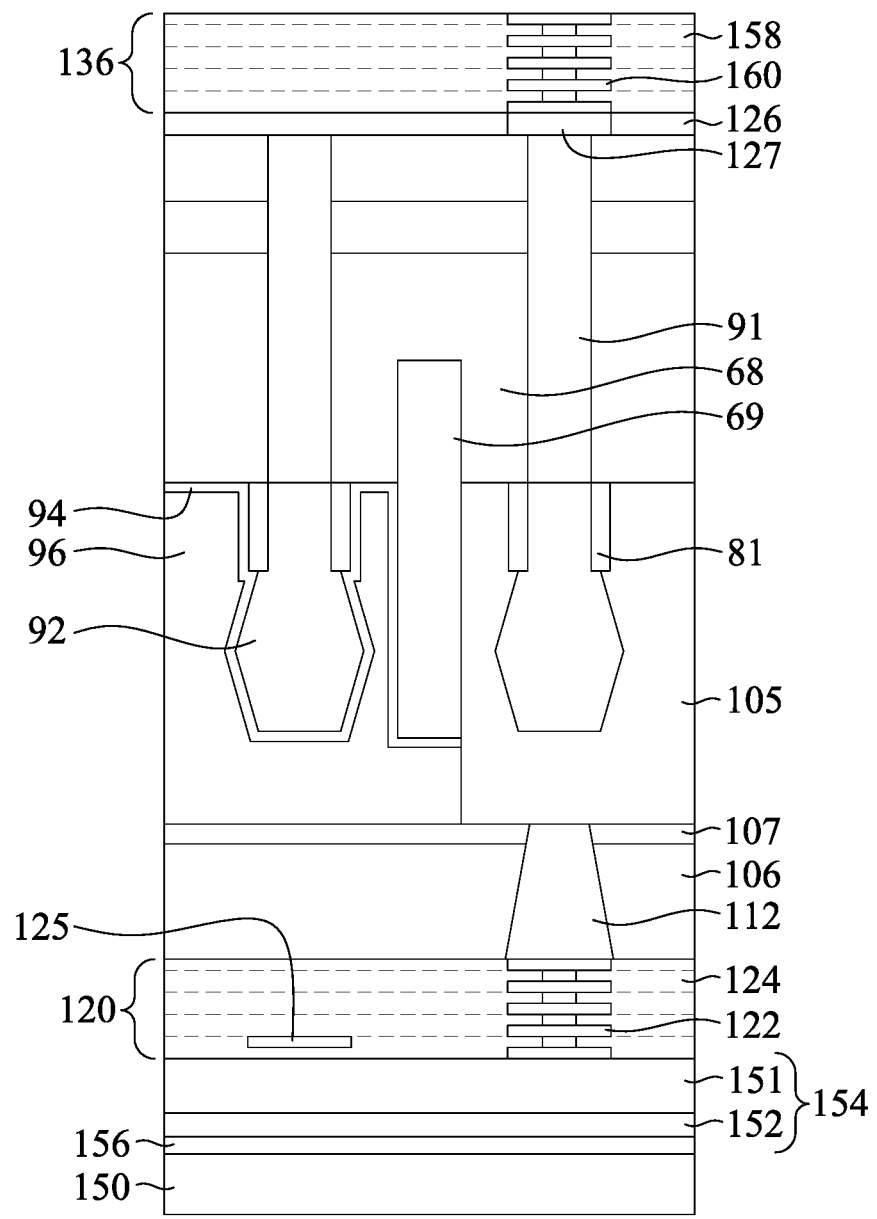
Figure 29C:
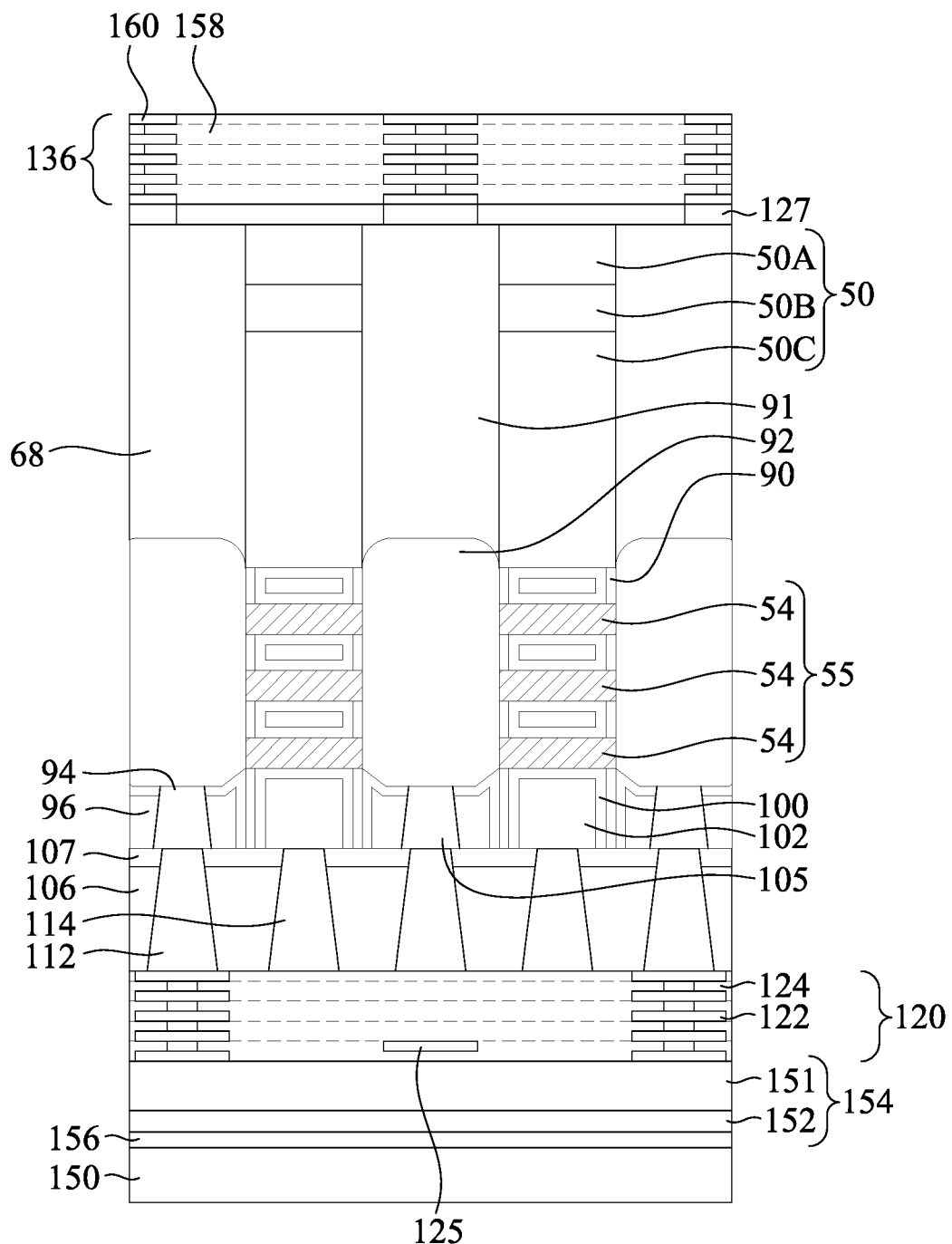

Reference is made to FIGS. 29A to 29C. An interconnect structure 136 is formed over the dielectric layer 126. The interconnect structure 136 may also be referred to as a back-side interconnect structure because it is formed on a back-side of the substrate 50. In some embodiments, the interconnect structure 136 may include one or more layers of conductive features 160 formed in one or more stacked dielectric layers 158. The conductive features 160 and the dielectric layers 158 may be similar to the conductive features 122 and the dielectric layers 124 of the interconnect structure 120, and thus relevant details will not be repeated for simplicity.

Figure 30A:
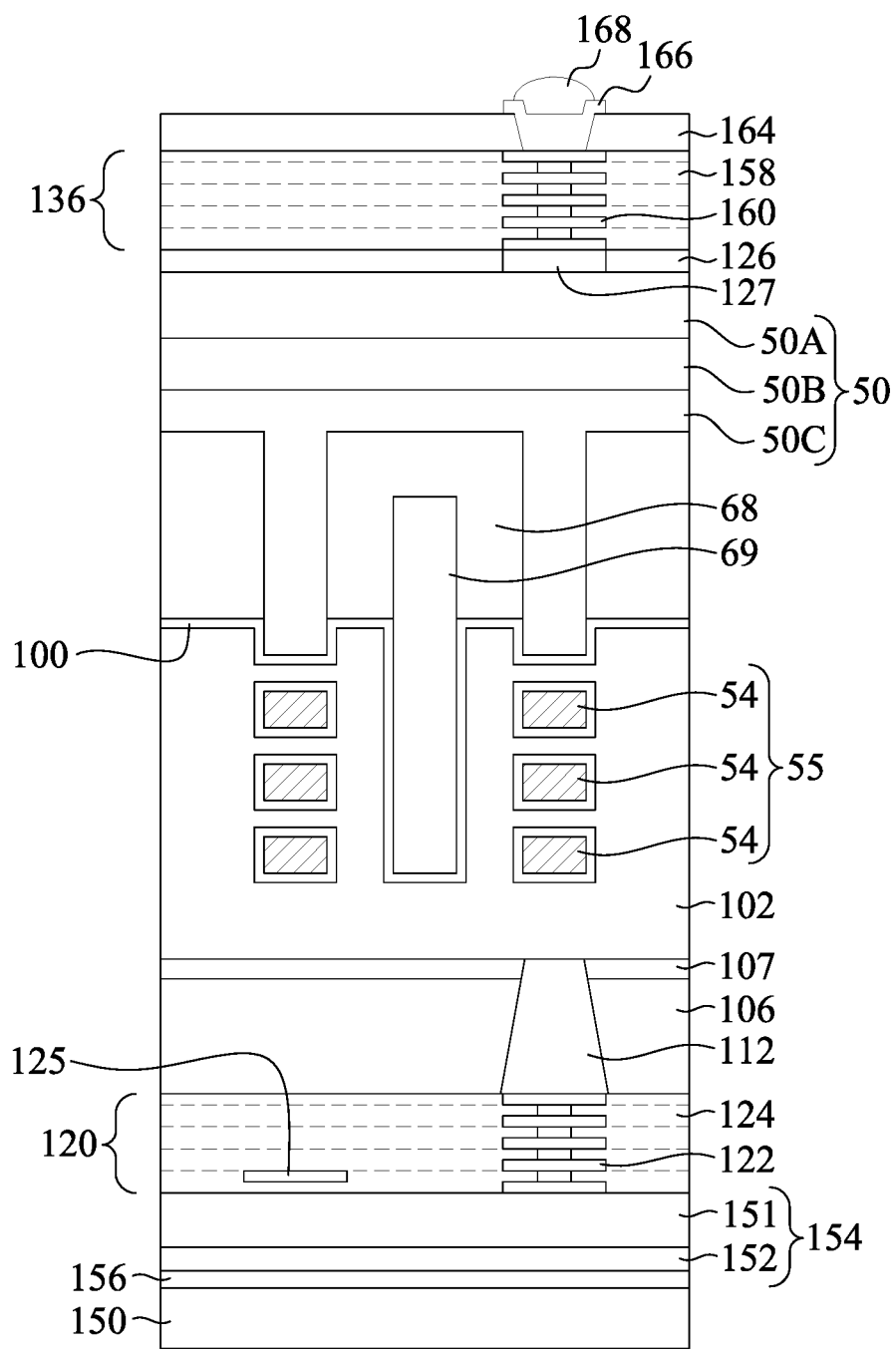
Figure 30B:
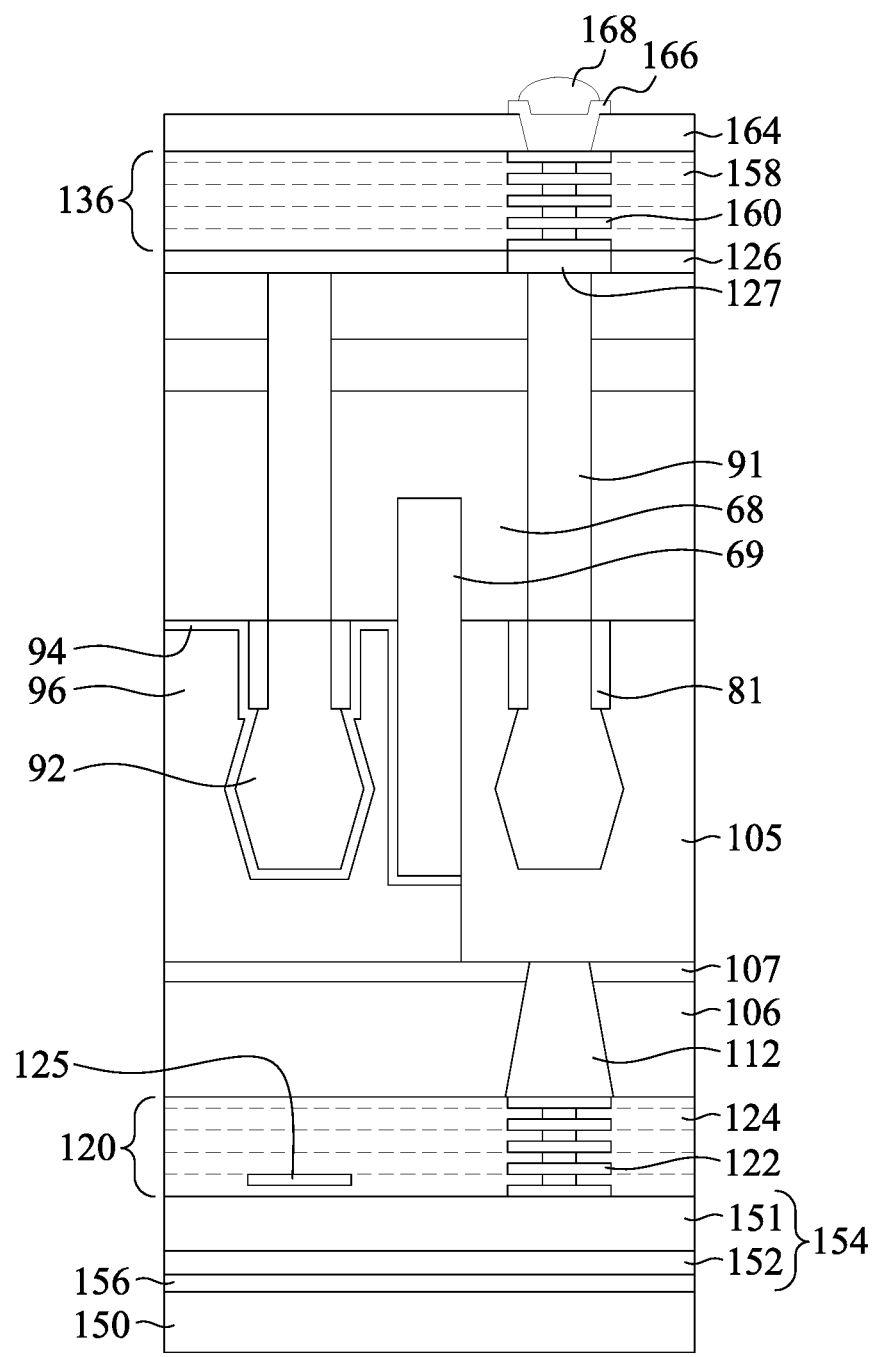
Figure 30C:
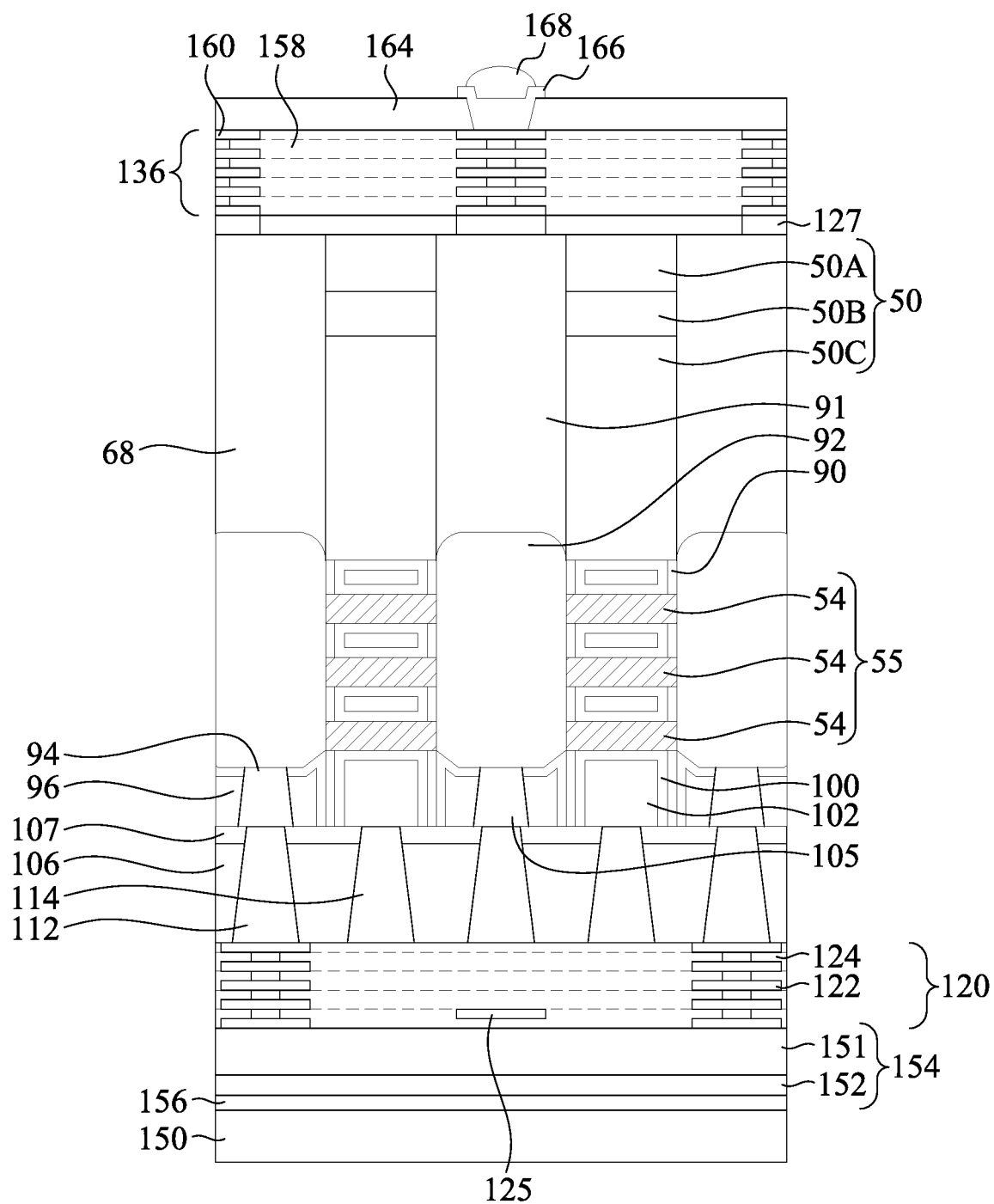

Reference is made to FIGS. 30A to 30C. A passivation layer 164, UBMs 166, and external connectors 168 are formed over the interconnect structure 136. The passivation layer 164 may include polymers such as PBO, polyimide, BCB, or the like. Alternatively, passivation layer 164 may include non-organic dielectric materials such as silicon oxide, silicon nitride, silicon carbide, silicon oxynitride, or the like. The passivation layer 164 may be deposited by, for example, CVD, PVD, ALD, or the like.

UBMs 166 are formed through the passivation layer 164 to the conductive features 160 in the interconnect structure 136, and external connectors 168 are formed on the UBMs 166. The UBMs 166 may comprise one or more layers of copper, nickel, gold, or the like, which are formed by a plating process, or the like. External connectors 168 (e.g., solder balls) are formed on the UBMs 166. The formation of external connectors 168 may include placing solder balls on the exposed portions of UBMs 166 and then reflowing the solder balls. In alternative embodiments, the formation of external connectors 168 includes performing a plating step to form solder regions over the topmost conductive feature 140 and then reflowing the solder regions. The UBMs 166 and the external connectors 168 may be used to provide input/output connections to other electrical components, such as, other device dies, redistribution structures, printed circuit boards (PCBs), motherboards, or the like. The UBMs 166 and the external connectors 168 may also be referred to as backside input/output pads that may provide signal, supply voltage, and/or ground connections to the nano-FETs described above.

Figure 31A:
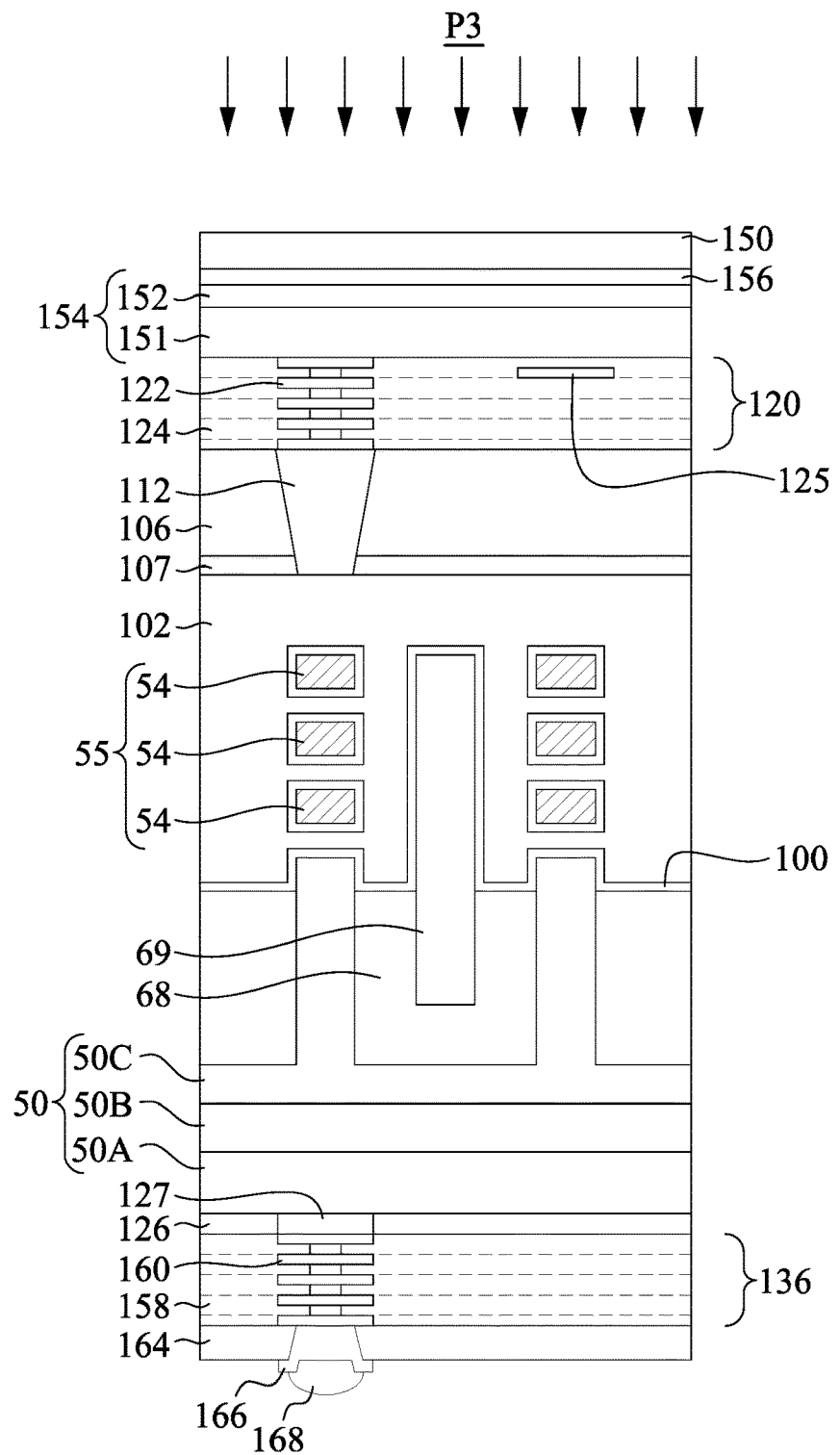
Figure 31B:
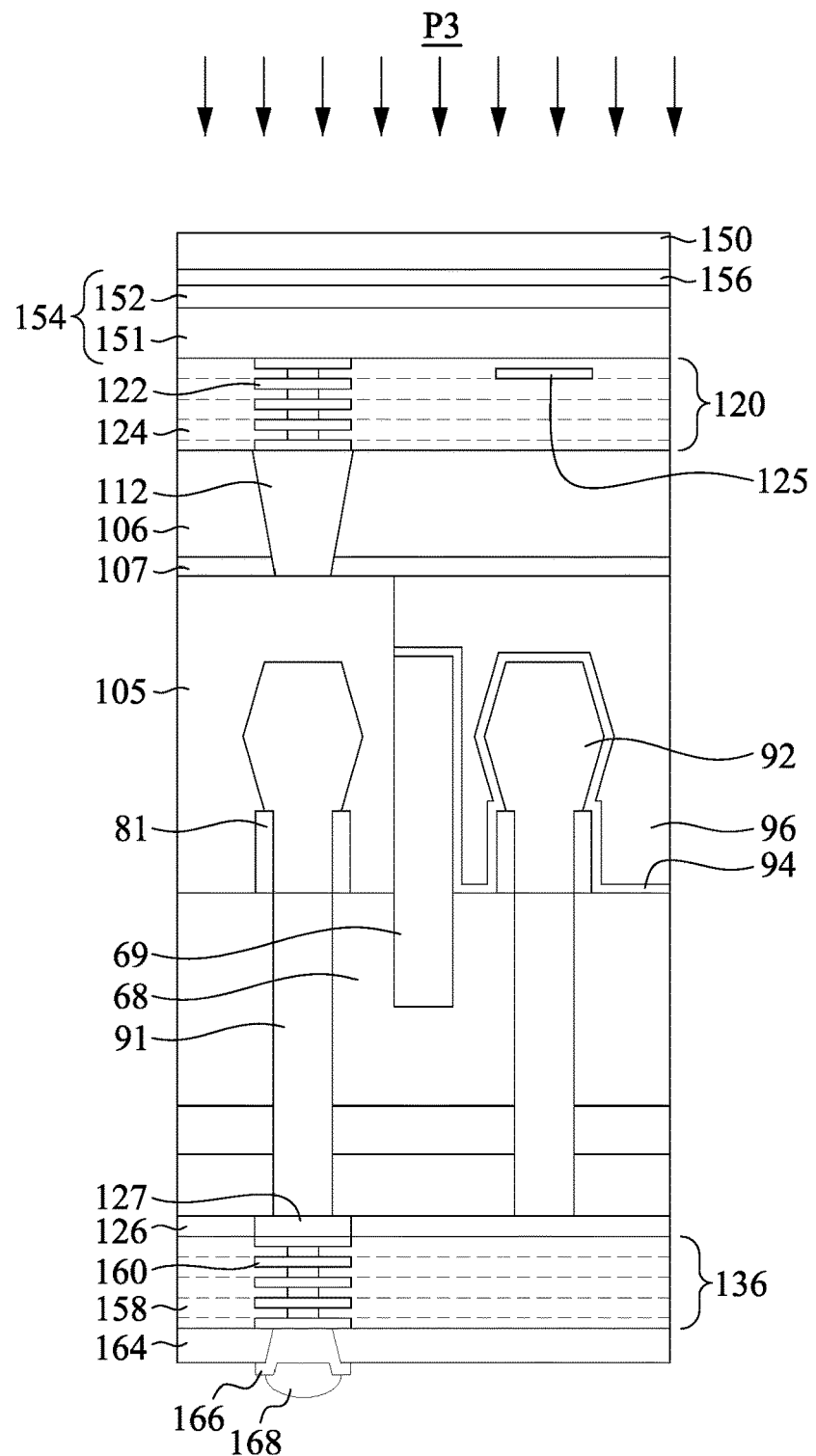
Figure 31C:
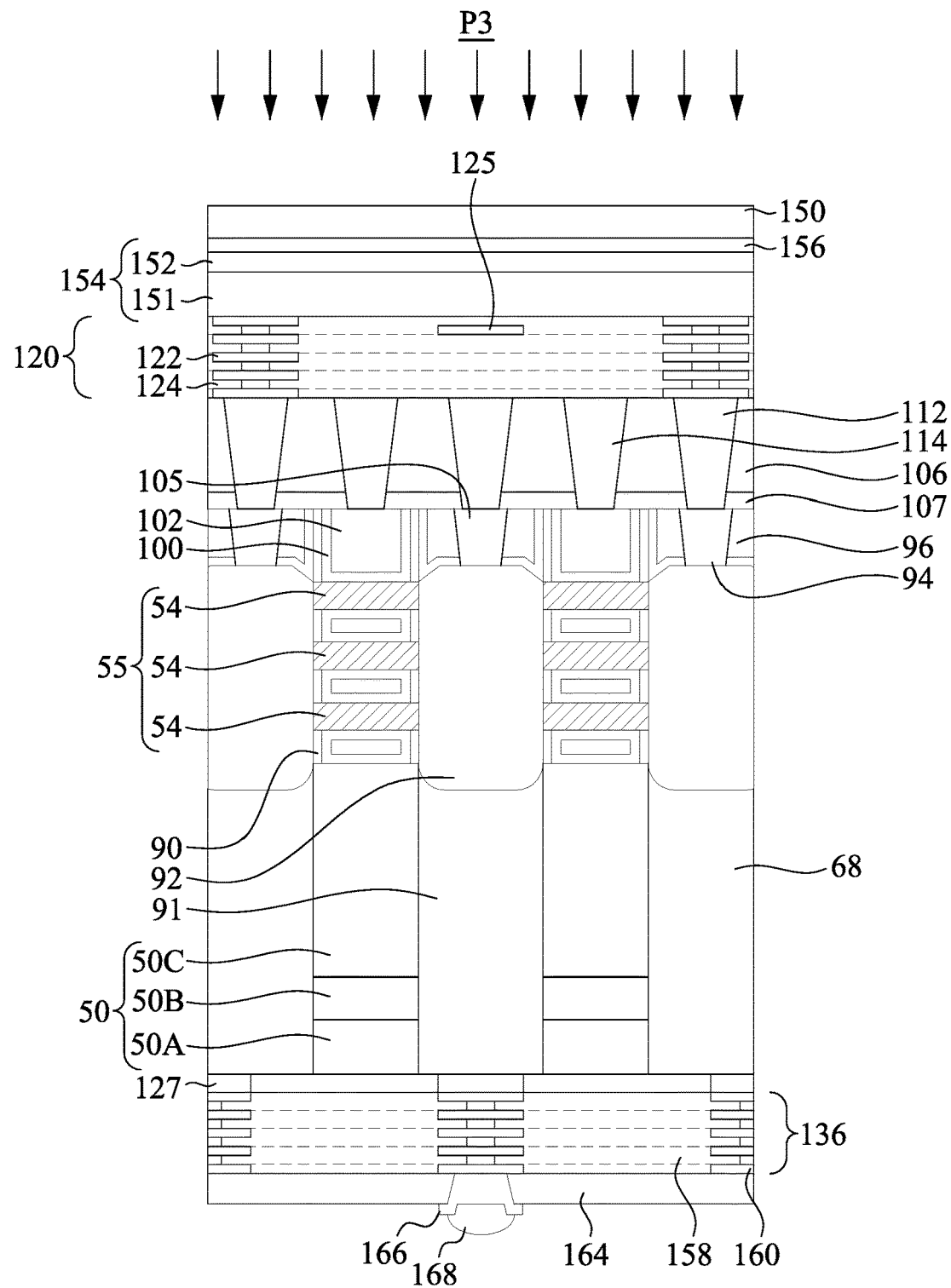

Reference is made to FIGS. 31A to 31C. After the external connectors 168 are formed, the structure may be flipped over again such that a surface of the carrier substrate 150 faces upwards. Then, a chemical mechanical polishing (CMP) process P3 is performed to the carrier substrate 150 to reduce a thickness of the carrier substrate 150. In some embodiments, after the CMP process P3, the thickness of the carrier substrate 150 may be in a range from about 180 mm to about 220 mm, such as 200 mm in some embodiments.

FIGS. 32A to 34C are cross-sectional views of intermediate stages in the manufacturing of an integrated circuit structure, in accordance with some embodiments. It is noted that some elements of FIGS. 32A to 34C are similar to the elements discussed in FIGS. 2 to 31C, such elements are labeled the same, and relevant details will not be repeated for simplicity.

Figure 32A:
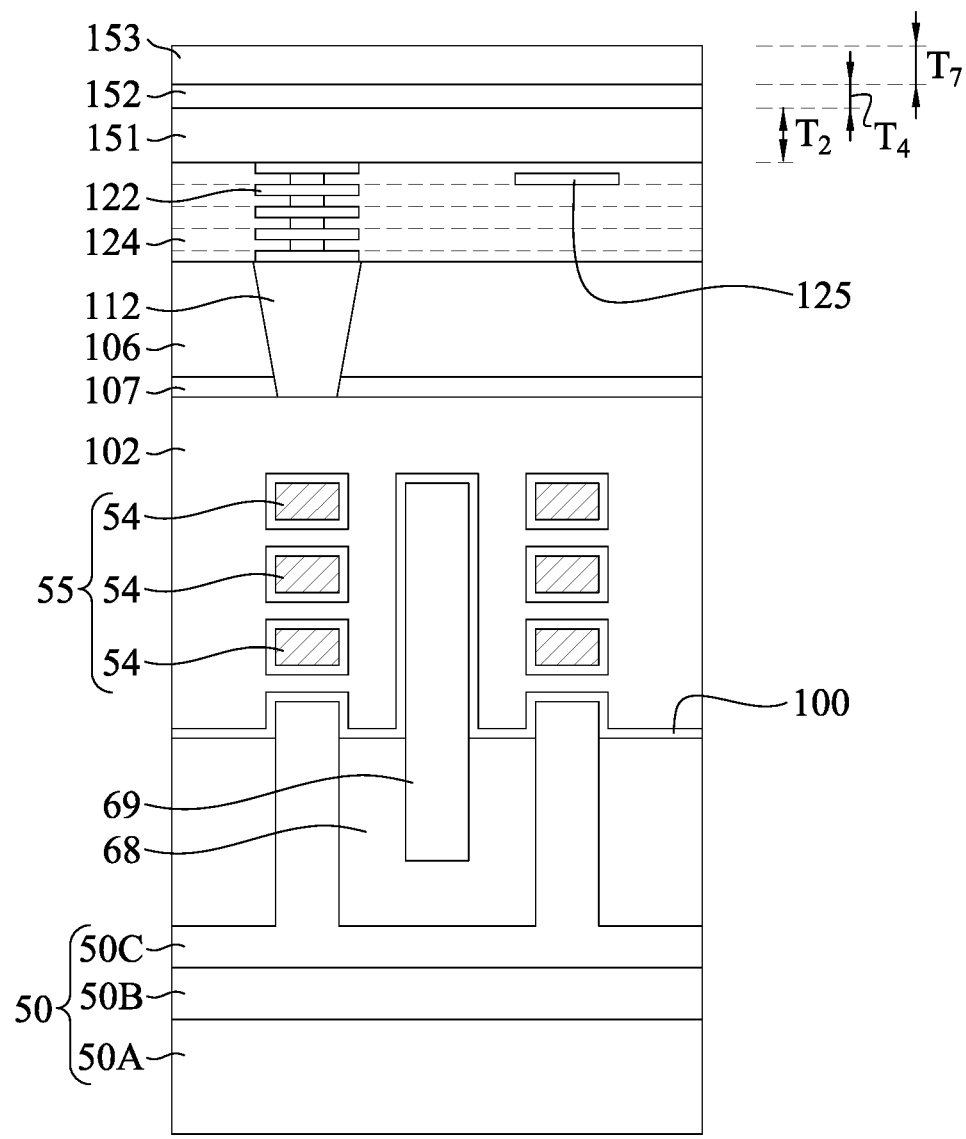
FIGS. 32A to 34C are cross-sectional views of intermediate stages in the manufacturing of an integrated circuit structure, in accordance with some embodiments.
Figure 32B:
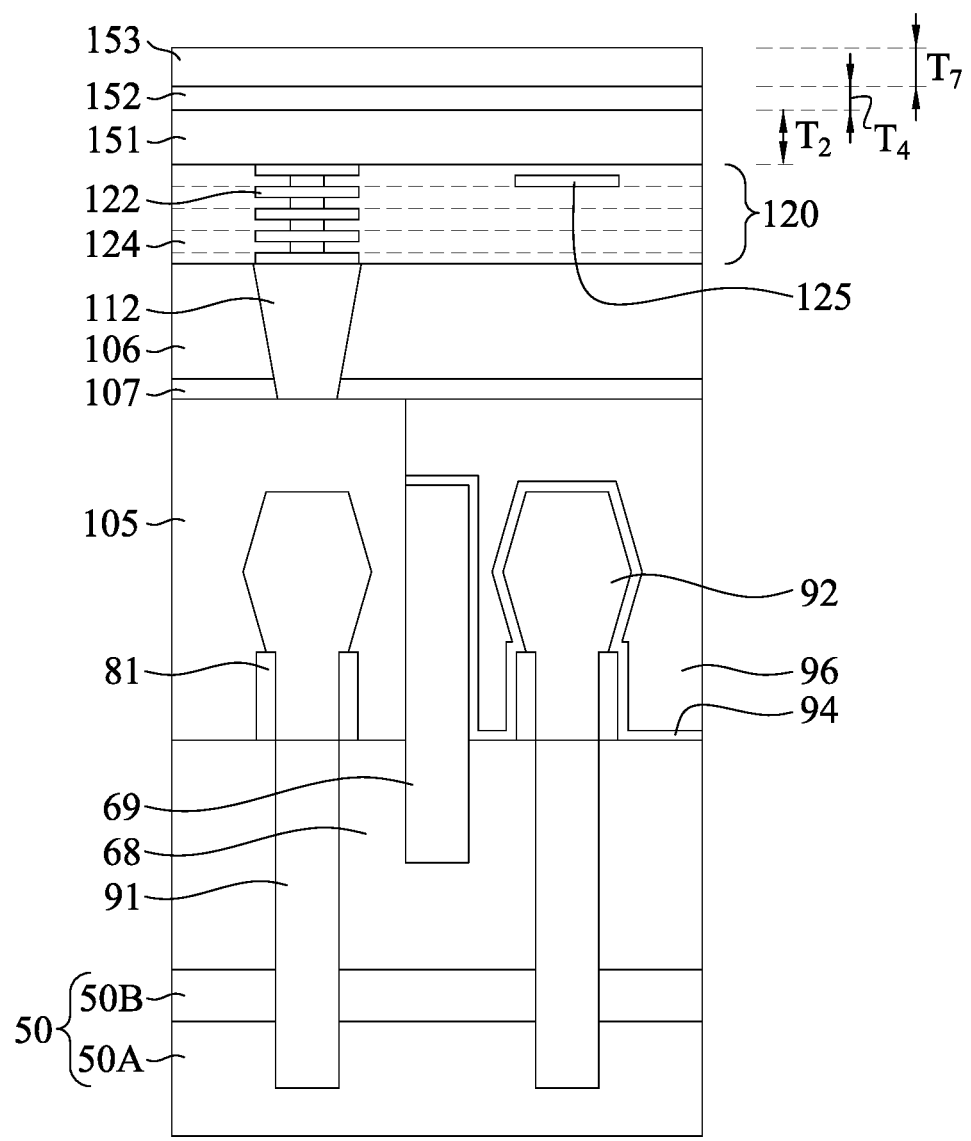
Figure 32C:
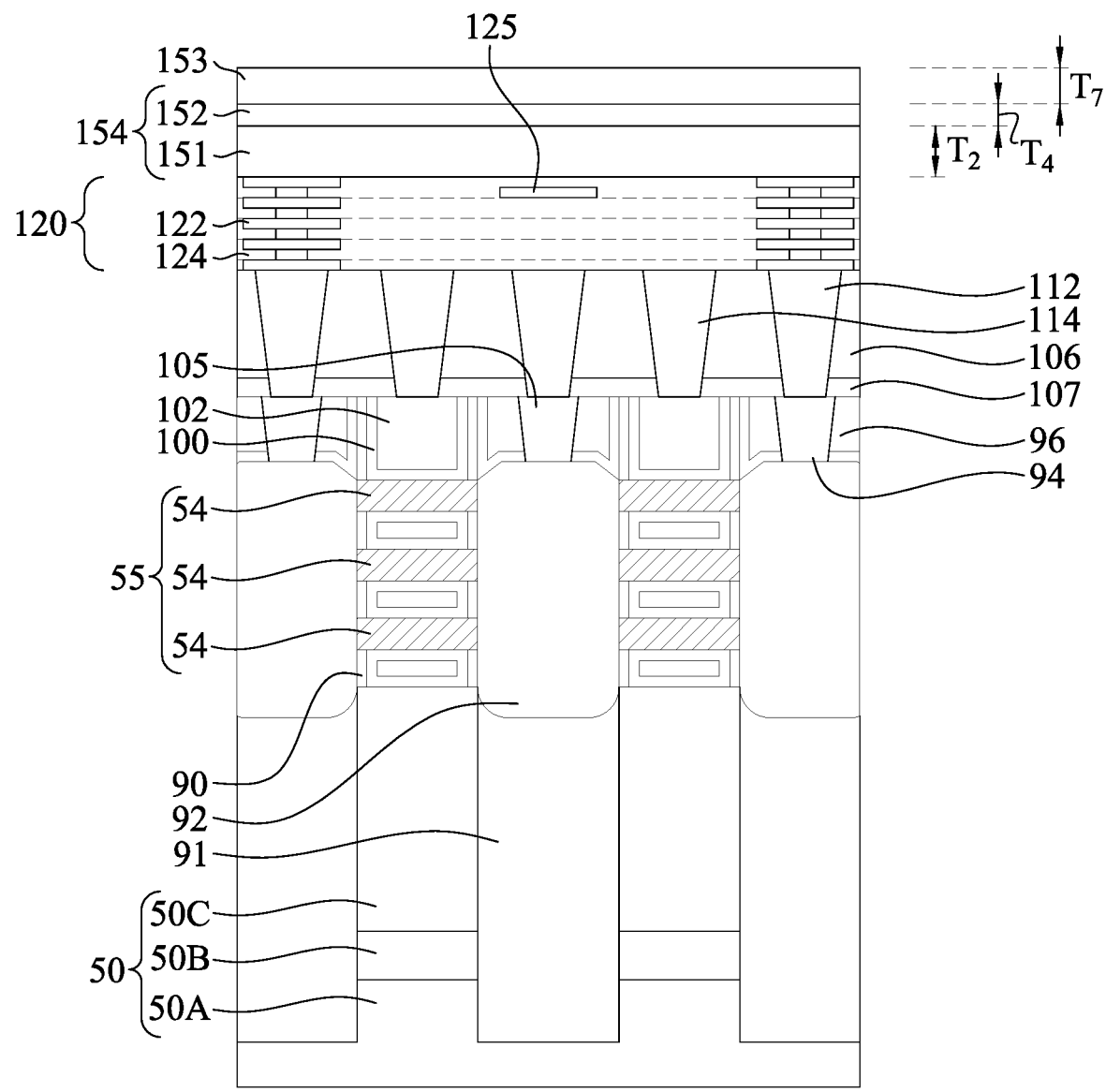

Reference is made to FIGS. 32A to 32C after the second dielectric layer 152 is planarized, a third dielectric layer 153 is formed over the second dielectric layer 152. In some embodiments, the third dielectric layer 153 may include the same material as the first and second dielectric layers 151 and 152. In some embodiments, the third dielectric layer 153 may be formed of USG, silicon oxide (SiO$_x$), silicon dioxide (SiO$_2$), or other suitable materials. The third dielectric layer 153 may also be referred to as an oxide layer. In some embodiments, the third dielectric layer 153 may be formed by a high density plasma (HDP) deposition process, such as plasma enhanced chemical vapor deposition (PECVD). Accordingly, the third dielectric layer 153 may also be referred to as a HDP dielectric layer or a HDP oxide layer. In some embodiments, the first, second, and third oxide layers 151, 152, and 153 are made of a same oxide material using the same deposition process (e.g., HDP deposition). In some embodiments, the third oxide layer 153 has a thickness T7, in which the thickness T7 is in a range from about 1300 Å to about 1500 Å, such as 1400 Å for example. In some embodiments, the thickness T7 of the third dielectric layer 153 may be lower than the thickness T2 of the first dielectric layer 151. In some embodiments, the thickness T7 of the third dielectric layer 153 may be lower than the original thickness T1 of the first dielectric layer 151 prior to performing the first CMP process P1. The thickness T2 (or thickness T1) of the first dielectric layer 151 would be greater than the thickness T7 of the third dielectric layer 153, this is because the first dielectric layer 151 can provide sufficient buffer thickness under the first CMP process P1, such that the first dielectric layer 151 is flat enough and thick enough to act as a base layer of the bonding layer formed in later steps (e.g., the bonding layer 155 in FIGS. 33A to 33C). In some embodiments, the thickness T7 of the third dielectric layer 153 may be the same or slightly lower than the original thickness T3 of the second dielectric layer 152.

Figure 33A:
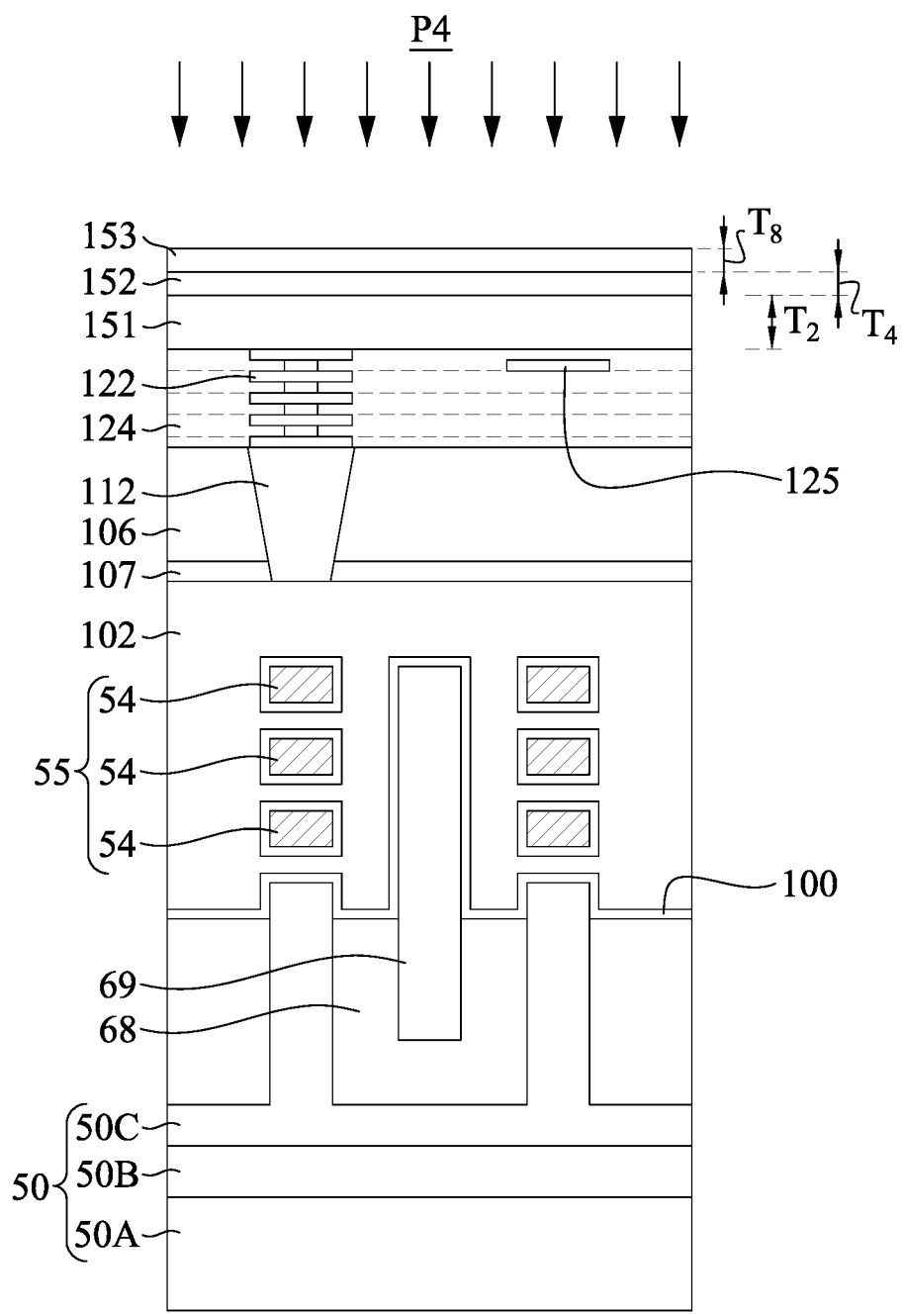
Figure 33B:
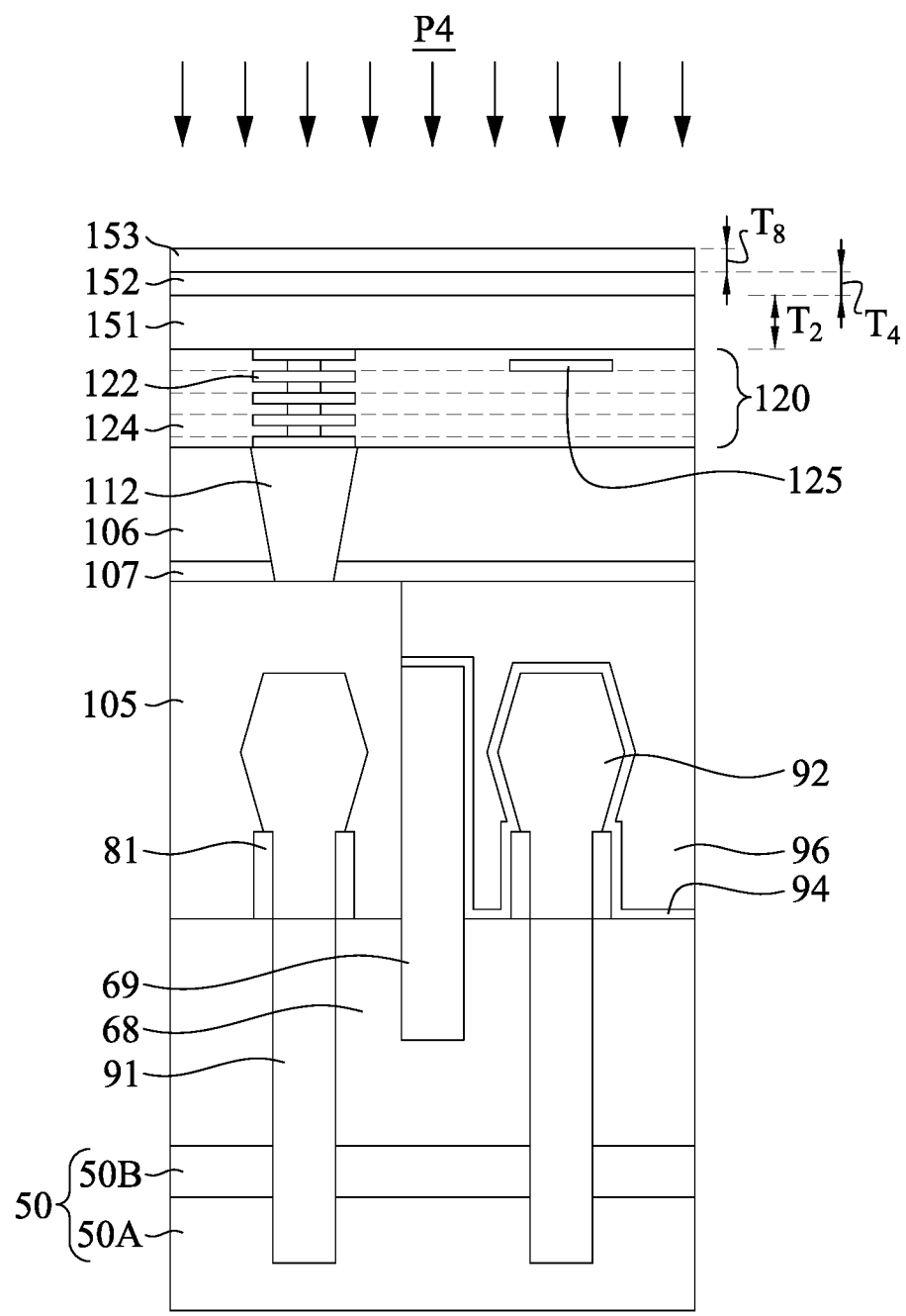
Figure 33C:
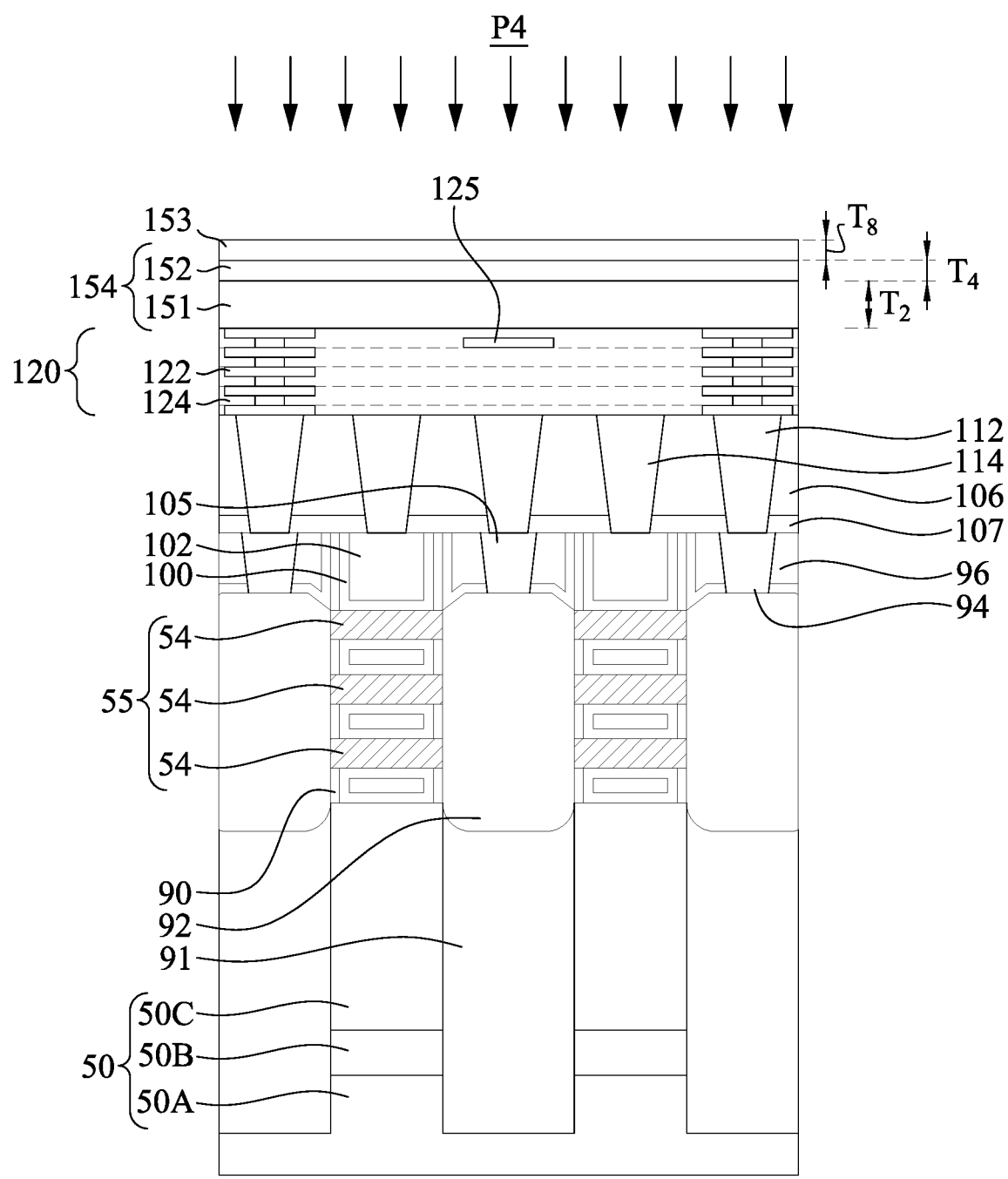

Reference is made to FIGS. 33A to 33C. A third chemical mechanical polishing (CMP) process P4 is performed to the third dielectric layer 153 to planarize the top surface of the third dielectric layer 153. In some embodiments, the third CMP process P4 also reduces the thickness of the third dielectric layer 153. Accordingly, after the third CMP process P4, the thickness T7 of the third dielectric layer 153 (see FIGS. 31A to 31C) is reduced to a thickness T8 lower than the thickness T7. In some embodiments, the thickness T8 is in a range from about 900 Å to about 1100 Å, such as 1000 Å for example. In some embodiments, the thickness T8 of the third dielectric layer 153 may be substantially the same as or slightly lower than the thickness T4 of the second dielectric layer 152.

After the third CMP process P4, the first dielectric layer 151, the second dielectric layer 152, and the third dielectric layer 153 can be collectively referred to as a composite dielectric layer 155, which is a tri-layer film stack of three HDP oxide layers. In some embodiments, within the tri-layer film stack, an observable interface may exist between the HDP oxide layers, even if they are made of a same oxide material. In some embodiments, the composite dielectric layer 155 may also be referred to as a bonding layer 155 that serves to bond the device wafer 50 to a carrier wafer in subsequent processing.

Figure 34A:
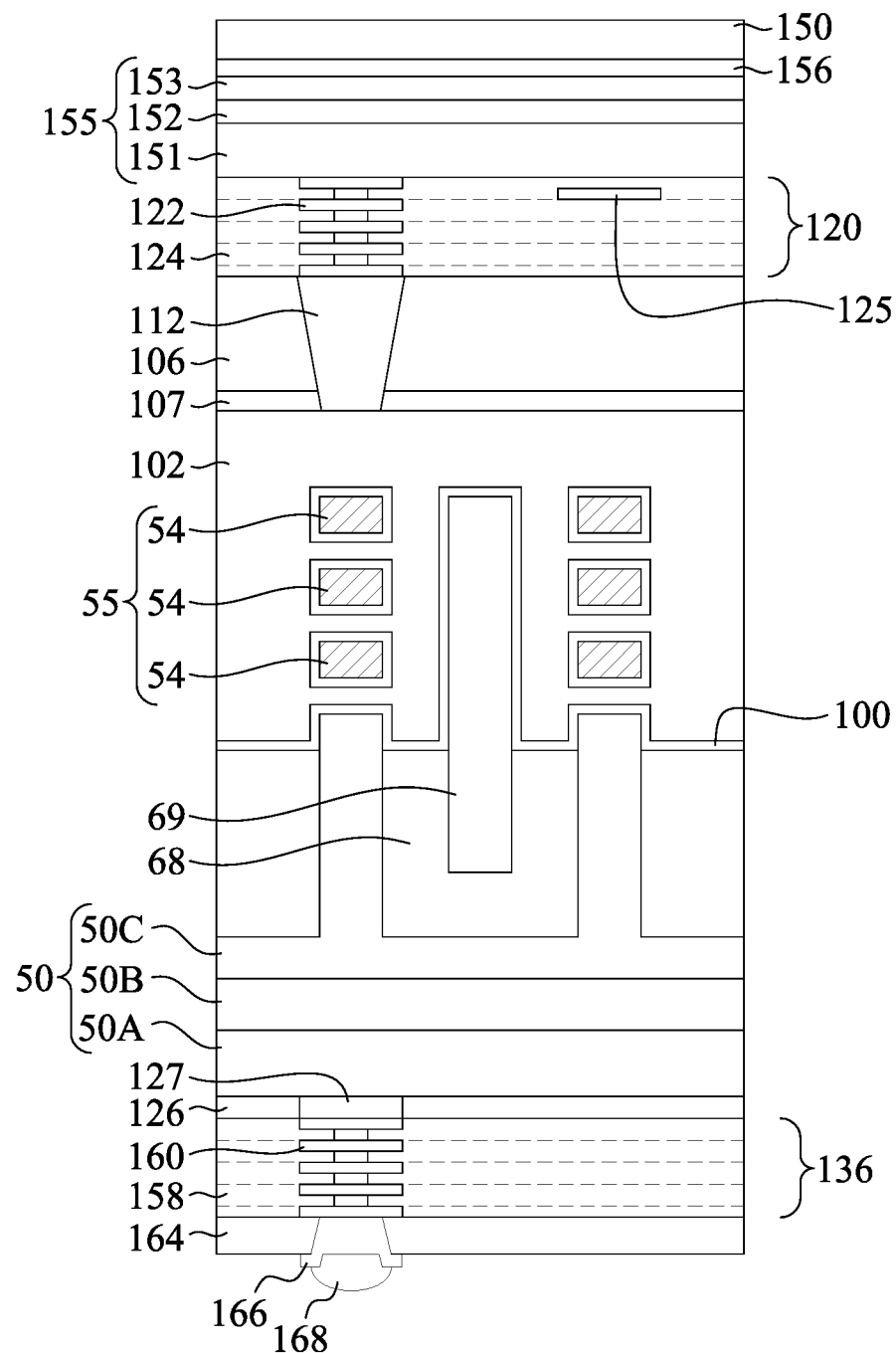
Figure 34B:
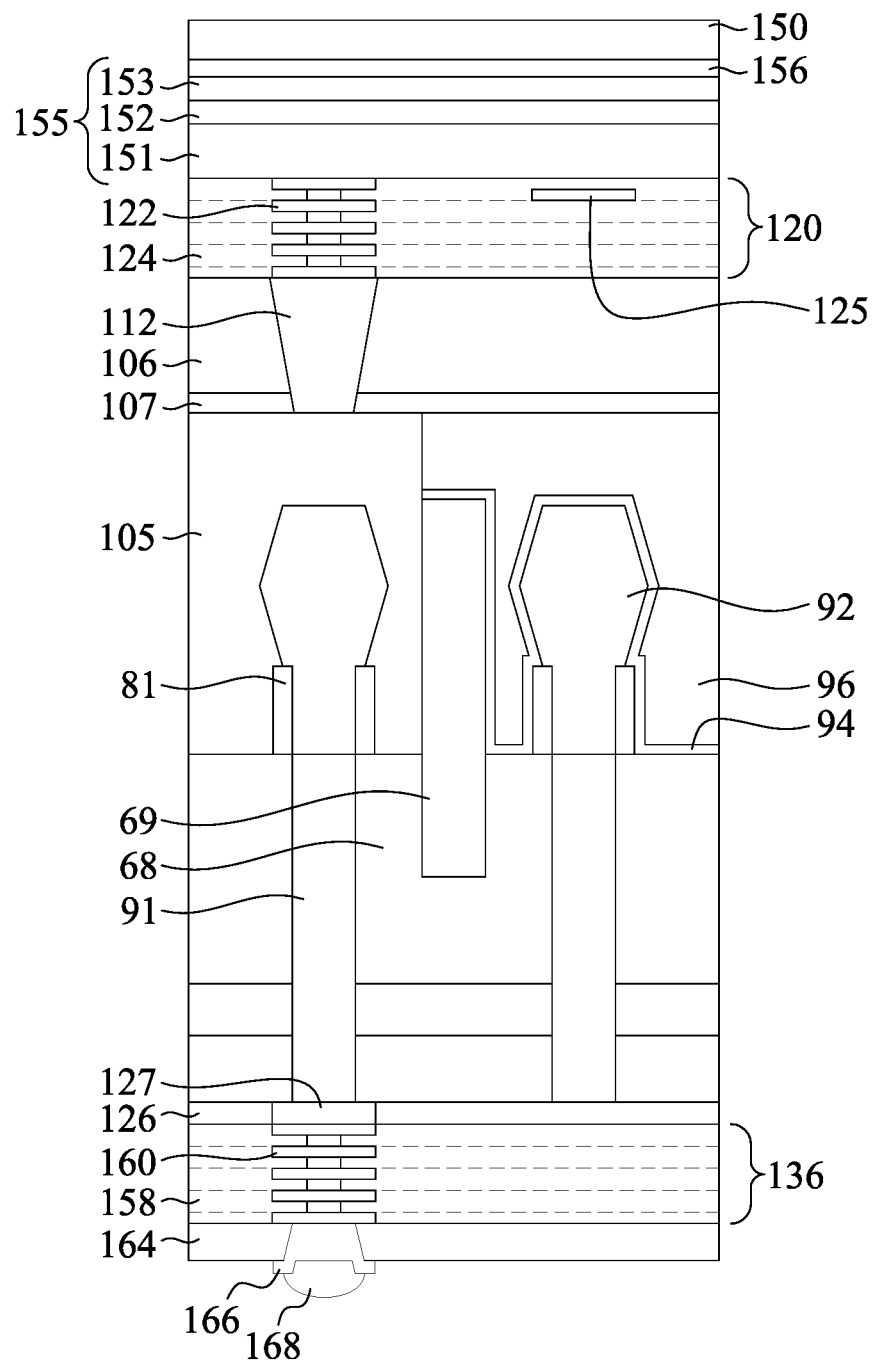
Figure 34C:
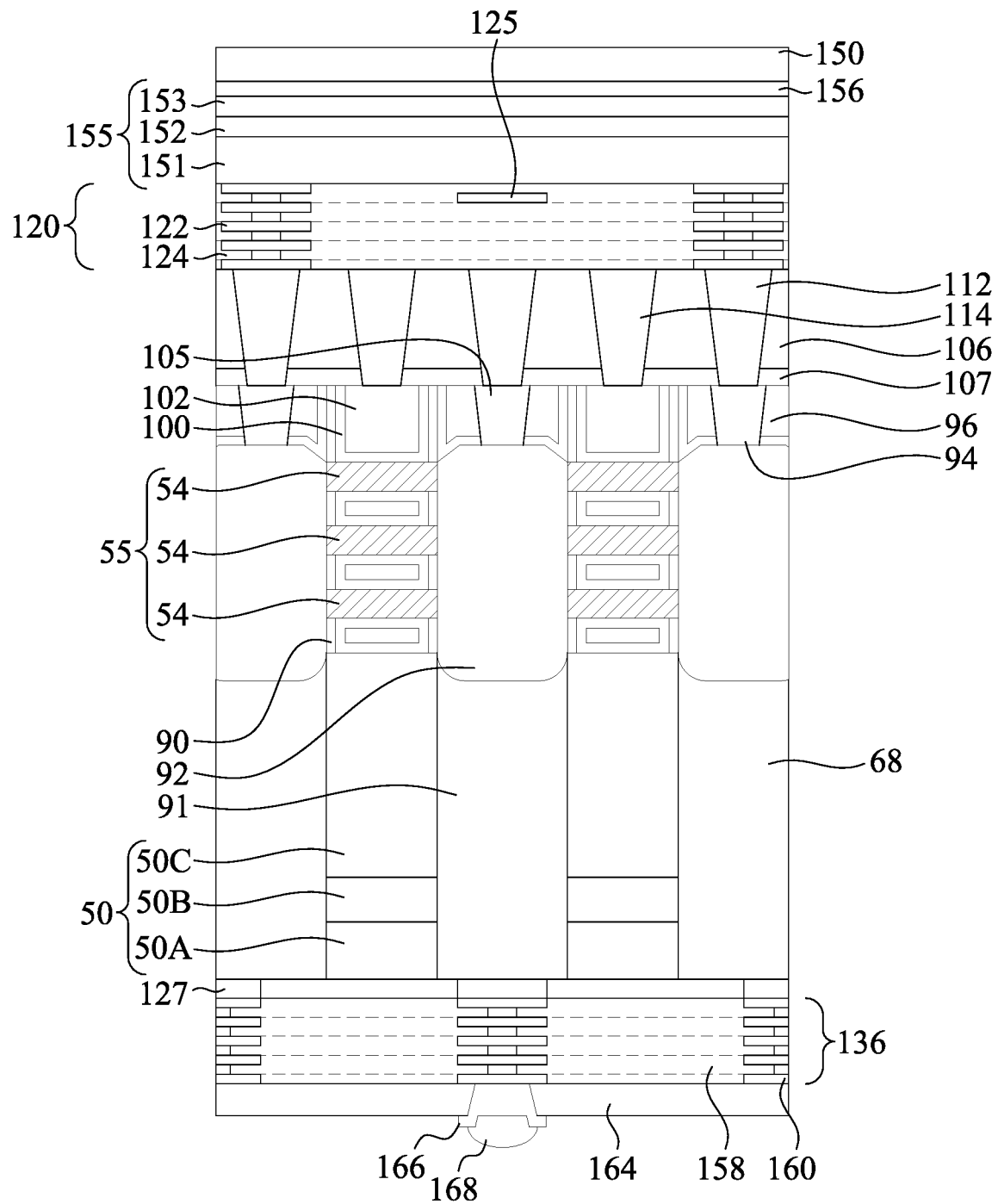

Reference is made to FIGS. 34A to 34C. The structure of FIGS. 33A to 33C may undergo the processes discussed in FIGS. 25A to 31C, and the resulting structure is shown in FIGS. 34A to 34C. FIGS. 34A to 34C are similar to FIGS. 31A to 31C, while the difference between FIGS. 34A to 34C and FIGS. 31A to 31C is that the composite dielectric layer 155 of FIGS. 34A to 34C includes dielectric layers 151, 152, and 153. In some embodiments, depositing the third dielectric layer 153 (see FIGS. 32A to 32C) and performing a CMP process to the third dielectric layer 153 are performed to improve the flatness of the composite dielectric layer 155, which will facilitate the bonding process to the carrier substrate 150. It is understood that more DEF-CMP cycle can be performed to improve the flatness of the bonding layer. In some embodiments, the composite dielectric layer 155 and the dielectric layer 156 may be collectively referred to as a bonding layer between the carrier substrate 150 and the interconnect structure 120.

Based on the above discussion, it can be seen that the present disclosure offers advantages. It is understood, however, that other embodiments may offer additional advantages, and not all advantages are necessarily disclosed herein, and that no particular advantages is required for all embodiments. One advantage is that by employing a flip bonding technique, a backside interconnect structure is able to be formed on a backside of a substrate, such that more electrical lines may be formed in a device, which in turn will improve the device performance. Another advantage is that a bonding layer may be formed by depositing a first dielectric layer, performing a first planarization process to the first dielectric layer, depositing a second dielectric layer, and performing a second planarization process to the second dielectric layer, such that the flatness of the bonding layer can be improved, and will further improve the bonding process.

In some embodiments of the present disclosure, a method includes forming a transistor over a front side of a substrate; forming a front-side interconnect structure over the transistor, the front-side interconnect structure comprising layers of conductive lines, and conductive vias interconnecting the layers of conductive lines; forming a first bonding layer over the front-side interconnect structure; forming a second bonding layer over a carrier substrate; bonding the front-side interconnect structure to the carrier substrate by pressing the first bonding layer against the second bonding layer; and forming a backside interconnect structure over a backside of the substrate after bonding the front-side interconnect structure to the carrier substrate. In some embodiments, wherein forming the first bonding layer comprises forming a first dielectric layer over the front-side interconnect structure; performing a first planarization process to the first dielectric layer; and after performing the first planarization process, forming a second dielectric layer over the first dielectric layer. In some embodiments, the method further comprises performing a second planarization process to the second dielectric layer prior to bonding the front-side interconnect structure to the carrier substrate. In some embodiments, wherein the first dielectric layer after performing the first planarization process is thicker than the second dielectric layer. In some embodiments, wherein bonding the front-side interconnect structure to the carrier substrate comprises performing an annealing process. In some embodiments, the method further comprises removing the carrier substrate after forming the backside interconnect structure. In some embodiments, the method further comprises performing a planarization process to the backside of the substrate prior to forming the backside interconnect structure. In some embodiments, wherein the first bonding layer and the second bonding layer are made of a same material.

In some embodiments of the present disclosure, a method includes forming a fin over a front side of a substrate; forming a gate structure and source/drain structures over the fin; forming a front-side interconnect structure over the gate structure; forming a first dielectric layer over the front-side interconnect structure; performing a first planarization process to the first dielectric layer; forming a second dielectric layer over the planarized first dielectric layer; performing a second planarization process to the second dielectric layer; bonding the front-side interconnect structure to a carrier substrate by using the planarized second dielectric layer; and forming a backside interconnect structure over a backside of the substrate after bonding the front-side interconnect structure to the carrier substrate. In some embodiments, the method further comprises forming a third dielectric layer over the carrier substrate prior to bonding the front-side interconnect structure to the carrier substrate, wherein bonding the front-side interconnect structure to the carrier substrate is performed by pressing the planarized second dielectric layer against the third dielectric layer. In some embodiments, the method further comprises performing an annealing process after pressing the planarized second dielectric layer against the third dielectric layer. In some embodiments, the third dielectric layer is thinner than the planarized first dielectric layer. In some embodiments, the third dielectric layer is thinner than the planarized second dielectric layer. In some embodiments, the planarized second dielectric layer has a thickness lower than a thickness of the planarized first dielectric layer. In some embodiments, the first dielectric layer and the second dielectric layer are made of silicon oxide.

In some embodiments of the present disclosure, a method includes forming a gate structure over a semiconductor-on-insulator (SOI) substrate, the SOI substrate having a bulk silicon layer, a buried oxide layer over the bulk silicon layer, and a semiconductor layer over the buried oxide layer; etching recesses extending through the oxide layer and the semiconductor layer into the bulk silicon layer; forming epitaxial plugs in the recesses; forming epitaxial source/drain structures over the epitaxial plugs, respectively; forming a front-side interconnect structure over the gate structure and the epitaxial source/drain structures; forming a first bonding layer over the front-side interconnect structure; bonding the front-side interconnect structure to a carrier substrate by using the first bonding layer and a second bonding layer over the carrier substrate; performing a first chemical mechanical polishing (CMP) process to a backside of the bulk silicon layer until the epitaxial plugs are exposed; and forming a backside interconnect structure over the backside of the bulk silicon layer and electrically connected to the epitaxial plugs. In some embodiments, forming the first bonding layer comprises forming a first dielectric layer over the front-side interconnect structure; performing a second CMP process to the first dielectric layer; forming a second dielectric layer over the first dielectric layer; and performing a second CMP process to the second dielectric layer. In some embodiments, the first CMP process is performed such that exposed surfaces of the epitaxial plugs are level with the backside surface of the bulk silicon layer. In some embodiments, the backside interconnect structure is formed after performing the CMP process. In some embodiments, the second bonding layer is thinner than the first bonding layer.

In some embodiments of the present disclosure, an integrated circuit (IC) structure includes a gate structure; source/drain epitaxial structures respectively on opposite sides of the gate structure; a front-side interconnect structure on front-sides of the source/drain epitaxial structures; a backside interconnect structure on backsides of the source/drain epitaxial structures; a supporting substrate separated from the source/drain epitaxial structures at least by the front-side interconnect structure; and a bonding layer bonding the front-side interconnect structure with the supporting substrate, wherein the bonding layer comprises a first dielectric layer in contact with the front-side interconnect structure; a second dielectric layer spaced apart from the front-side interconnect structure by the first dielectric layer, the second dielectric layer being thinner than the first dielectric layer; and a third dielectric layer between the second dielectric layer and the supporting substrate. In some embodiments, wherein the first, second, and third dielectric layer are made of a same material. In some embodiments, wherein the second dielectric layer is thicker than the third dielectric layer. In some embodiments, the IC structure further includes a fourth dielectric layer between the second dielectric layer and the third dielectric layer, wherein the first dielectric layer is thicker than the fourth dielectric layer. In some embodiments, wherein the first, second, third, and fourth dielectric layers are made of a same material.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method, comprising:
forming a transistor over a front side of a substrate;
forming a front-side interconnect structure over the transistor, the front-side interconnect structure comprising layers of conductive lines, and conductive vias interconnecting the layers of conductive lines;
forming a first bonding layer over the front-side interconnect structure, wherein forming the first bonding layer comprises:
forming a first dielectric layer over the front-side interconnect structure;
performing a first planarization process to the first dielectric layer; and
after performing the first planarization process, forming a second dielectric layer over the first dielectric layer;
forming a second bonding layer over a carrier substrate;
bonding the front-side interconnect structure to the carrier substrate by pressing the first bonding layer against the second bonding layer; and
forming a backside interconnect structure over a backside of the substrate after bonding the front-side interconnect structure to the carrier substrate.

2. The method of claim 1, further comprising performing a second planarization process to the second dielectric layer prior to bonding the front-side interconnect structure to the carrier substrate.

3. The method of claim 1, wherein the first dielectric layer after performing the first planarization process is thicker than the second dielectric layer.

4. The method of claim 1, wherein bonding the front-side interconnect structure to the carrier substrate comprises performing an annealing process.

5. The method of claim 1, further comprising removing the carrier substrate after forming the backside interconnect structure.

6. The method of claim 1, further comprising performing a planarization process to the backside of the substrate prior to forming the backside interconnect structure.

7. The method of claim 1, wherein the first bonding layer and the second bonding layer are made of a same material.

8. The method of claim 1, further comprising forming a third dielectric layer over the second dielectric layer.

9. A method, comprising:
forming a fin over a front side of a substrate;
forming a gate structure and source/drain structures over the fin;
forming a front-side interconnect structure over the gate structure;
forming a first dielectric layer over the front-side interconnect structure;
performing a first planarization process to the first dielectric layer;
forming a second dielectric layer over the planarized first dielectric layer;
performing a second planarization process to the second dielectric layer;
bonding the front-side interconnect structure to a carrier substrate by using the planarized second dielectric layer; and
forming a backside interconnect structure over a backside of the substrate after bonding the front-side interconnect structure to the carrier substrate.

10. The method of claim 9, further comprising forming a third dielectric layer over the carrier substrate prior to bonding the front-side interconnect structure to the carrier substrate, wherein bonding the front-side interconnect structure to the carrier substrate is performed by pressing the planarized second dielectric layer against the third dielectric layer.

11. The method of claim 10, further comprising performing an annealing process after pressing the planarized second dielectric layer against the third dielectric layer.

12. The method of claim 10, wherein the third dielectric layer is thinner than the planarized first dielectric layer.

13. The method of claim 10, wherein the third dielectric layer is thinner than the planarized second dielectric layer.

14. The method of claim 9, wherein the planarized second dielectric layer has a thickness lower than a thickness of the planarized first dielectric layer.

15. The method of claim 9, wherein the first dielectric layer and the second dielectric layer are made of silicon oxide.

16. A method, comprising:
forming a transistor comprising a gate structure and a source/drain epitaxial structures respectively on opposite sides of the gate structure;
forming a front-side interconnect structure on front-sides of the source/drain epitaxial structures;
forming a backside interconnect structure on backsides of the source/drain epitaxial structures;
forming a supporting substrate separated from the source/drain epitaxial structures at least by the front-side interconnect structure; and
forming a bonding layer bonding the front-side interconnect structure with the supporting substrate, wherein the bonding layer comprises:
a first dielectric layer in contact with the front-side interconnect structure;
a second dielectric layer spaced apart from the front-side interconnect structure by the first dielectric layer, the second dielectric layer being thinner than the first dielectric layer; and
a third dielectric layer between the second dielectric layer and the supporting substrate.

17. The method of claim 16, wherein the first, second, and third dielectric layer are made of a same material.

18. The method of claim 16, wherein the second dielectric layer is thicker than the third dielectric layer.

19. The method of claim 16, wherein the bonding layer further comprises a fourth dielectric layer between the second dielectric layer and the third dielectric layer, wherein the first dielectric layer is thicker than the fourth dielectric layer.

20. The method of claim 19, wherein the first, second, third, and fourth dielectric layers are made of a same material.

* * * * *